(12) United States Patent
Liu et al.

(10) Patent No.: US 11,949,262 B2
(45) Date of Patent: *Apr. 2, 2024

(54) EMERGENCY START-UP POWER SUPPLY WITH DIAGNOSTIC FUNCTION

(71) Applicant: GREPOW INC, Livermore, CA (US)

(72) Inventors: Bing Liu, Shenzhen (CN); Shiyu Liu, Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/201,762

(22) Filed: May 25, 2023

(65) Prior Publication Data

US 2023/0318321 A1 Oct. 5, 2023

Related U.S. Application Data

(63) Continuation-in-part of application No. 18/092,249, filed on Dec. 31, 2022, which is a continuation of application No. 17/515,477, filed on Oct. 31, 2021, now Pat. No. 11,545,842.

(60) Provisional application No. 63/223,830, filed on Jul. 20, 2021.

(51) Int. Cl.
| | |
|---|---|
| *H01M 10/46* | (2006.01) |
| *G01R 31/00* | (2006.01) |
| *G01R 31/3835* | (2019.01) |
| *G01R 31/392* | (2019.01) |
| *H02J 1/10* | (2006.01) |
| *H02J 7/00* | (2006.01) |
| *H02J 7/34* | (2006.01) |

(52) U.S. Cl.
CPC .......... *H02J 7/0029* (2013.01); *G01R 31/006* (2013.01); *G01R 31/3835* (2019.01); *G01R 31/392* (2019.01); *H02J 1/122* (2020.01); *H02J 7/0047* (2013.01); *H02J 7/0063* (2013.01); *H02J 7/342* (2020.01)

(58) Field of Classification Search
CPC ........ H02J 7/0029; H02J 7/342; H02J 7/0047; H02J 7/0063; H02J 1/122; G01R 31/006; G01R 31/392; G01R 31/3835
USPC ....... 320/103, 105, 107, 114, 115, 132, 148, 320/162
See application file for complete search history.

(56) References Cited

U.S. PATENT DOCUMENTS 10,473,555 B2 * 11/2019 Bertness ............. G01M 17/007

* cited by examiner

*Primary Examiner* — Edward Tso

(57) ABSTRACT

A jump starter device with a diagnostic function can include a jump starter section for jump start a vehicle, and a diagnostic section for diagnose a condition of the vehicle. The diagnostic section can include an analysis of the measured battery voltage. The diagnostic section can include a circuit to determine an internal resistance of the battery. The diagnostic section can include a circuit to determine a current of the vehicle.

18 Claims, 45 Drawing Sheets

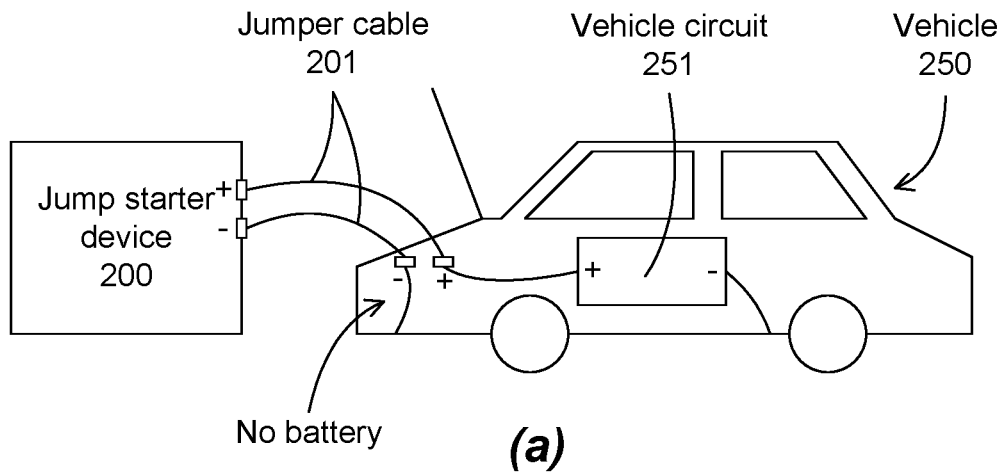
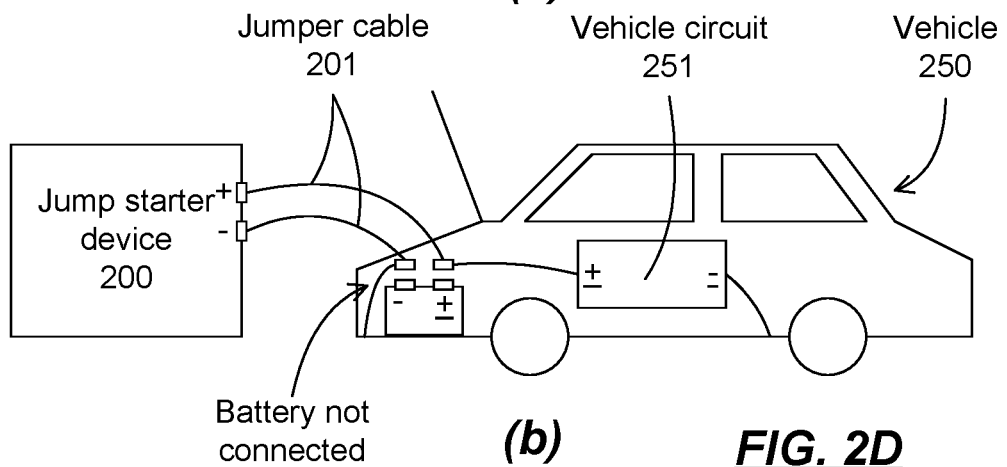
*FIG. 2D*
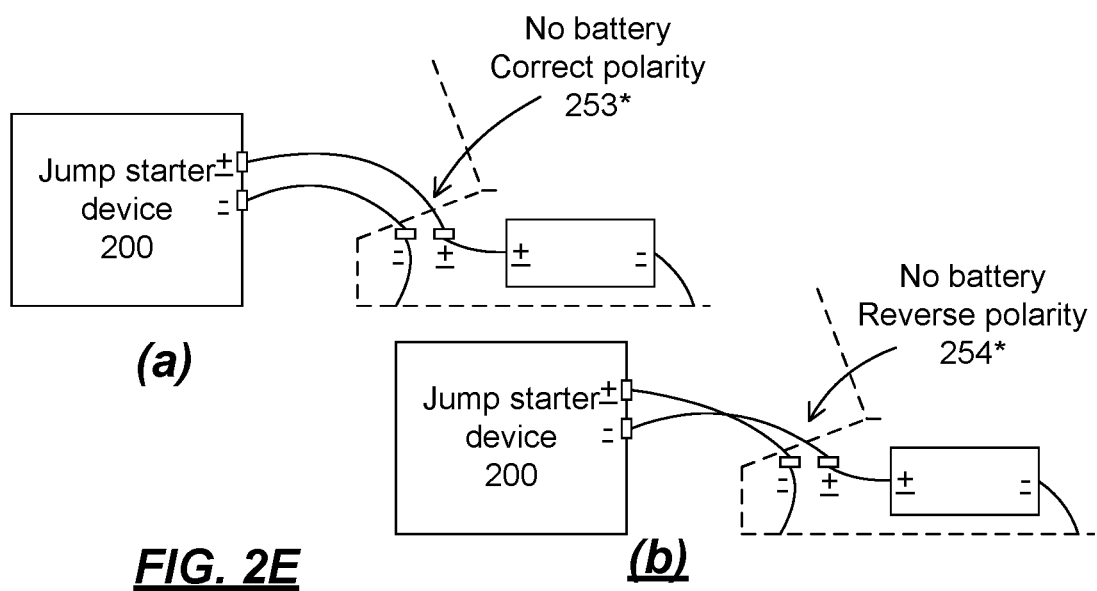
*FIG. 2E*

Forming a jumper system, wherein the jumper system comprises a battery connected to a switch before connected to a jumper cable, wherein the jumper system comprises a controller configured to turn on or off the switch based on input signals from a sensor assembly configured to monitor conditions of a vehicle connected to the jumper cable
300

*FIG. 3A*

Forming a jumper system, wherein the jumper system comprises a battery coupled to a switch controlled by a controller based on inputs from a sensor assembly configured to monitor conditions of a vehicle connected to the jumper system, wherein the conditions comprise a voltage of the vehicle with or without a vehicle battery, a resistive load of the vehicle without the vehicle battery, or a contact resistance between the jumper system and the vehicle
320

*FIG. 3B*

Forming a jumper system, wherein the jumper system comprises a battery coupled to a switch controlled by a controller based on inputs from a sensor assembly configured to monitor conditions of a vehicle connected to the jumper system, wherein the conditions comprise whether the jumper system coupled to the vehicle with correct or with reverse polarity and with the vehicle having a battery or not having a battery, whether the jumper system is properly connected to the vehicle, or whether the battery is shorted
340

*FIG. 3C*

```
┌─────────────────────────────────────────────────────────┐
│ Connecting a jumper cable of a jumper system to a       │
│ vehicle, wherein the jumper system comprises a sensor   │
│ assembly configured to monitor a condition of the       │
│ connection or a condition of the vehicle, wherein the   │
│ sensor assembly is configured to provide inputs to a    │
│ controller configured to control whether a battery of   │
│ the jumper system is connected to the vehicle           │
│                          400                            │
└─────────────────────────────────────────────────────────┘
                              │
                              ▼
┌─────────────────────────────────────────────────────────┐
│ Assessing, by the sensor assembly, whether a battery    │
│ of the vehicle is over voltage                          │
│                          410                            │
└─────────────────────────────────────────────────────────┘
                              │
                              ▼
┌─────────────────────────────────────────────────────────┐
│ Assessing, by the sensor assembly, whether the vehicle  │
│ battery is having similar voltage with correct polarity │
│                          420                            │
└─────────────────────────────────────────────────────────┘
                              │
                              ▼
┌─────────────────────────────────────────────────────────┐
│ Assessing, by the sensor assembly, whether the vehicle  │
│ battery is connected with correct polarity              │
│                          430                            │
└─────────────────────────────────────────────────────────┘
                              │
                              ▼
┌─────────────────────────────────────────────────────────┐
│ Assessing, by the sensor assembly, whether the vehicle  │
│ battery is shorted                                      │
│                          440                            │
└─────────────────────────────────────────────────────────┘
                              │
                              ▼
┌─────────────────────────────────────────────────────────┐
│ Assessing, by the sensor assembly, whether the vehicle  │
│ battery is connected with reverse polarity              │
│                          450                            │
└─────────────────────────────────────────────────────────┘
                              │
                              ▼
┌─────────────────────────────────────────────────────────┐
│ Assessing, by the sensor assembly, whether the jumper   │
│ cable is connected to the vehicle without connected to  │
│ the vehicle battery, and whether the connection is open │
│                          460                            │
└─────────────────────────────────────────────────────────┘
                              │
                              ▼
┌─────────────────────────────────────────────────────────┐
│ Assessing, by the sensor assembly, whether the jumper   │
│ cable is connected to the vehicle without connected to  │
│ the vehicle battery, and whether the connection is with │
│ correct polarity                                        │
│                          470                            │
└─────────────────────────────────────────────────────────┘
                              │
                              ▼
┌─────────────────────────────────────────────────────────┐
│ Assessing, by the sensor assembly, whether the jumper   │
│ cable is connected to the vehicle without connected to  │
│ the vehicle battery, and whether the connection is with │
│ reverse polarity                                        │
│                          480                            │
└─────────────────────────────────────────────────────────┘
```

*FIG. 4*

Forming a jumper system, wherein the jumper system comprises a battery coupled to a switch controlled by a controller based on inputs from a sensor assembly configured to monitor conditions of a vehicle connected to the jumper system, wherein the sensor assembly comprises a passive voltage detector coupled to a battery of the vehicle, wherein the sensor assembly comprises an active voltage detector coupled between the jumper battery and the vehicle battery, and a switch to alternate between the passive and active voltage detectors
600

FIG. 6A

Forming a jumper system, wherein the jumper system comprises a battery coupled to a switch controlled by a controller based on inputs from a sensor assembly configured to monitor conditions of a vehicle connected to the jumper system, wherein the sensor assembly comprises a voltage detector configured to measure voltages of a battery of the vehicle if the vehicle battery is connected with the jumper system, wherein the voltage detector is also configured to measure a load of the vehicle if the vehicle battery is not connected with the jumper system
600

FIG. 6B

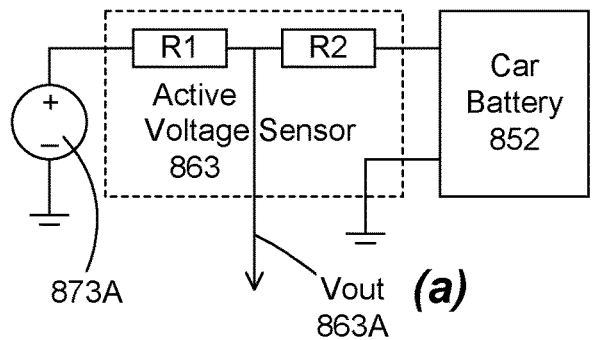
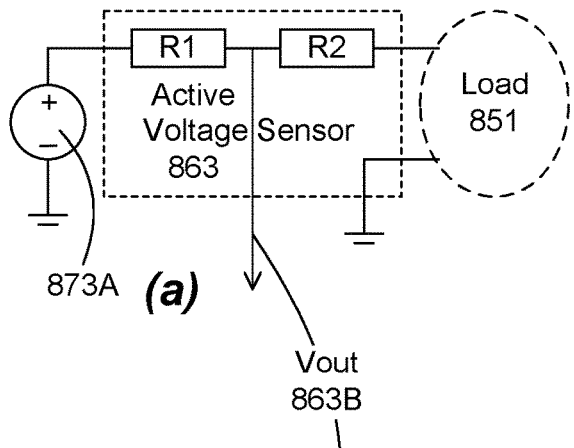
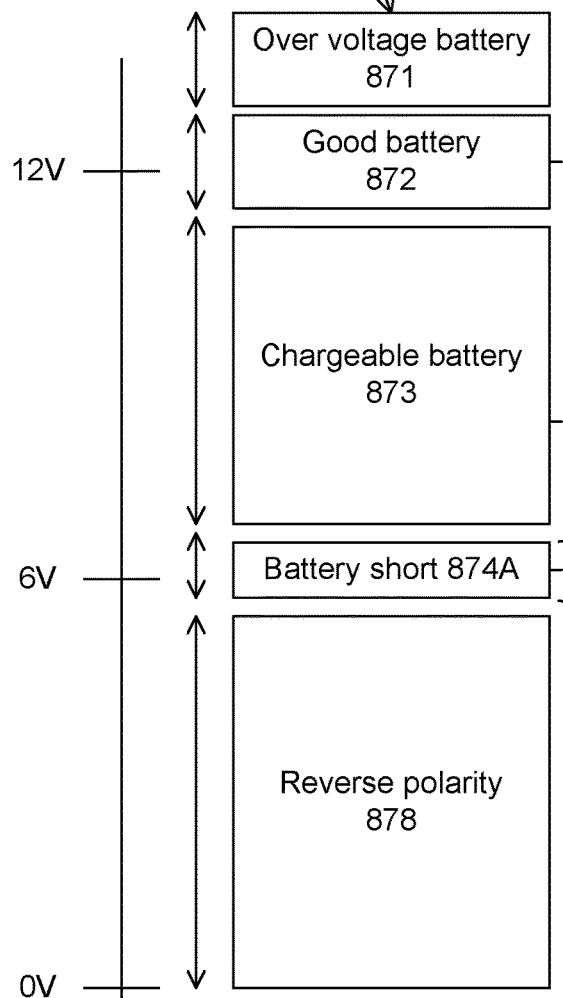
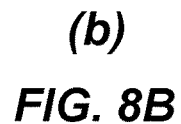
FIG. 8A  FIG. 8B

Forming a voltage detecting circuit, wherein the voltage detecting circuit is coupled to a vehicle, wherein the voltage detecting circuit is coupled to a battery of a jumper system, wherein the voltage detecting circuit is configured to provide a voltage related to the jumper battery voltage and the voltage across the vehicle
900

FIG. 9A

Forming a voltage detecting circuit, wherein the voltage detecting circuit is coupled to a vehicle, wherein the voltage detecting circuit is coupled to a battery of a jumper system, wherein the voltage detecting circuit is configured to provide distinct voltages for an open connection, for a no battery and correct polarity connection, for a no battery and reverse polarity connection of the vehicle
920

FIG. 9B

Forming a voltage detecting circuit, wherein the voltage detecting circuit is coupled to a vehicle, wherein the voltage detecting circuit is coupled to a battery of a jumper system, wherein the voltage detecting circuit is configured to provide distinct voltages for no battery and for a shorted battery in the vehicle
940

FIG. 9C

Forming a voltage detecting circuit, wherein the voltage detecting circuit is coupled to a vehicle, wherein the voltage detecting circuit is coupled to a battery of a jumper system, wherein the voltage detecting circuit is configured to provide positive voltages for correct polarity and reverse polarity connection to a battery in the vehicle
960

FIG. 9D

Forming a sensor assembly configured to measure voltages of a battery of a vehicle if the vehicle battery is connected with the jumper system, wherein the sensor assembly is also configured to measure a load of the vehicle if the vehicle battery is not connected with the jumper system
1100

FIG. 11A

Forming a sensor assembly comprising a switch connecting two circuits, wherein the switch is configured to be toggled between an OFF state and an ON state, wherein in the OFF state, the sensor assembly is configured to measure voltages of a battery of a vehicle, wherein in the OFF state, the sensor assembly is configured to measure a load of the vehicle
1120

FIG. 11B

Forming a sensor assembly comprising a switch coupled to a voltage divider circuit, wherein an end of the divider circuit is configured to be coupled to a battery of a vehicle, wherein an end of the switch is coupled to a battery of a jumper system, wherein the voltage divider circuit comprises an output signal, wherein the output signal is configured to provide a voltage of the vehicle battery when the switch is off and configured to provide a load of the vehicle when the switch is on,
wherein the switch is coupled to an oscillator circuit for automatically toggle between on and off, or
wherein the switch is coupled to a controller for the controller to turn the switch on or off
1140

FIG. 11C

Forming a jumper system, wherein the jumper system comprises a battery coupled to a switch controlled by a controller based on inputs from a sensor assembly configured to monitor conditions of a vehicle connected to the jumper system,
wherein the sensor assembly is configured to measure a first voltage of the vehicle without using the jumper battery and a second voltage of the vehicle using the jumper battery
1400

FIG. 14A

Forming a jumper system comprising a sensor assembly, wherein the sensor assembly is configured to measure a first voltage with the sensor assembly not coupled to the jumper battery and a second voltage with the sensor assembly coupled to the jumper battery
1420

FIG. 14B

Forming a jumper system comprising a sensor assembly, wherein voltage values of V1>15V or V2>15V indicate a over voltage condition,
wherein voltage values of V1~12V and V2~12V indicate a jumpable condition,
wherein voltage values of 12V>V1>0V and above 12V>V2>6V indicate a jumpable condition,
wherein voltage values of V1~0V and V2~6V indicate a vehicle battery shortage condition,
wherein voltage values of V1<0V and V2<6V indicate a reverse polarity condition,
wherein voltage values of V1~0V and V2~12V indicate a open connection condition,
wherein voltage values of V1~0V and 10V>V2>7V indicate a correct polarity condition,
wherein voltage values of V1~0V and V2~6V indicate a reverse polarity condition
1440

FIG. 14C

Forming a jumper system comprising a sensor assembly, wherein the sensor assembly comprises a circuit comprising a voltage divider, wherein the circuit is coupled to a battery of the jumper system through a first switch, wherein the circuit is coupled to a battery of a vehicle through a second switch
1600

FIG. 16A

Turning off a first switch coupled to a voltage measuring circuit
1620

↓

Measuring a first voltage using the voltage measuring circuit
1630

↓

Turning off a second switch coupled to the voltage measuring circuit
1640

↓

Measuring a second voltage using the voltage measuring circuit
1650

↓

Turning on the first and second switches
1660

↓

Measuring a third voltage using the voltage measuring circuit
1670

↓

Determining a resistance based on the first, second, and third voltage
1680

FIG. 16B

Forming a sensor assembly comprising a first circuit and a second circuit, wherein the first circuit is configured to be coupled to a vehicle, wherein the first circuit is configured to measure a voltage related to the vehicle, wherein the second circuit is coupled to a jumper battery and configured to be coupled to a vehicle, wherein the second circuit is configured to measure a voltage related to the jumper battery and the vehicle
wherein outputs from the first and second circuits are provided to a controller, or
wherein outputs from the first and second circuits are multiplexed to be provided to the controller,
wherein the multiplexer is controlled by an oscillator circuit for automatically to toggle between inputs, or
wherein the multiplexer is controlled by the controller for the controller to toggle the multiplexer between inputs
1800

FIG. 18A

Forming a sensor assembly comprising first, second, and third circuits, wherein the first circuit is configured to be coupled to a vehicle, wherein the first circuit is configured to measure a voltage related to the vehicle, wherein the second circuit is coupled to a jumper battery and configured to be coupled to a vehicle, wherein the second circuit is configured to measure a voltage related to the jumper battery and the vehicle, wherein the third circuit is configured to measure a voltage related to the jumper battery, wherein outputs from the first, second, and third circuits are provided to a controller, or
wherein outputs from the first and second circuits are multiplexed to be provided to the controller,
wherein the multiplexer is controlled by an oscillator circuit for automatically to toggle between inputs, or
wherein the multiplexer is controlled by the controller for the controller to toggle the multiplexer between inputs
1820

FIG. 18B

Forming a sensor assembly comprising a switch having one end coupled to a circuit, wherein another end of the switch is coupled to a battery of a jumper system, wherein the circuit is configured to be coupled to polarity switching circuit for measuring a voltage of a vehicle with switchable polarity
2000

FIG. 20A

Forming a sensor assembly comprising a switch having one end coupled to a circuit, wherein another end of the switch is coupled to a battery of a jumper system,
wherein the circuit is configured to be coupled to polarity switching circuit for measuring a voltage of a vehicle with switchable polarity, wherein the switch is coupled to an oscillator circuit for automatically to toggle between on and off, or
wherein the switch is coupled to a controller for the controller to turn the switch on or off, wherein the polarity switching circuit is controlled by an oscillator circuit for automatically polarity switching toggling,
or
wherein the polarity switching circuit is coupled to a controller for the controller to switch polarity
2020

FIG. 20B

Forming a sensor assembly comprising a circuit configured to measure a voltage of a battery of a vehicle or a load of the vehicle,
wherein an output of the circuit is provided as an analog input to a controller, or
wherein the output of the circuit is partitioned into multiple ranges of voltages to be provided as multiple digital inputs to the controller
2300

FIG. 23A

Forming a sensor assembly comprising a circuit configured to measure a voltage of a battery of a vehicle or a load of the vehicle,
wherein an output of the circuit is partitioned into multiple ranges of voltages to be provided as multiple digital inputs to a controller,
wherein the voltage ranges comprise an over voltage range, a good battery comparable voltage range, a chargeable battery voltage range, a zero voltage range, and a reverse polarity voltage range
2320

FIG. 23B

Forming a sensor assembly comprising a circuit configured to measure a voltage of a battery of a vehicle or a load of the vehicle,
wherein an output of the circuit is provided to a comparator voltage level detector to be partitioned into one of multiple ranges of voltages to be provided as digital inputs to a controller
2340

FIG. 23C

2700 connects a jump starter with battery diagnostic to a battery of a vehicle.
2701 obtains a voltage of the battery.
2702 determines a state of charge of the battery based on the battery voltage.
2703 starts the vehicle.
2704 obtains a drop of voltage at the battery when the vehicle starts.
2705 determines a capacity of the battery based on the voltage drop.
2706 determines a condition of a starter motor based on the voltage drop.
2707 obtains a rate of increase of the battery voltage.
2708 determines a charging rate of the battery based on the voltage increase rate.
2710 determines a condition of an alternator based on the voltage increase rate.
2711 obtains a peak-to-peak voltage of a ripple of the battery voltage.
2712 determines a condition of an alternator based on the ripple voltage.

FIG. 27A 2720 connects a jump starter with battery diagnostic to a battery of a vehicle.
2721 optionally determines a state of charge of the battery.
2722 jump starts the vehicle.
2723 determines at least one of conditions of the battery, conditions of a starter motor, or conditions of an alternator of the vehicle.

FIG. 27B

2800 forms a jump starter.
  The jump starter comprises a power supply.
  The jump starter comprises a jump starter circuit coupled to the power supply with the jump starter circuit configured to jump start a vehicle.
  The jump starter is configured to determine a condition of the battery or of the vehicle based on one or more voltage values sampled from the battery.

*FIG. 28A*

2810 forms a jump starter.
  The jump starter comprises a load sensor configured to sample one or more voltages of a battery of a vehicle.
  The jump starter comprises a power supply configured to jump start a vehicle based on a status of the battery determined by the one or more voltages.
  The jump starter is configured to process the one or more voltages to determine a condition of the battery.

2811 The jump starter comprises a controller configured to control the load sensor to sample the one or more voltages.
  The controller is configured to process the one or more voltages.
2812 The condition of the battery comprises a state of charge of the battery determined based on the one or more voltages.
2813 The condition of the battery comprises a capacity of the battery determined based on a drop in the one or more voltages during a period in which the vehicle starts.
2814 The jump starter is configured to determine a condition of a starter motor based on a drop of the one or more voltages during a period in which the vehicle starts.
2815 The condition of the battery comprises a charging rate of the battery determined based on a voltage increase in the one or more voltages during a period after starting the vehicle.
2816 The jump starter is configured to determine a condition of an alternator based on a voltage increase in the one or more voltages during a period after starting the vehicle.
2817 The jump starter is configured to determine a condition of an alternator based on a peak-to-peak voltage of a ripple in the one or more voltages during a period after starting the vehicle.

*FIG. 28B*

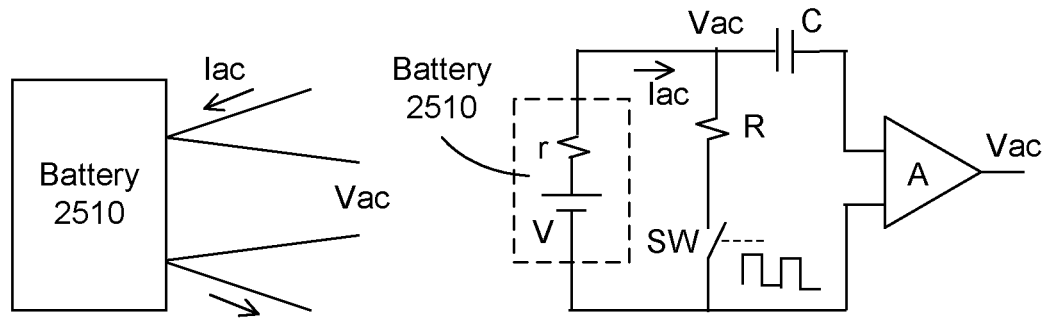
(a)  FIG. 30A  (b)
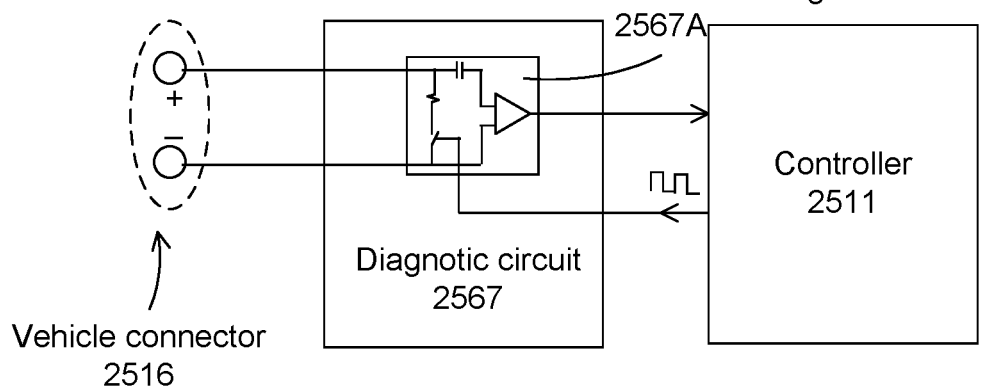
FIG. 30B
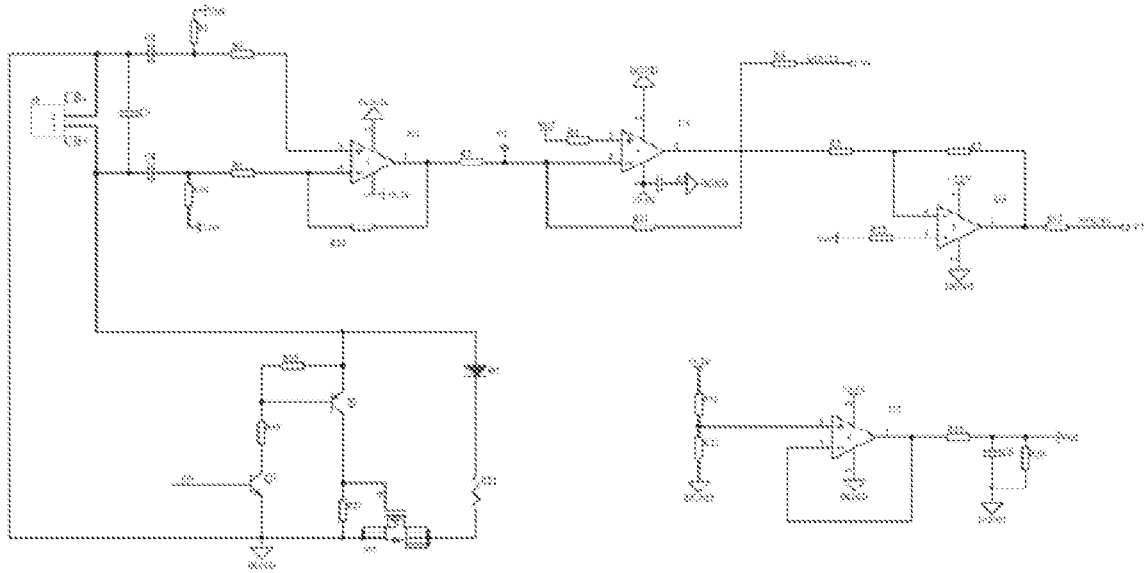
FIG. 30C

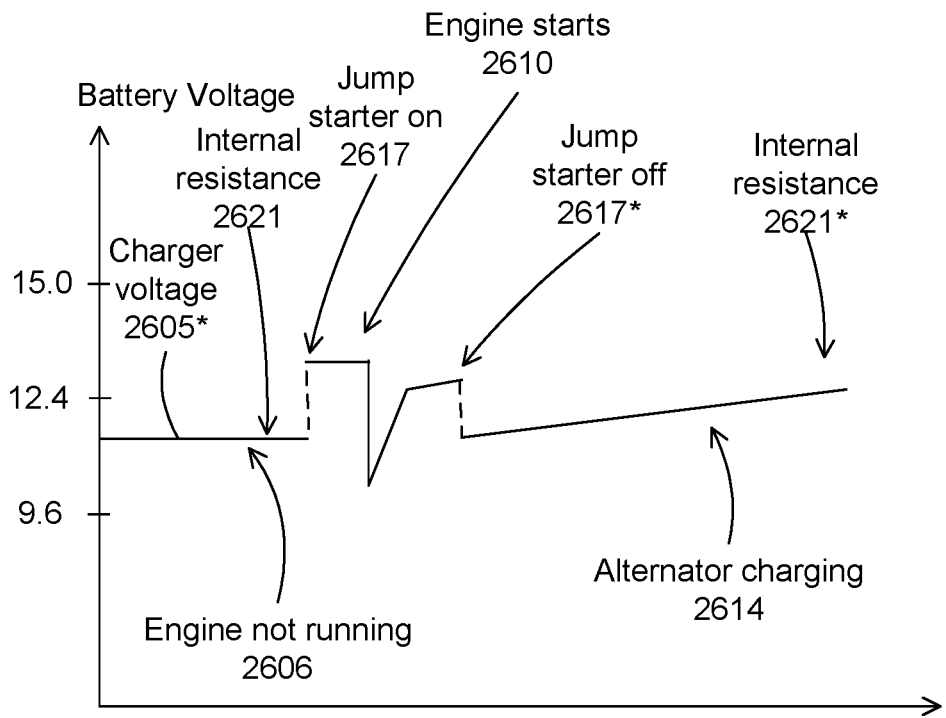
FIG. 31C
Battery condition
Initial voltage
State of charge
Lowest voltage
Voltage drop
Internal resistance
Cold cranking amps
Capacity
Charging rate
Charged voltage
Starter motor condition
Alternator condition
Charging rate
Ripple
FIG. 31D
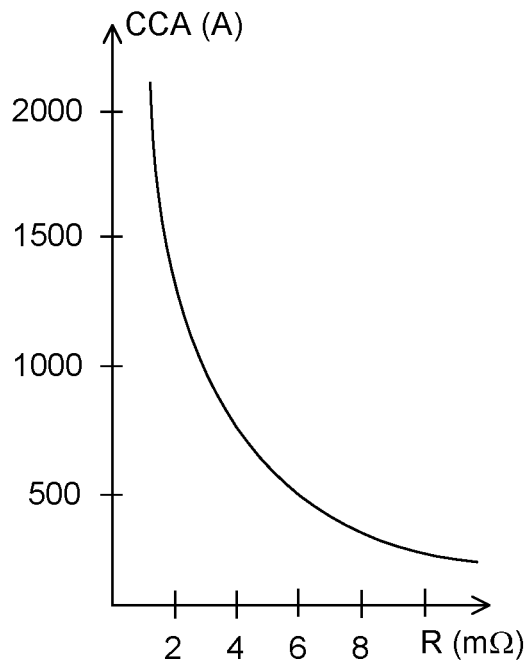
FIG. 31E

3200 connects a jump starter with battery diagnostic to a battery of a vehicle.
3201 obtains a voltage of the battery.
3202 determines a state of charge of the battery based on the battery voltage.
3203 obtains an internal resistance of the battery.
3204 determines a cold cranking amps (CCA) value of the battery based on the internal resistance.
3205 determines a battery life for the battery based on the CCA value.
3206 starts the vehicle.
3207 determines a capacity of the battery or a condition of a starter motor based on a voltage drop of the battery when the vehicle starts.
3208 determines a charging rate of the battery or a condition of an alternator based on a voltage increase rate when the vehicle is running.
3210 determines a condition of an alternator based on a peak-to-peak voltage of a ripple of the battery voltage when the vehicle is running.

*FIG. 32A*

3220 connects a jump starter with battery diagnostic to a battery of a vehicle.
3221 optionally determines an internal resistance, a state of charge of the battery.
3222 optionally determines a CCA value and a battery life of the battery.
3223 jump starts the vehicle.
3224 determines at least one of conditions of the battery, conditions of a starter motor, or conditions of an alternator of the vehicle.
3225 optionally determines an internal resistance, a CCA value and a battery life of the battery after the battery is charged.

*FIG. 32B*

3300 forms a jump starter.
  The jump starter comprises a power supply.
  The jump starter comprises a jump starter circuit coupled to the power supply with the jump starter circuit configured to jump start a vehicle.
  The jump starter comprises a diagnostic circuit configured to determine a condition of the battery or of the vehicle.
  The diagnostic circuit is configured to measure an internal resistance of the battery.

*FIG. 33A*

3310 forms a jump starter.
  The jump starter comprises a load sensor configured to sample one or more voltages of a battery of a vehicle.
  The jump starter comprises a power supply configured to jump start a vehicle based on a status of the battery determined by the one or more voltages.
  The jump starter comprises a diagnostic circuit configured to measure an internal resistance of the battery to determine a condition of the battery.

3311 The controller is configured to control the diagnostic circuit to obtain the internal resistance to determine a cold cranking amps value and a battery life data for the battery.
3312 The diagnostic circuit comprises an ac conductance measuring circuit for measure the internal resistance.
3313 The diagnostic circuit comprises a load circuit coupled to the battery with the load circuit comprising a switch coupled to the controller. The controller is configured to provide a series of pulses to the switch to generate a current.
  The diagnostic circuit comprises a measuring circuit coupled to the battery for measuring a voltage across the battery related to the current.
  The controller is configured to process the measured voltage to generate the internal resistance.
  The controller is configured to provide a CCA value of a battery life based on the internal resistance.
3314 The condition of the battery comprises a state of charge, a capacity, or a charging rate of the battery.
3315 The jump starter is configured to determine a condition of a starter motor, or a condition of an alternator

*FIG. 33B*

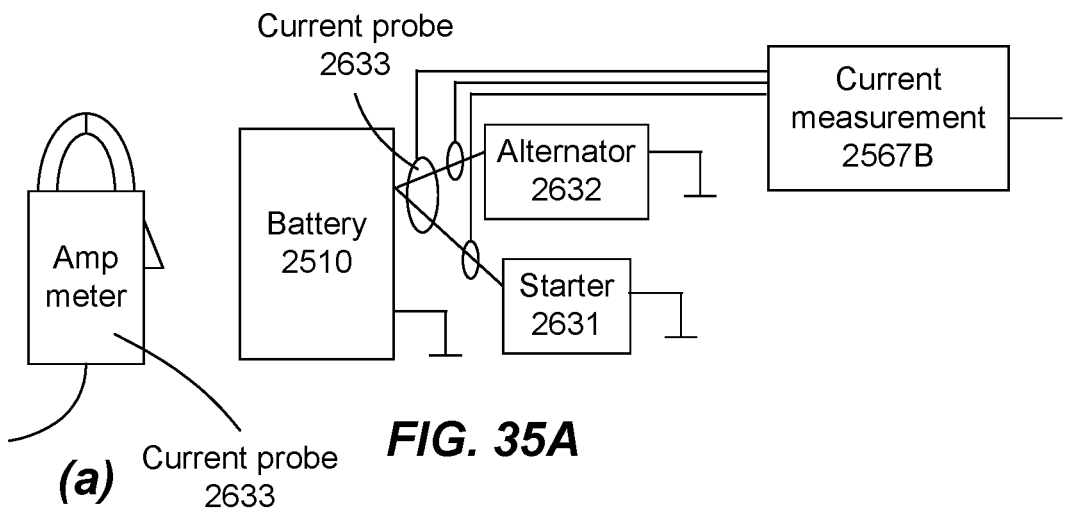
(a) Current probe 2633
FIG. 35A
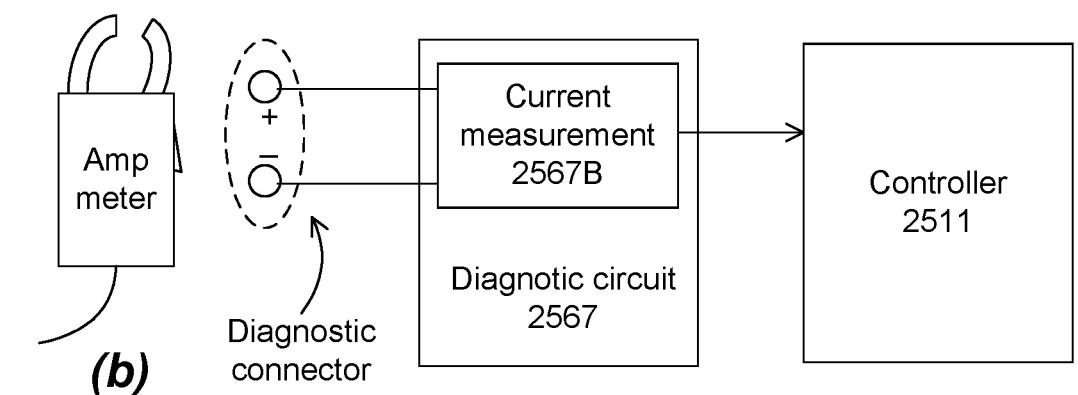
(b)
FIG. 35B
FIG. 35C
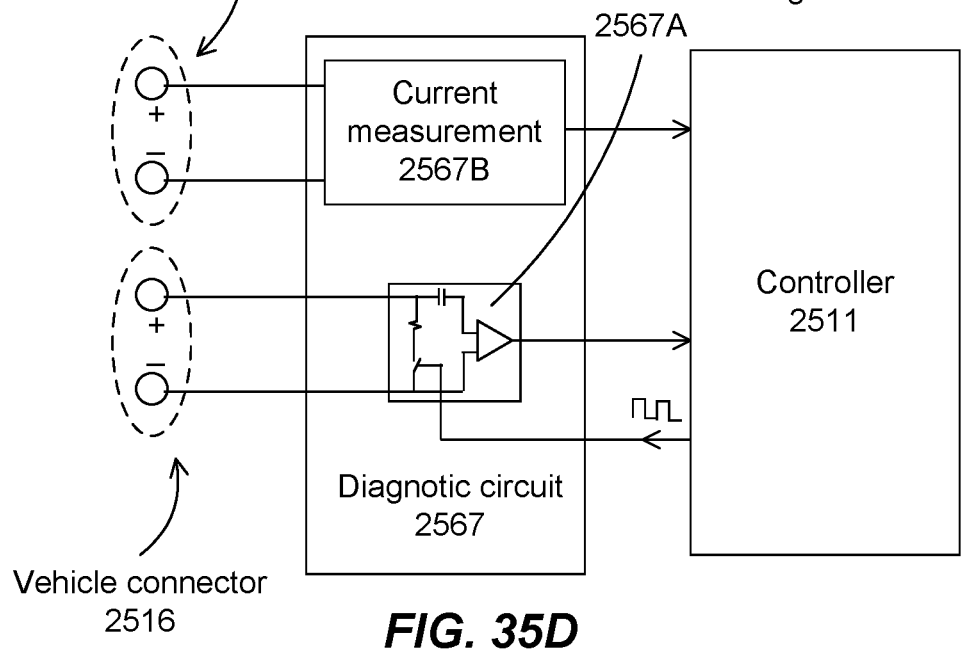
FIG. 35D

3700 connects a jump starter with battery diagnostic to a battery of a vehicle.
3701 samples voltages of the battery and currents out of the battery.
3702 determines a state of charge of the battery based on the battery voltage.
3703 starts the vehicle.
3704 determines a capacity of the battery or a condition of a starter motor based on a voltage drop at the battery when the vehicle starts.
3706 determines an internal resistance of the battery based on voltage and current values at a current surge time when the vehicle starts.
3707 determines a cold cranking amps (CCA) value of the battery based on the internal resistance.
3708 determines a battery life for the battery based on the CCA value.
3710 obtains an increase of the battery voltage and current.
3711 determines a charging rate of the battery or a condition of an alternator based on the voltage and current increase.
3712 determines a condition of an alternator based on the voltage and current increase and on a peak-to-peak voltage and current ripple.

*FIG. 37A*

3720 connects a jump starter with battery diagnostic to a battery of a vehicle.
3721 optionally determines a state of charge of the battery.
3722 jump starts the vehicle.
3723 determines at least one of conditions of the battery, conditions of a starter motor, or conditions of an alternator of the vehicle.
3724 optionally determines a CCA value and a battery life of the battery based on an internal resistance of the battery.

*FIG. 37B*

3800 forms a jump starter.
  The jump starter comprises a power supply.
  The jump starter comprises a jump starter circuit coupled to the power supply with the jump starter circuit configured to jump start a vehicle.
  The jump starter comprises a diagnostic circuit configured to determine a condition of the battery or of the vehicle.
  The diagnostic circuit is configured to measure an internal resistance of the battery.

*FIG. 38A*

3810 forms a jump starter.
  The jump starter comprises a load sensor configured to sample one or more voltages of a battery of a vehicle.
  The jump starter comprises a power supply configured to jump start a vehicle based on a status of the battery determined by the one or more voltages.
  The jump starter comprises a diagnostic circuit configured to measure an internal resistance of the battery to determine a condition of the battery.

3811 The controller is configured to control the diagnostic circuit to obtain the internal resistance to determine a cold cranking amps value and a battery life data for the battery.
3811 The diagnostic circuit comprises an ac conductance measuring circuit for measure the internal resistance.
3811 The diagnostic circuit comprises a load circuit coupled to the battery with the load circuit comprising a switch coupled to the controller. The controller is configured to provide a series of pulses to the switch to generate a current.
  The diagnostic circuit comprises a measuring circuit coupled to the battery for measuring a voltage across the battery related to the current.
  The controller is configured to process the measured voltage to generate the internal resistance.
  The controller is configured to provide a CCA value of a battery life based on the internal resistance.
3812 The condition of the battery comprises a state of charge, a capacity, or a charging rate of the battery.
3814 The jump starter is configured to determine a condition of a starter motor, or a condition of an alternator

*FIG. 38B*

EMERGENCY START-UP POWER SUPPLY WITH DIAGNOSTIC FUNCTION

The present patent application is a continuation-in-part (CIP) of U.S. patent application Ser. No. 18/092,249, filed on Dec. 31, 2022, entitled "Vehicle jump starter device", which is a continuation of U.S. patent application Ser. No. 17/515,477, filed on Oct. 31, 2021, entitled "Vehicle jump starter device", now U.S. Pat. No. 11,545,842, which claims priority from the U.S. Provisional Patent Application Ser. No. 63/223,830, filed on Jul. 20, 2021, entitled "Vehicle jump starter device", all of which are hereby incorporated by reference in their entirety.

BACKGROUND OF THE INVENTION

The present invention relates generally to systems and methods for a portable jump starter device with a diagnostic function.

With the improvement of people's living standards, self-driving cars are used more and more frequently. During operations, cars can encounter various emergencies, such as battery power loss, starter motor or alternator failure, or other problems. Roadside services are available in cases of emergency, but it could be time consuming. The functional requirements for emergency start-up and automobile diagnosis are clear and belong to the most important demand for automotive emergency self-help.

At present, there are products on the market to solve this basic functional demand. However, the two functions are divided into two separate distinct products. The start-up function and diagnostic function adopt a separate design, which lacks integrated user experience optimization, resulting in poor use experience.

Accordingly, there exists a need for further improvements in vehicle jump start devices having a diagnostic function.

SUMMARY OF THE EMBODIMENTS

In some embodiments, the present invention discloses jump starter devices with a diagnostic function, and methods to operate the devices. The jump starter device with a diagnostic function is configured to provide a jump starter functionality, together a diagnostic ability in a single self-contained portable product.

The multi-functional start-up power supply can provide a comprehensive solution for various emergency situations that drivers may encounter on the road. The device not only includes an emergency start-up function, but also includes a diagnostic function, which can quickly and efficiently determine potential problems with the vehicle.

Additionally, the device is designed with portability in mind. It has a compact and lightweight design, making it easy to carry and store in a vehicle. It also includes a built-in rechargeable battery, which can be charged via an external power source, ensuring that the device is always ready for use.

The jump starter with a battery or vehicle diagnosis function can be used to judge whether the car battery, together with other components of the vehicle, is damaged. With the jump starter having a battery diagnosis function, a user can quickly and efficiently detect the health status of the battery after starting, so as to decide whether to replace the battery.

The jump starter device with a diagnostic function can be programmed to provide conditions of the vehicle through the measured voltages performed by the load sensor. For example, the load sensor can be configured to sample the voltages of the battery for a short time, such as for a few minutes. The values and changes of the battery voltages can enable a diagnosis of the battery, the starter, and the alternator of the vehicle.

The jump starter device with a diagnostic function can include a diagnostic circuit configured to measure various data of the vehicle, such an internal resistance of the battery. The internal resistance can be an indicator of the battery health, such as a capacity and remaining life of the battery.

The diagnostic circuit can include a current measurement circuit configured to measure currents in the vehicle, such as currents delivered by the battery during a vehicle start up or running. The measured current, together with the measured voltages, can be process to provide a diagnosis of the vehicle, including the battery, the starter motor, and the alternator motor.

The jump starter device with a diagnostic function can be configured to perform a diagnosis of a vehicle, including battery related components such as the battery, the starter, and the alternator. For example, the jump starter device can perform battery related tests including testing to determine the battery states of charge and health (SOC & SOH), the battery voltage drop during cranking, the battery Cold Cranking Amps (CCA), the alternator current output (to diagnose under or overcharging), the alternator voltage and ripple (to diagnose blown diodes), the starter motor coil resistance (to diagnose motor winding faults), and the battery-to-starter motor cable volt drop and resistance.

In addition, the jump starter device with a diagnostic function can be configured to perform a diagnosis of other components of the vehicle, such as the engine health and performance system tests, injector tests, compression, pressure and system leak tests, and hydraulic tests. For example, the jump starter device can include accessories, such as pressure transducer to measure engine air intake, exhaust and fuel system pressures.

BRIEF DESCRIPTION OF THE DRAWINGS

FIGS. 2A-2E illustrate connection configurations of a jump starter device with a vehicle according to some embodiments.

FIGS. 3A-3C illustrate flow charts for forming a jump starter device according to some embodiments.

FIG. 4 illustrates a flow chart for operating a jump starter device according to some embodiments.

FIGS. 6A-6B illustrate flow charts for forming a jump starter device according to some embodiments.

FIGS. 8A-8B illustrate an operation of an active voltage sensor according to some embodiments.

FIGS. 9A-9D illustrate flow charts for forming a voltage detecting circuit according to some embodiments.

FIGS. 11A-11C illustrate flow charts for forming a sensor assembly according to some embodiments.

FIGS. 14A-14C illustrate flow charts for forming a jump starter device according to some embodiments.

FIGS. 16A-16B illustrate flow charts for operating a jump starter device according to some embodiments.

FIGS. 18A-18B illustrate flow charts for forming a sensor assembly according to some embodiments.

FIGS. 20A-20B illustrate flow charts for forming sensor assemblies having a polarity swapping circuit according to some embodiments.

FIGS. 23A-23C illustrate flow charts for forming sensor assemblies according to some embodiments.

FIGS. 27A-27B illustrate flow charts for operating a jump starter with a diagnostic function according to some embodiments.

FIGS. 28A-28B illustrate flow charts for forming a jump starter with a diagnostic function according to some embodiments.

FIGS. 30A-30C illustrate a diagnostic circuit for measuring an internal resistance of a battery according to some embodiments.

FIGS. 31A-31E illustrate a diagnostic function of the jump starter according to some embodiments.

FIGS. 32A-32B illustrate flow charts for operating a jump starter with a diagnostic function according to some embodiments.

FIGS. 33A-33B illustrate flow charts for forming a jump starter with a diagnostic function according to some embodiments.

FIGS. 35A-35E illustrate a diagnostic circuit for measuring a current of a vehicle according to some embodiments.

FIGS. 37A-37B illustrate flow charts for operating a jump starter with a diagnostic function according to some embodiments.

FIGS. 38A-38B illustrate flow charts for forming a jump starter with a diagnostic function according to some embodiments.

DETAILED DESCRIPTION OF THE EMBODIMENTS

Figure 1A:
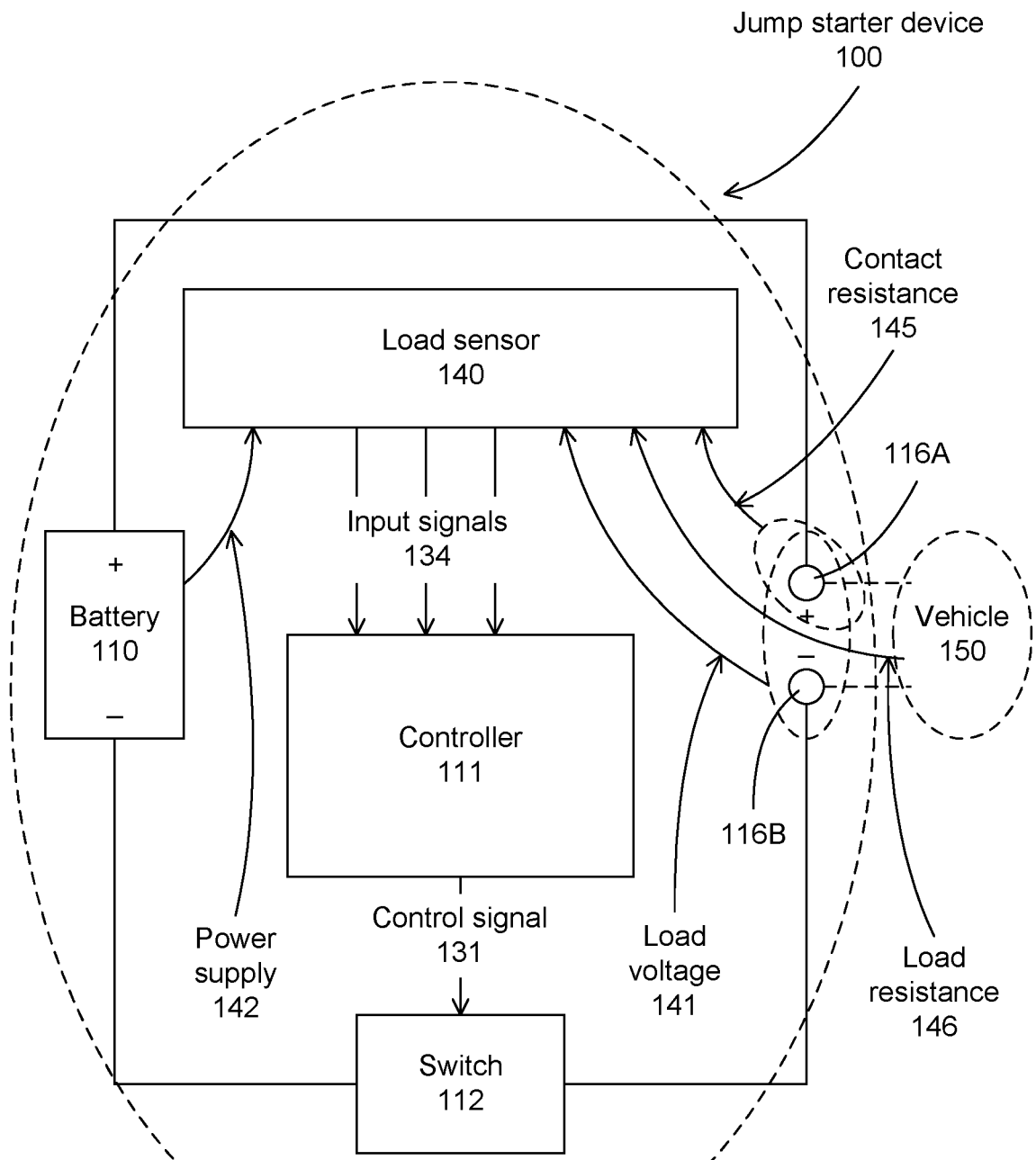
FIGS. 1A-1B illustrate a configuration for a jump starter device according to some embodiments.

In some embodiments, the present invention discloses jump starter devices with a diagnostic function and methods to operate the jump starter devices with the diagnostic function. A jump starter device with a diagnostic function can include a jump starter component, which can include load sensors, e.g., sensors or sensing circuits to measure data, such as voltage data, of a load coupled to the jump starter device. The jump starter device can include a controller configured to process the load data to determine the status of the load, such as the conditions of the vehicle connected to the jump starter.

The load data can include voltages from the load under different conditions, such as the load voltages under no external power source or under the excitation of an external power source. For example, under no external power source, the vehicle can provide a voltage, e.g., a voltage different from zero, or no voltage, e.g., a zero voltage. Under an external power source, the sensor can measure same, similar, or completely different voltages.

From the load data, the controller can determine whether a battery is present. If a battery is present, the load data can provide indications of how suitable is the battery condition for the jump starter device to operate. If the battery is not present, the load data can provide indications of whether the vehicle conditions are suitable for the jump starter device to operate.

The status of the load can include the conditions of the battery, after the battery is determined to be present and connected to the jump starter device. For example, the conditions of the battery can include an over-voltage battery, e.g., a battery having a voltage significant higher than a battery in the jump starter device, which can potentially cause damages to the jump starter device.

The conditions of the battery can include a fully charged battery, e.g., a battery having a voltage similar to a new battery, such as between 12V and 13.5V for a 12V battery. The fully charged battery condition can be suitable to operate the jump starter device.

The conditions of the battery can include a good battery, e.g., a battery partially depleted or partially discharged, such as having between 10V and 12V for a 12V battery. The good battery condition can be suitable to operate the jump starter device, such as to jump starting the vehicle or to charge the vehicle battery with the jump starter device.

The conditions of the battery can include a poor battery, e.g., a battery mostly depleted or mostly discharged, such as having between 0V and 10 V for a 12V battery. The poor battery condition can be suitable to operate the jump starter device, such as to jump starting the vehicle. The poor battery condition is unlikely suitable for charging the vehicle battery with the jump starter device.

The conditions of the battery can include a reverse polarity battery, e.g., a battery having the terminals connected in reverse to the jump starter device, such as the positive terminal of the vehicle battery connected to the negative terminal of the jump starter device. The reverse polarity condition can be indicated by a measured negative voltage. In some embodiments, the load sensor can convert the negative voltage to a positive voltage, in order to simplify the voltage detection using a TTL (transistor transistor logic) signal input to a controller such as a microprocessor. The reverse polarity battery condition can be unsuitable to operate the jump starter device, so that the jump starter device can be shut down until the condition is corrected.

The conditions of the battery can include a shorted battery, e.g., a battery having the terminals sorted together. The shorted battery can exhibit 0V. The shorted battery condition can be unsuitable to operate the jump starter device, for example, which can damage the jump starter device by shorting the battery of the jump starter device. The jump starter device can be shut down until the condition is corrected, such as to remove the shorted battery.

The status of the load can include the conditions of the connection between the jump starter device and the vehicle, such as with the vehicle battery or with the vehicle circuit. The condition of the connection can include situations in which the battery is present or in which the battery is not present. For example, the conditions of the connection can include an open connection, e.g., the cables of the jump starter device do not make contact with the vehicle battery or with the vehicle circuit. The non-contact condition can be unsuitable to operate the jump starter device by not connecting the jump starter device with the vehicle. The jump starter device can be shut down until the condition is corrected, such as to re-establish the connection of the jump starter cables.

The conditions of the connection can include a poor connection, e.g., the cables of the jump starter device do not make good contact with the vehicle battery or with the vehicle circuit, which can result in a high contact resistance between the jump starter device and the vehicle. Depending on the contact resistance, the poor-contact condition can be suitable or unsuitable to operate the jump starter device. In the case of high contact resistance, the jump starter device can be shut down until the condition is corrected, such as to re-establish the connection of the jump starter cables.

The status of the load can include the conditions of the vehicle circuit, after the battery is determined to be not present or present but not connected to the jump starter device. For example, the conditions of the vehicle circuit can include a shorted vehicle circuit, such as when the jump starter cables connected in reverse polarity with the vehicle circuit, which can provide a short current path through the flyback diodes in parallel with the starter or alternator motor. The shorted vehicle circuit condition can be unsuitable to operate the jump starter device by damaging both the jump starter device and the vehicle circuit. The jump starter device can be shut down until the condition is corrected, such as to correct the polarity connection between the jump starter cables and the vehicle circuit.

The conditions of the vehicle circuit can include a good connection with vehicle circuit without the presence of a battery. The good connection can be suitable to operate the jump starter device, such as to jump start the vehicle or to use the jump starter device to temporarily replace the battery to operate the vehicle.

Figure 1B:
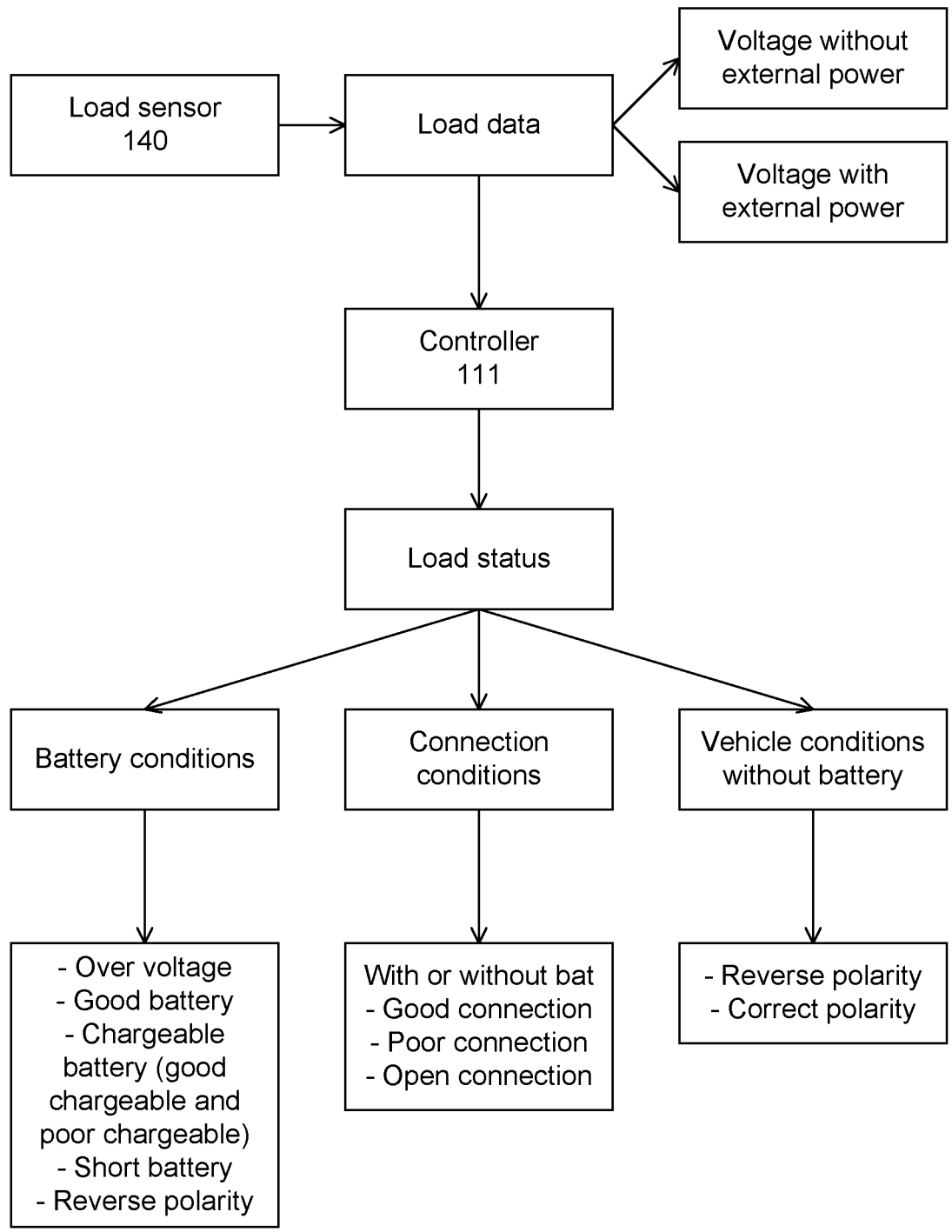

FIGS. 1A-1B illustrate a configuration for a jump starter device according to some embodiments. In FIG. 1A, a jump starter device 100 can include an internal power supply, such as a battery 110, having the terminals coupled to an output coupler 116A/116B, which is designed to be coupled to a pair of cables for connecting to a vehicle 150, such as to the battery of a non-operative vehicle or to the circuit of the vehicle without connecting to the battery. The connection of the battery terminals to the coupler can be controlled by a switch 112. For example, a first battery terminal, such as the positive terminal, can be directly coupled to a positive terminal 116A of the coupler. A second battery terminal, such as the negative terminal, can be coupled to a negative terminal 116B of the coupler through the switch 112. Other connection can be used, such as the positive terminals are coupled together through the switch 112, while the negative terminals are directly connected to each other. The switch 112 can be a controllable switch, such as a coiled relay, a solid state relay, or a power transistor. The switch 112 can include multiple parallel switches, for example, to accommodate a high current supplied by the jump starter device to the vehicle.

The switch 112 can be controlled by a controller 111, such as a microcontroller or a microprocessor, e.g., the microcontroller 111 can connect or disconnect the connection between the battery and the output coupler of the jump starter device. As shown, the controller 111 can issue a control signal 131 to the switch 112. The control signal 131 can activate the switch 112, e.g., to turn on the switch 112 so that the negative terminal of the battery is connected to the negative terminal 116B of the output coupler. The control signal 131 can deactivate the switch 112, e.g., to turn off the switch 112 so that the negative terminal of the battery is disconnected from the negative terminal 116B of the output coupler.

In general, the controller 111 can activate the switch 112 when the condition of the vehicle is suitable for the jump starter device to jump start the vehicle, to charge the battery of the vehicle, or to replace the vehicle battery with the jump starter device. When the vehicle condition is not suitable, e.g., potentially damaging the jump starter device or the vehicle battery or the vehicle circuit, the controller 111 can deactivate the switch 112.

The microcontroller 111 can receive input signals 134 from a load sensor 140, which can be coupled to the vehicle 150 for measuring data of the vehicle 150, such as the load voltage 141 of the vehicle, the contact resistance 145 between the jumper cables and the vehicle, and the load resistance 146 of the vehicle. The load sensor can have its internal power 142, such as by coupling to the battery 110. By having an internal power supply, the load sensor can be an active sensor, e.g., a sensor that can measure a load response after supplying a power to the load.

The load sensor can be configured to obtain load data, e.g., data from the load coupled to the output terminals. For example, the load sensor can be a circuit configured to convert a voltage of the load, e.g., the voltage at the output terminals, to another voltage. By coupling or decoupling the battery to the load sensor, the load sensor can be configured to provide a first voltage related to the load voltage without using the battery power, and a second voltage related to the load voltage using the battery power.

From the input signals 134, the controller 111 can determine the status of the vehicle and the connectivity between the jump starter device and the vehicle. Based on the vehicle status, the controller can issue the control signal 131 to turn on or turn off the switch 112.

The controller 111 can be configured to receive the load data from the load sensor, and can process the load data to obtain a condition of the vehicle. For example, the controller can analyze the first and second voltages received from the load sensor, and can determine the condition or status of the vehicle, such as the connection with the vehicle can have a reverse polarity, the connection with the vehicle can be an open connection, e.g., not making contact, the vehicle battery can be shorted, the vehicle battery can have an abnormally high voltage not suitable for the jump starter device, the vehicle can be missing a battery, the jump starter device can be used to jump start the vehicle or charge the vehicle battery, or the jump starter device can be used as a replacement battery or a supplement battery for the vehicle.

In FIG. 1B, the load sensor 140 can be configured to measure load data from the output terminals, such as a first voltage without an external power and a second voltage with an external power. The load data can be provided to the controller 111, which can analyze the load data to determine the status of the load, e.g., conditions of the vehicle that the jump starter device is connected to. For example, the load status can include conditions of the vehicle battery, such as an over voltage of the vehicle battery, a good vehicle battery, a chargeable battery (good chargeable and poor chargeable), a short battery, or a battery with a reverse polarity connection. The load status can include conditions of the connection between the jump starter device and the vehicle, with or without a battery in the vehicle, such as a good connection, a poor connection, or an open connection. The load status can include conditions of the vehicle without a battery, such as a reverse polarity connection or a correct polarity connection.

Figure 2A:
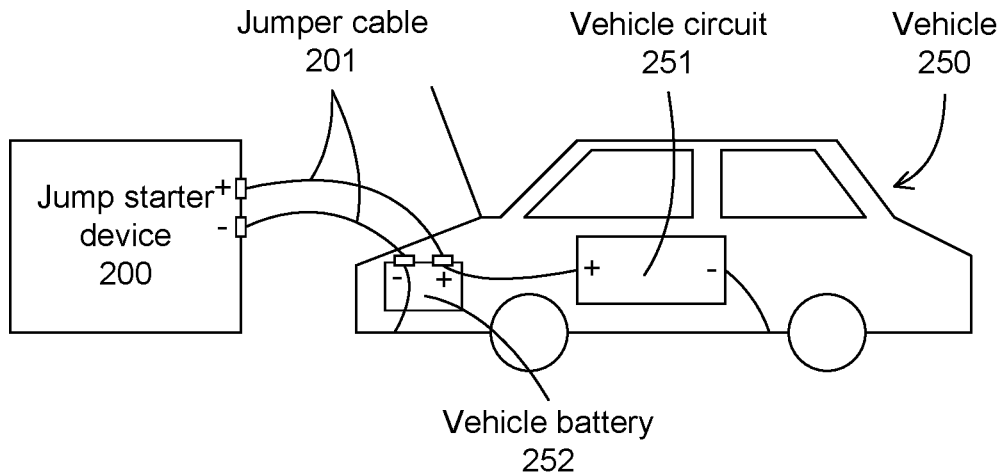

FIGS. 2A-2E illustrate connection configurations of a jump starter device with a vehicle according to some embodiments. In FIG. 2A, the jump starter device 200 can be coupled to a vehicle 250, such as through a pair of jumper cables 201. The jumper cables can be connected to the battery 252 of the vehicle, or can be connected to the circuit 251 of the vehicle, without connecting to the battery 252. For example, the battery 252 can be removed from the vehicle 250. Alternatively, the battery 252 is still in the vehicle 250, but is disconnected from the vehicle circuit. The jumper cables can be connected to the vehicle circuit without contacting the battery.

Figure 2B:
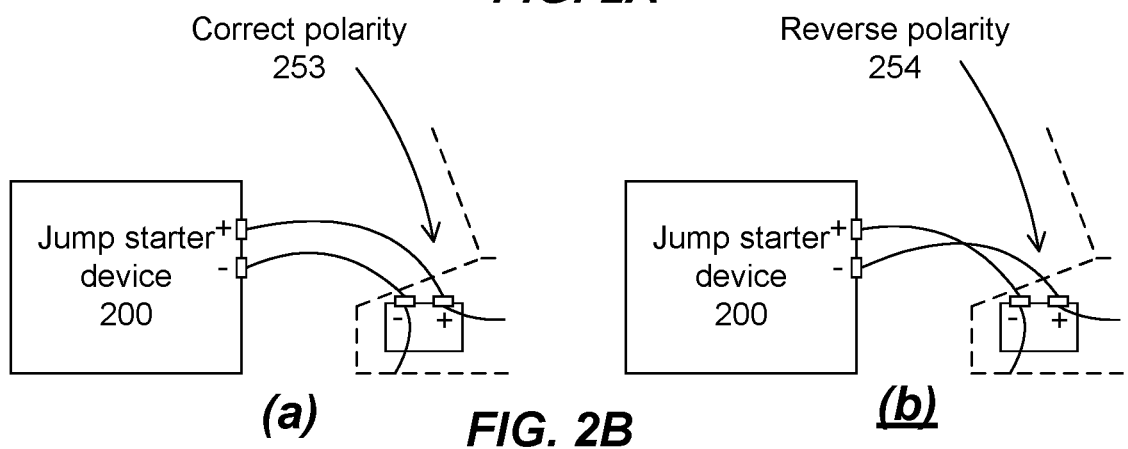

In FIG. 2B(a), the jumper cables can be connected to the vehicle battery with correct polarity 253, e.g., the positive/negative terminal of the jumper cables (which is coupled to the positive/negative terminal of the battery in the jump starter device, respectively, through or not through a switch) is connected to the positive/negative terminal of the battery, respectively. The correct polarity condition is necessary for a proper connectivity between the jump starter device and the vehicle.

In FIG. 2B(b), the jumper cables can be connected to the vehicle battery with reverse polarity 254, e.g., the positive/negative terminal of the jumper cables is connected to the negative/positive terminal of the battery, respectively. The reverse polarity condition is an unsuitable condition for the use of the jump starter device. The jump starter can be shut down waiting for the correction of the reverse polarity condition.

Figure 2C:
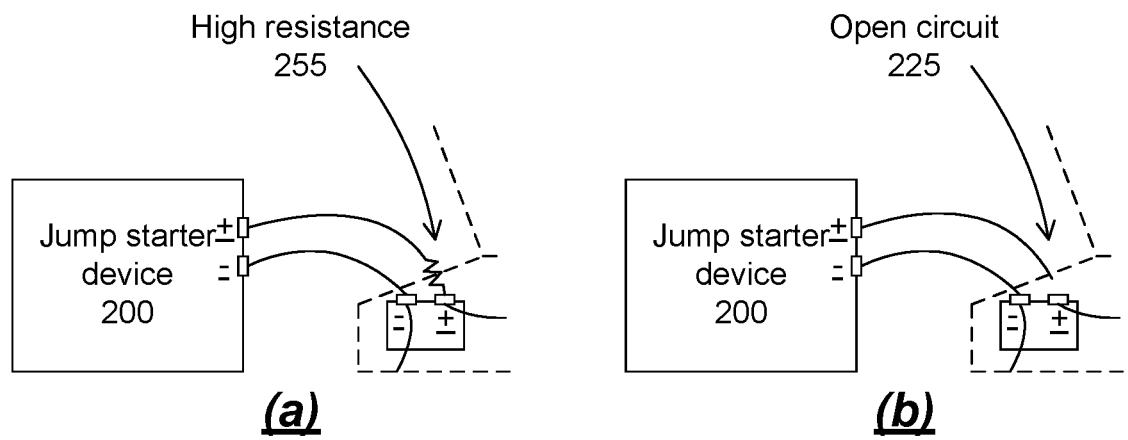

In FIG. 2C(a), the jumper cables can be poorly connected to the vehicle battery, e.g., connected with high contact resistance 255. For example, the connection can be improper, such as connecting mostly to the insulation instead of to the terminal of the battery. The poor connection, which can be identified as having high contact resistance at the connection, can render the jump starter device ineffective, e.g., can significantly reduce the current supplied to the vehicle. The jump starter can be shut down waiting for the correction of the connection.

In FIG. 2C(b), the jumper cables can be not connected to the vehicle battery, e.g., forming an open circuit connection 225. For example, the connection can be improper, such as connecting to the insulation instead of to the terminal of the battery. The open connection, which can be identified as having infinite contact resistance at the connection, can render the jump starter device ineffective, e.g., power cannot be transferred to the vehicle from the jump starter device. The jump starter can be shut down waiting for the correction of the connection.

In FIG. 2D(a), the jumper cables can be connected to the vehicle, and with the vehicle battery missing or removed. For example, the battery can be missing or removed from the vehicle. For example, if the battery is shorted, the battery can be removed. With a proper connection, the jump starter device can function as a battery replacement, e.g., the vehicle can operate with the jump starter device temporarily replacing the vehicle battery.

In FIG. 2D(b), the jumper cables can be connected to the vehicle, and without connecting to the vehicle battery. For example, the vehicle battery can still be present but not connected to the jump starter device or the vehicle circuit. Similar to the missing battery, with a proper connection, the jump starter device can function as a battery replacement, e.g., the vehicle can operate with the jump starter device temporarily replacing the vehicle battery.

In FIG. 2E(a), the jumper cables can be connected to the vehicle, and without connecting to the vehicle battery, with correct polarity 253*. The correct polarity condition can be represented by a reasonable load resistance, e.g., the resistance of the vehicle circuit such as the alternator or other electrical components. The correct polarity condition, without the vehicle battery, can allow the vehicle to start with the assistance of the jump starter device. In addition, the vehicle can operate, e.g., running, with the jump starter device temporarily replacing the vehicle battery.

In FIG. 2E(b), the jumper cables can be connected to the vehicle, and without connecting to the vehicle battery, with reverse polarity 254*. The reverse polarity condition can be represented by a short circuit, e.g., zero resistance due to the flyback diodes in parallel to the alternator or the starter motor. The reverse polarity condition, without the vehicle battery, can cause damage to the vehicle and to the jump starter device. Thus, the jump starter device can be shut down waiting for the correction of the polarity condition.

FIGS. 3A-3C illustrate flow charts for forming a jump starter device according to some embodiments.

In FIG. 3A, operation 300 forms a jump starter device. The jump starter device can include a battery connected to a switch before connected to a jumper cable. The jump starter device can include a controller configured to turn on or off the switch based on input signals from a sensor assembly configured to monitor conditions of a vehicle connected to the jumper cable.

In FIG. 3B, operation 320 forms a jump starter device. The jump starter device can include a battery coupled to a switch controlled by a controller based on inputs from a sensor assembly configured to monitor conditions of a vehicle connected to the jump starter device. The conditions can include a voltage of the vehicle with or without a vehicle battery, a resistive load of the vehicle without the vehicle battery, or a contact resistance between the jump starter device and the vehicle.

In FIG. 3C, operation 340 forms a jump starter device. The jump starter device can include a battery coupled to a switch controlled by a controller based on inputs from a sensor assembly configured to monitor conditions of a vehicle connected to the jump starter device. The conditions can include whether the jump starter device coupled to the vehicle with correct or with reverse polarity and with the vehicle having a battery or not having a battery, whether the jump starter device is properly connected to the vehicle, or whether the battery is shorted.

FIG. 4 illustrates a flow chart for operating a jump starter device according to some embodiments. In FIG. 4, operation 400 connects a jumper cable of a jump starter device to a vehicle. The jump starter device can include a sensor assembly configured to monitor a condition of the connection or a condition of the vehicle. The sensor assembly can be configured to provide inputs to a controller configured to control whether a battery of the jump starter device is connected to the vehicle.

Operation 410 assesses, by the sensor assembly, whether a battery of the vehicle is over voltage. Operation 420 assesses, by the sensor assembly, whether the vehicle battery is having similar voltage with correct polarity. Operation 430 assesses, by the sensor assembly, whether the vehicle battery is connected with correct polarity. Operation 440 assesses, by the sensor assembly, whether the vehicle battery is shorted. Operation 450 assesses, by the sensor assembly, whether the vehicle battery is connected with reverse polarity. Operation 460 assesses, by the sensor assembly, whether the jumper cable is connected to the vehicle without connected to the vehicle battery, and whether the connection is open. Operation 470 assesses, by the sensor assembly, whether the jumper cable is connected to the vehicle without connected to the vehicle battery, and whether the connection is with correct polarity. Operation 480 assesses, by the sensor assembly, whether the jumper cable is connected to the vehicle without connected to the vehicle battery, and whether the connection is with reverse polarity.

In some embodiments, the jump starter device can include a load sensor assembly having active and passive sensors for measuring load conditions of a connected vehicle. In a passive sensor, the sensor senses a condition or a status of the load using a power of the load. For example, a voltmeter can be considered as passive sensor, which can be used to measure the voltage of the load. The voltmeter uses the power of the load, e.g., to measure the load voltage caused by the load power. In the case of the vehicle, the passive sensor of the jump starter device uses the vehicle power, e.g., using the vehicle battery, to obtain a voltage of the vehicle, e.g., a voltage of the battery present in the vehicle.

In contrast, an active sensor can include its own power supply, e.g., using the power supply of the sensor to provide to the load to sense a response of the load corresponded to the applied power. For example, an Ohmmeter can be considered an active sensor, which can apply a voltage to the load to measure a current response, which is proportional to the resistance of the load. In the case of the vehicle, the active sensor of the jump starter device uses an external power, such as the power of a battery of the jump starter device, to apply to the vehicle, e.g., to apply to the vehicle circuit with or without a vehicle battery, to obtain a voltage of the vehicle, e.g., a voltage of the battery present in the vehicle or a voltage of the vehicle circuit if there is not battery in the vehicle.

A typically passive sensor can be converted to an active sensor, for example, to obtain a different response of the load. For example, a passive voltmeter can measure the voltage of the load. An active voltmeter can supply a voltage to the load, and to measure another voltage related to the supplied voltage and also to the load voltage.

In some embodiments, the load sensor of the jump starter device can include an active sensor, together with an optional passive sensor. The active sensor can include a voltage sensor configured to measure a voltage of the vehicle, such as a voltage of the vehicle battery. The active voltage sensor can be configured to vary the measured voltage caused by the vehicle battery, which can simplify the voltage detection of the vehicle battery. For example, the measured voltages of the vehicle battery can be between 12V and −12V, with the negative voltages resulted from a reverse polarity. The negative voltages can cause difficulty to the microprocessor, such as to a microprocessor circuit using TTL logic. Thus, the active voltage sensor can apply a voltage to the vehicle load, so that the measured voltages can be between 12V and 0V, with the 12V-6V corresponded to the correct polarity measurement of 12V-0V vehicle battery, and with the 6V-0V corresponded to the reverse polarity measurement of 0V--12V vehicle battery. The active voltage sensor can map the range of the voltages of the vehicle battery, which can be from a negative value to a positive value, to another range, which can be positive values, e.g., from 0V to a positive value.

The use of 12V and 6V is just an example. Other voltage values can be used to separate the positive and negative ranges of the vehicle battery. For example, the positive battery range can be more important, e.g., having multiple sub range of good battery, poor battery, bad battery, and shorted battery, as compared to the negative battery range, e.g., having only one range of reverse polarity connection. Thus, other voltage ranges different from 12-6 C and 6-0V can be used. For example, the voltage ranges can be divided by 12V-3V for correct polarity and 3V-0V for reverse polarity connection.

In some embodiments, the load sensor can include a combination of an active sensor and a passive sensor. The sensor combination can provide a separation of similar voltage measurements. For example, a zero voltage measurement using a passive voltage sensor can indicate as short battery, an open connection, or a connection to the vehicle without contacting the battery. The use of an active voltage sensor can provide different voltages for these different conditions.

The combination of active and passive sensors can include 2 separate sensors, or one sensor which can be switched between the active sensor and the passive sensor. The switching can be automatic, for example, by an oscillator switching between the two sensors in every cycle of the oscillation. The switching can be controlled by the controller, which can switch sensors before measuring.

In some embodiments, the sensor combination can be used to calculate a resistance, such as a load resistance, a contact resistance, or a combination of load and contact resistance, for example, by determining a current passing through a known resistance.

Figure 5:
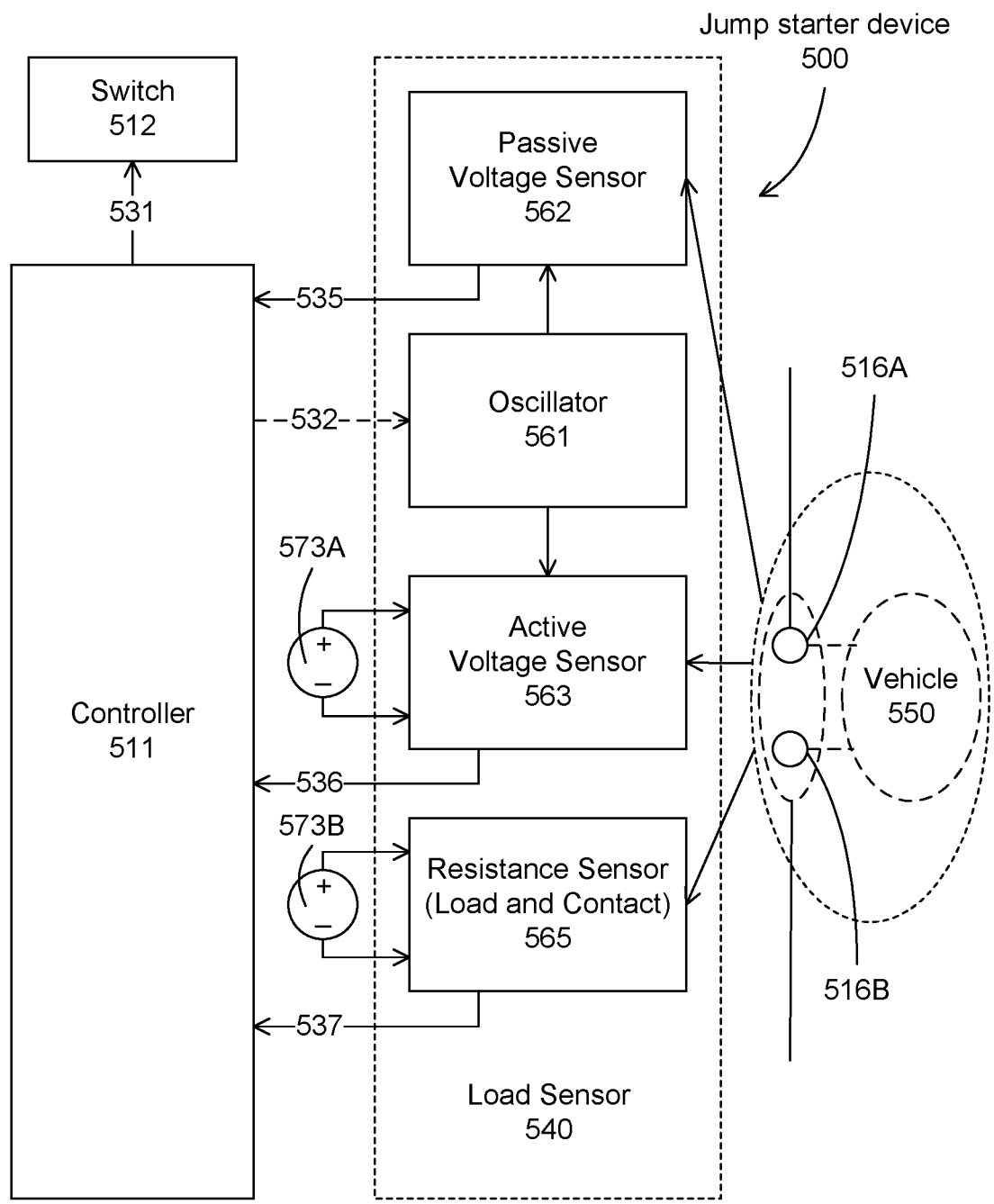
FIG. 5 illustrates a portion of a jump starter device according to some embodiments.

FIG. 5 illustrates a portion of a jump starter device according to some embodiments. A jump starter device 500 can include a controller 511, such as a microprocessor, which can receive input signals 535, 536, and 537 from a load sensor 540, and which can generate an output signal 531 to activate or deactivate a switch 512.

The load sensor 540 can include a passive voltage sensor 562, which can be coupled to a vehicle 550, for example, through the output coupler 516A/516B, and which can be used to measure a voltage of the vehicle battery. The output 535 of the passive voltage sensor 562 can be provided to the controller 511 as an input 535 to determine the output signal 531.

The load sensor 540 can include an active voltage sensor 563, which can be coupled to a vehicle 550, for example, also through the output coupler 516A/516B. The active voltage sensor 563 can have a power supply 573A, which can be the battery of the jump starter device, or which can be a separate and independent power supply. The active voltage sensor can be used to measure a different voltage of the vehicle battery, e.g., different than the voltage measured by the passive voltage sensor. For example, the measured voltage from the active sensor can be proportional to the voltage of the power supply 573A and also proportional to the vehicle battery voltage. The output 536 of the active voltage sensor 563 can be provided to the controller 511 as an input 536 to determine the output signal 531.

An oscillator 561 can be used to activate the passive voltage sensor 562 or the active voltage sensor 563. For example, in one cycle of the oscillator, the passive voltage sensor 562 can be activated first, followed by the active voltage sensor 563. Alternatively, the controller 511 can provide an output signal 532 to the oscillator 561, for example, to toggle the activation of the passive or active voltage sensor. For example, a first output signal 532 can activate the oscillator, which then activates the passive voltage sensor. A second output signal 532 can activate the oscillator, which can activate the active voltage sensor.

In some embodiments, the oscillator can include a controllable switch, which can be a circuit configured to turn on or to turn off a connection upon receiving a control signal, such as signal 562. For example, when the switch is off, the passive voltage sensor is activated and the active voltage sensor is deactivated, allowing the load sensor to measure a voltage of the vehicle. Upon receiving a control signal 562 from the controller, the switch is on, activating the active voltage sensor and deactivating the passive voltage sensor. The load sensor can measure another voltage of the vehicle subjected to the application of the external power supply 573A.

The load sensor 540 can include a resistance sensor 565, which can be coupled to a vehicle 550, for example, also through the output coupler 516A/516B, and which can be used to measure a resistance of the connection of the jumper cables and/or the resistance of the vehicle circuit. The resistance sensor 565 can have a power supply 573B, which can be the battery of the jump starter device, or which can be a separate and independent power supply. The resistance measurement can include a voltage measurement, together with a calculation to determine the resistance. The output 537 of the resistance sensor 565 can be provided to the controller 511 as an input 537 to determine the output signal 531.

The measured resistance can include a contact resistance, e.g., the resistance of the connection between the cables of the jump starter device to the terminals of the vehicle. The measured resistance can include a load resistance of the vehicle, e.g., the resistance of the vehicle circuit when the connection does not contact the vehicle battery. The measured resistance can include a combination of contact resistance and load resistance, e.g., the resistances are measured together.

In some embodiments, the contact resistance can be either a very low resistance, which indicates a good connection between the jump starter device and the vehicle; or a very high resistance, which indicates an open connection, e.g., the cables of the jump starter device do not make contact with the terminals of the vehicle. As an estimate, the very low contact resistance can be characterized as a zero resistance, while the very high contact resistance can be characterized as an infinite resistance.

In some embodiments, the resistance sensor 565 can be a software component, e.g., an algorithm in the controller 511. For example, the controller can receive voltage measurements from the passive and active voltage sensors, and can use the measured voltage values to calculate the resistance, for example, through known configurations.

FIG. 6A-6B illustrate flow charts for forming a jump starter device according to some embodiments. In FIG. 6A, operation 600 forms a jump starter device. The jump starter device can include a battery coupled to a switch controlled by a controller based on inputs from a sensor assembly configured to monitor conditions of a vehicle connected to the jumper system. The sensor assembly can include a passive voltage detector coupled to a battery of the vehicle. The sensor assembly can include an active voltage detector coupled between the jumper battery and the vehicle battery, and a circuit, such as an oscillator or a switch, to alternate between the passive and active voltage detectors.

In FIG. 6B, operation 620 forms a jump starter device. The jump starter device can include a battery coupled to a switch controlled by a controller based on inputs from a sensor assembly configured to monitor conditions of a vehicle connected to the jumper system. The sensor assembly can include a voltage detector configured to measure voltages of a battery of the vehicle if the vehicle battery is connected with the jumper system. The voltage detector is also configured to measure a load of the vehicle if the vehicle battery is not connected with the jumper system.

In some embodiments, the load sensor can include a passive voltage sensor and an active voltage sensor. The passive and active voltage sensor can be coupled to the vehicle, such as coupled to the vehicle by coupling to the vehicle battery or coupled to the vehicle by coupling to the vehicle circuit without connecting to the battery (because the battery is not present or because the present battery is removed from being connected to the vehicle circuit).

Thus, when the jump starter device is coupled to the vehicle, the passive voltage sensor can measure the voltage of the vehicle battery, and thus can provide conditions of the vehicle battery if there is a battery in the vehicle and if the jump starter device is coupled to the vehicle battery. If there is not battery present in the vehicle, or if the jump starter device is coupled to the vehicle circuit without connecting to the vehicle battery, the passive voltage sensor can measure a zero voltage, which indicates that there is no battery, e.g., no power source, connected to the jump starter device. When the passive voltage sensor measures a zero voltage, this can indicate many possible conditions of the vehicle circuit, such as an open circuit condition, a circuit short condition, a reverse polarity coupling to the circuit condition, or a correct polarity connection to the circuit condition. To resolve the multiple vehicle conditions, an active voltage sensor can be used.

Figures 7A, 7B:
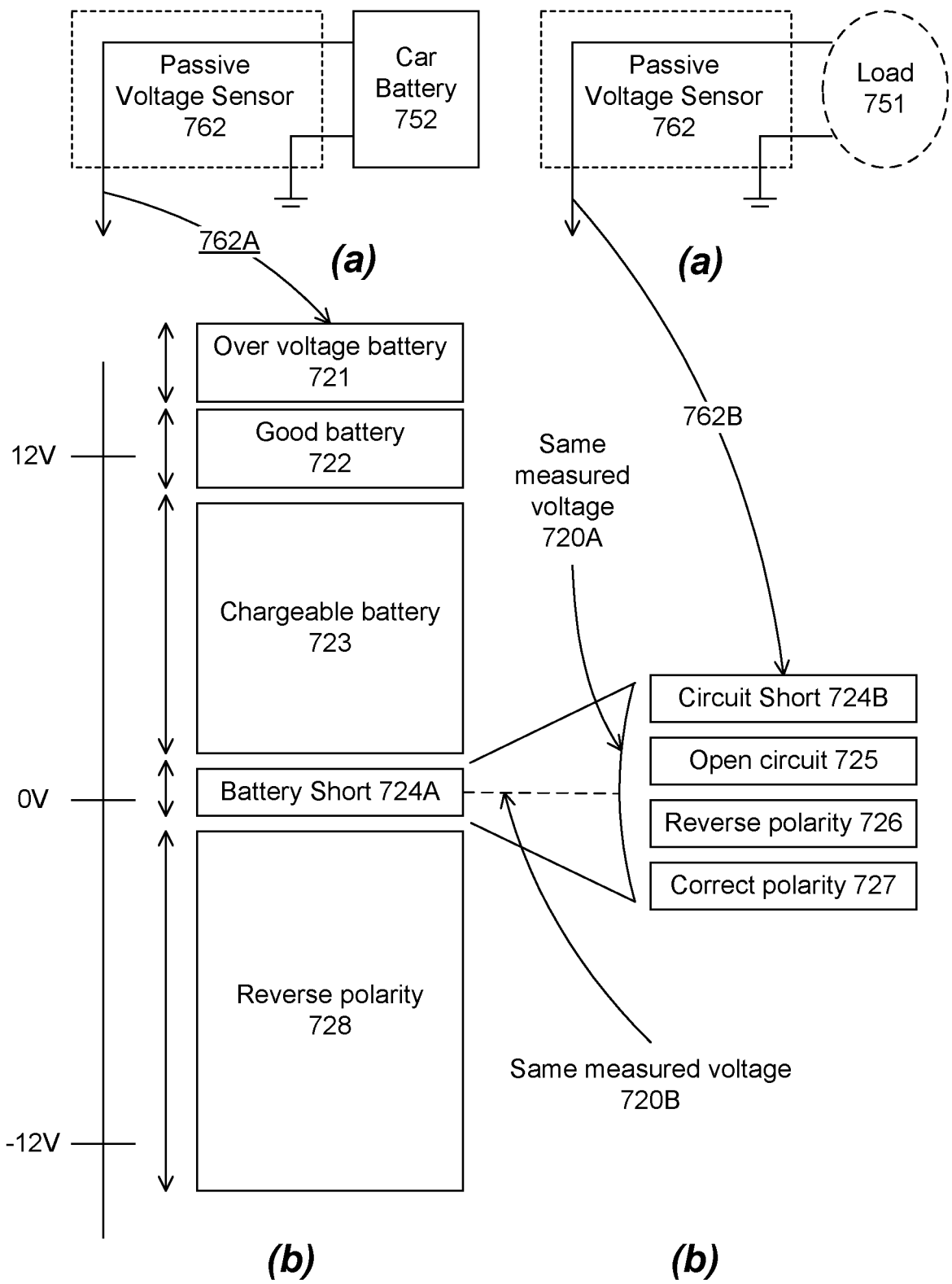
FIGS. 7A-7B illustrate an operation of a passive voltage sensor according to some embodiments.

FIGS. 7A-7B illustrate an operation of a passive voltage sensor according to some embodiments. FIGS. 7A(a) and 7A(b) show the operation of the passive voltage sensor connected to a vehicle battery. FIGS. 7B(a) and 7B(b) show the operation of the passive voltage sensor connected to a vehicle circuit, without connecting to the vehicle battery, such as in a case of no battery in the vehicle.

FIG. 7A(a) shows a configuration of a passive voltage sensor 762, which can be coupled to a vehicle battery 752. FIG. 7A(b) shows voltage ranges of measurements 762A resulting from the passive voltage sensor 762, assuming a 12V battery vehicle. A highest range of measured voltage from the passive voltage sensor is an over voltage battery range 721, which can be above around 15V or so. In this range, the vehicle battery has an abnormally high voltage, e.g., above 15V for a 12V vehicle. For this measurement range, the jump starter device can be shut down, to prevent damage to the battery or to the circuit of the jump starter device.

A second highest range of measured voltage from the passive voltage sensor is a good battery range 722, which can be around 12V or so, such as from 12V to 13.5V. In this range, the vehicle battery shows a voltage suitable for a good battery, which is typically a little higher than 12V for a 12V battery. For this measurement range, the jump starter device can be activated, to jump start the vehicle or to charge the vehicle battery.

A third highest range of measured voltage from the passive voltage sensor is a chargeable battery range 723, which can be less than around 12V or so, such as from 0V to 12V. This voltage range can be subdivided into a good chargeable battery range, which is between 10 V and 12V, and a poor chargeable battery range, which is between 0V and 10 V. In this range, the vehicle battery shows a voltage suitable for charging the battery, even though the chance for charging the good chargeable battery (e.g., greater than 10 V) is much higher than for the poor chargeable battery (e.g., less than 10V). For this measurement range, the jump starter device can be activated, to jump start the vehicle or to charge the vehicle battery.

A fourth highest range of measured voltage from the passive voltage sensor is a short battery range 724A, which can be around 0V, such as from 0V to 0.5V or from −0.5V to 0.5V. In this range, the vehicle battery can be completed deleted with the terminals shorted together, or at least having a low resistance between the two terminals of the battery. For this measurement range, the jump starter device can be shut down or deactivated, to avoid damage to the battery or to the circuit of the jump starter device.

A lowest range of measured voltage from the passive voltage sensor is a reverse polarity battery range 728, which can be less than 0V, such as from −12V to 0V. In this range, the jump starter cables are connected to the vehicle battery with a reverse polarity, e.g., the positive terminal of the jump starter device is connected to the negative terminal of the vehicle battery. For this measurement range, the jump starter device can be shut down or deactivated, to avoid damage to the battery or to the circuit of the jump starter device.

FIG. 7B(a) shows a configuration of a passive voltage sensor 762, which can be coupled to a vehicle circuit 751. FIG. 7B(b) shows voltage ranges of measurements 762B resulting from the passive voltage sensor 762. Since the vehicle circuit 751 does not have a power source, the passive voltage sensor always measures to 0V, regardless of the conditions of the vehicle circuit.

For example, the passive voltage sensor can measure a same measured voltage 720A of 0V for a vehicle circuit short condition 724B, an open circuit condition 725, such as the jumper cables not connecting to the vehicle, a reverse polarity condition 726, such as the jumper cables connected in reverse polarity to the vehicle circuit, or a correct polarity condition 727, such as the jumper cables connected in correct polarity to the vehicle circuit.

Further, the passive voltage sensor can measure a same measured voltage 720B of 0V for a battery short condition 724A, and for a circuit short condition 724B, an open circuit condition 725, a reverse polarity condition 726, and a correct polarity condition 727.

An active voltage sensor can have a power source, such as by being connected to the battery of the jump starter device. Thus, the active voltage sensor can measure the voltage of the vehicle battery, if the vehicle battery coupled to the jump starter device, and can measure the voltage of the vehicle circuit, if the jump starter device is connected to the vehicle circuit without connecting to the battery. The active voltage sensor can resolve some of the multiple vehicle conditions related to the zero voltage measurement with the passive voltage sensor.

FIGS. 8A-8B illustrate an operation of an active voltage sensor according to some embodiments. FIGS. 8A(a) and 8A(b) show the operation of the active voltage sensor connected to a vehicle battery. FIGS. 8B(a) and 8B(b) show the operation of the active voltage sensor connected to a vehicle circuit, without connecting to the vehicle battery, such as in a case of no battery in the vehicle.

FIG. 8A(a) shows a configuration of an active voltage sensor 862, which can be coupled to a vehicle battery 852. The active voltage sensor 863 can have its own power source 873A, such as by being coupled to the battery of the jump starter device.

In some embodiments, the active voltage sensor 863 can include a voltage divider having resistors R1 and R2. One end of the voltage divider is coupled to the jump starter battery 873A. The other end of the voltage divider is coupled to the output coupler, which is configured to be connected to the vehicle, e.g., to the vehicle battery 852 or to the vehicle circuit 851 without connecting the vehicle battery. Output Vout 863A/863B from the voltage divider can be provided to the controller, to assist the controller in determining the status of the vehicle, e.g., whether it is suitable to activate the jump starter device.

Using the voltage divider configuration as an active voltage sensor as shown, the output voltage of the active voltage sensor can be calculated as $$V_{out} = \frac{R2}{R1+R2}(V_{ps} + V_{car})$$

with $V_{ps}$ being the voltage at the power source 873A, and $V_{car}$ being the voltage at the vehicle, such as the voltage of the vehicle battery 852 or the voltage at the vehicle circuit 851 (which is proportional to the load resistance or the contact resistance of the vehicle). This calculation assumes that the connection of the jump starter device with the vehicle battery is a good connection, e.g., having a low contact resistance. This assumption can be satisfied by selecting appropriate values for the resistors R1 and R2, for example, to limit the current delivered to the vehicle in case of errors, such as a reverse polarity connection or a short circuited vehicle battery. The values for the resistors R1 and R2 can be less than 100 Ohm, such as between 30 and 70 Ohm.

In some embodiments, the active voltage sensor can have a current limit, e.g., the current supplied by the power supply 873A can be limited to low values, such a less than 1A, less than 199 mA, less than 10 mA, less than 1 mA, less than 0.1 mA, less than 0.01 mA, or less than 1 uA. The current limiter can be achieved by a current limiter circuit, such as a voltage divider circuit using high value resistors.

Other voltage sensor configurations can be used, such as an amplifier circuit or a voltage comparator circuit. The voltage sensor can have a current limiter circuit to prevent damage to the jump starter device or to the vehicle.

FIG. 8A(b) shows voltage ranges of $V_{out}$ measurements 863A resulting from the active voltage sensor 863, assuming a 12V battery vehicle and a 12V battery jump starter device, together with a selection of R1 equal to R2. Other configurations of R1 and R2 can be used, such as R1=2R2 or R1=3R2. The higher values of R1 can provide a larger voltage range for the correct polarity connection. For example, using R1=R2, the voltage range for the correct polarity connection is from 6V to 12V. Using R1=2R2, the voltage range for the correct polarity connection is from 4V to 12V. Using R1=3R2, the voltage range for the correct polarity connection is from 3V to 12V. In some embodiments, the voltage range for the correct polarity connection can be more important than the reverse polarity voltage range, since the correct polarity range can be divided into multiple subranges for different performance of the vehicle battery.

Other configurations of the battery of the jump starter device can be used, such a 24V battery for use in 24V battery vehicles such as some buses and trucks. In some embodiments, the jump starter battery and the vehicle battery can have a same voltage value, e.g., the jump starter device can be designed to jump start or to charge vehicles with the particular voltage specified by the jump starter device. Thus, a jump starter device can have a 6V, 12V, or 24V battery, and can be used to jump start vehicle having a 6V, 12V, or 24V battery, respectively. In some embodiments, addition circuits can be used to allow a single jump starter device to jump start different vehicles having different battery voltages. For example, a step down converter from 24V to 12V can be used to allow a 24V jump starter device to jump start a 12V vehicle.

The measured voltage Vout from the active voltage sensor 863 can be classified into multiple voltage ranges, similar to the voltage ranges of the passive voltage sensor discussed above. However, with the boosting of the Vps, e.g., the voltage from the battery of the jump starter device, the measured voltage Vout can be mapped to higher values.

A highest range of measured voltage from the active voltage sensor is an over voltage battery range 871, which can be above around 14V or so. In this range, the vehicle battery has an abnormally high voltage, e.g., above 15V for a 12V vehicle. Since the battery of the jump starter device is about 12V, the measured Vout can be a little less than the vehicle battery voltage. For this measurement range, the jump starter device can be shut down, to prevent damage to the battery or to the circuit of the jump starter device.

A second highest range of measured voltage from the active voltage sensor is a good battery range 872, which can be around 12V or so, such as from 12V to 13.5V. Since the battery of the jump starter device is about 12V, the measured Vout can be about the same as the vehicle battery voltage. In this range, the vehicle battery shows a voltage suitable for a good battery, which is typically a little higher than 12V for a 12V battery. For this measurement range, the jump starter device can be activated, to jump start the vehicle or to charge the vehicle battery.

A third highest range of measured voltage from the active voltage sensor is a chargeable battery range 873, which can be less than around 12V or so, such as from 6V to 12V. Since the battery of the jump starter device is about 12V, the measured Vout can be about 6V when the vehicle battery voltage is 0V. For this measurement range, the jump starter device can be activated, to jump start the vehicle or to charge the vehicle battery. Similar to the passive voltage sensor measurements, this range can be subdivided into a good chargeable range and a poor chargeable range.

A fourth highest range of measured voltage from the active voltage sensor is a short battery range 874A, or a zero equivalent value, which can be around 6V, such as from 5.5V to 6.5V. The zero equivalent value 874A can be a value of the voltage measured by the active voltage sensor when the vehicle terminals are connected to a shorted battery. The zero equivalent value 874A can be a value of the voltage measured by the active voltage sensor corresponded to a 0V vehicle battery, e.g., a voltage value mapped from 0V from the passive voltage sensor.

Since the battery of the jump starter device is about 12V, the measured Vout can be about 6V when the vehicle battery voltage is 0V. In this range, the vehicle battery is completed deleted with the terminals shorted together, or at least having a low resistance between the two terminals of the battery. For this measurement range, the jump starter device can be shut down or deactivated, to avoid damage to the battery or to the circuit of the jump starter device.

A lowest range of measured voltage from the active voltage sensor is a reverse polarity battery range 828, which can be less than 6V, such as from 0V to 6V. Since the battery of the jump starter device is about 12V, the measured Vout can be less than about 6V when the vehicle battery voltage is negative, e.g., between 0V and −12V. In this range, the jump starter cables are connected to the vehicle battery with a reverse polarity, e.g., the positive terminal of the jump starter device is connected to the negative terminal of the vehicle battery. For this measurement range, the jump starter device can be shut down or deactivated, to avoid damage to the battery or to the circuit of the jump starter device.

Thus, the use of an active voltage sensor can map the measurements of the vehicle battery voltage ranges from −12V to 12V to from 0V to 12V. The higher detection voltage of 0V-12V can facilitate the use of TTL logic in the microprocessor-controlled jump starter device.

FIG. 8B(a) shows a configuration of a same active voltage sensor 863 coupled to a vehicle circuit 851. The active voltage sensor 863 can have its own power source 873A, such as by being coupled to the battery of the jump starter device.

Using the voltage divider configuration as an active voltage sensor as shown, the output voltage of the active voltage sensor can be calculated as $$V_{out} = \frac{R2 + R_{circuit}}{R1 + R2 + R_{circuit}} V_{ps}$$

with $V_{ps}$ being the voltage at the power source 873A, and $R_{circuit}$ being the resistance at the vehicle, such as the load resistance of the vehicle circuit 851 and/or the contact resistance of the connection to the vehicle circuit.

FIG. 8B(b) shows voltage ranges of measurements 863B resulting from the active voltage sensor 863. Since the vehicle circuit 851 does not have a power source, the active voltage sensor measures the resistance of the vehicle circuit.

For example, the active voltage sensor can measure a same measured voltage 870A of 6V for a vehicle circuit short condition 874B and a reverse polarity condition 876, such as the jumper cables connected in reverse polarity to the vehicle circuit.

In some embodiments, the resistance of the vehicle circuit can be about zero in the reverse polarity connection 876 without the vehicle battery, due to the flyback diodes in parallel with the starter motor or the alternator motor. Similarly, the resistance of the vehicle circuit can be about zero in the case of a short circuit 874B in the vehicle circuit.

The active voltage sensor can measure a same measured voltage 870B of 12V for an open circuit condition 875, such as the jumper cables not connecting to the vehicle. In some embodiments, the resistance of the vehicle circuit can be about infinite in the open circuit connection 875 without the vehicle battery.

The active voltage sensor can measure a same measured voltage 870B of between 7V and 10 V for a correct polarity condition 877, such as the jumper cables connected in correct polarity to the vehicle circuit. In some embodiments, the resistance of the vehicle circuit can be non zero in the correct polarity connection 877 without the vehicle battery. The vehicle circuit resistance can vary for different vehicle, resulting in different measured voltages from the active voltage sensor, which can be between 6V and 12V, such as between 7V and 11V.

As discussed above, the value of 6V corresponded to 0V vehicle battery condition is based on the selection of R1 and R2, e.g., R1=R2, in the voltage divider circuit of the active voltage sensor. The voltage divider circuit can be chosen so that the active and passive voltage sensor can share a same circuit, with the difference being the connection with the power source 873A. Other voltage values that correspond to the 0V vehicle battery condition can be obtained, by selecting proper values for R1 and R2.

As shown, the active voltage sensor can measure a same measured voltage 870B of 12V, 7V to 10V, or 0V for an open circuit condition 875, for a correct polarity condition 877, or for either a battery or circuit short condition 874A or 874B or a reverse polarity condition 876, respectively.

FIGS. 9A-9D illustrate flow charts for forming a voltage detecting circuit according to some embodiments. FIG. 9A shows a voltage detection related to the jump starter battery and the vehicle battery. Operation 900 forms a voltage detecting circuit, with the voltage detecting circuit coupled to a vehicle, and also coupled to a battery of a jump starter device. The voltage detecting circuit is configured to provide a voltage related to the jumper battery voltage and the voltage across the vehicle.

FIG. 9B shows detecting distinct voltages for cases with the vehicle battery not connected to the jump starter device. Operation 920 forms a voltage detecting circuit, with the voltage detecting circuit coupled to a vehicle, and also coupled to a battery of a jump starter device. The voltage detecting circuit is configured to provide distinct voltages for an open connection, for a no battery and correct polarity connection, for a no battery and reverse polarity connection of the vehicle.

FIG. 9C shows detecting distinct voltages for cases with the vehicle battery not connected and connected but shorted battery. Operation 940 forms a voltage detecting circuit, with the voltage detecting circuit coupled to a vehicle, and also coupled to a battery of a jump starter device. The voltage detecting circuit is configured to provide distinct voltages for no battery and for a shorted battery in the vehicle FIG. 9D shows detecting distinct positive voltages for cases with correct and reverse polarity battery connection. Operation 960 forms a voltage detecting circuit, with the voltage detecting circuit coupled to a vehicle, and also coupled to a battery of a jump starter device. The voltage detecting circuit is configured to provide positive voltages for correct polarity and reverse polarity connection to a battery in the vehicle In some embodiments, the load sensor can include a combination 978 of an active voltage sensor and a passive voltage sensor, coupled through a controllable switching circuit, such as a controllable switch. For example, the load sensor can include a passive voltage sensor, coupled to a switch connecting to the battery of the jump starter device. When the switch is deactivated, the load sensor behaves like a passive voltage sensor. When the switch is activated, the load sensor behaves like an active voltage sensor. In some embodiments, the passive voltage sensor can include a voltage divider circuit 971. Other passive voltage sensor configurations can also be used.

In some embodiments, the switching between passive and active sensors can be controlled by a controller. Alternatively, the switching between passive and active sensors can be automatically performed by an oscillator, meaning for every cycle of the oscillator, the passive sensor can be activated, followed by the active sensor.

Figure 10A:
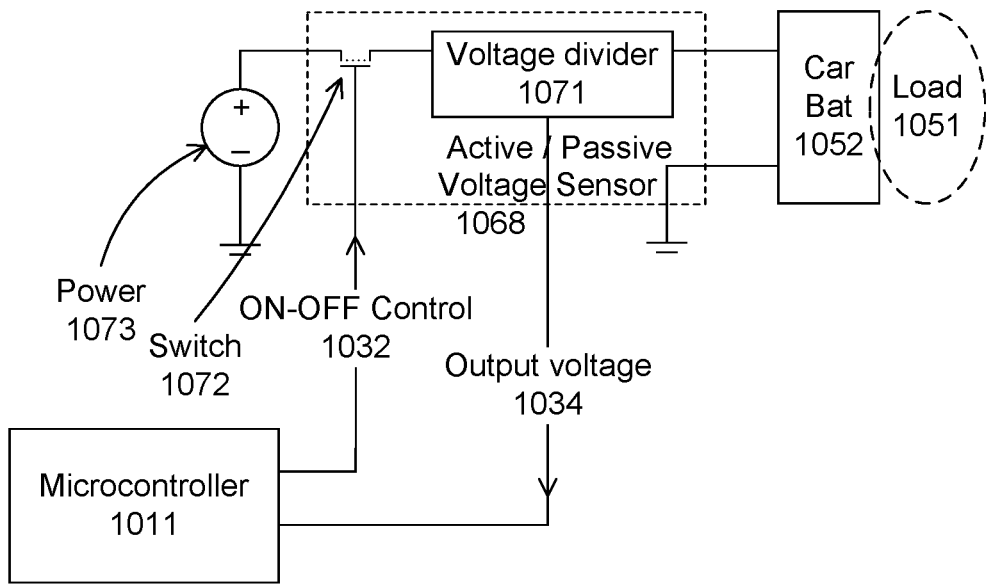
FIGS. 10A-10B illustrate configurations and controls of a sensor combination according to some embodiments.
Figure 10B:
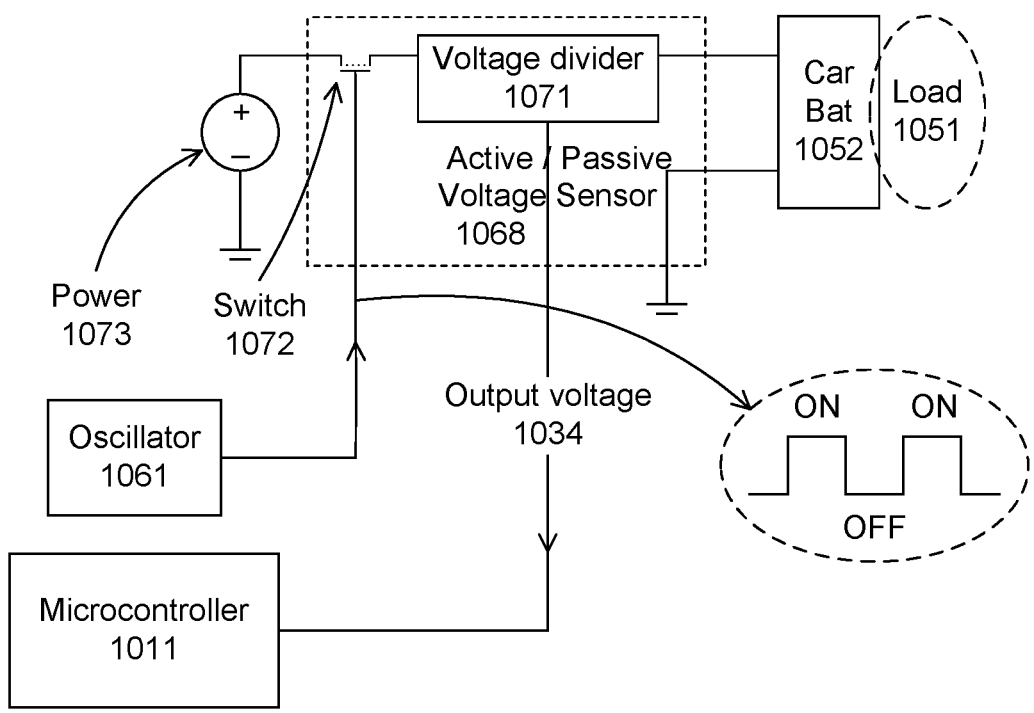

FIGS. 10A-10B illustrate configurations and controls of a sensor combination according to some embodiments. An active/passive voltage sensor 1078 can include a voltage divider 1071 configured to be coupled to a vehicle, such as to a vehicle battery 1052 or to a vehicle circuit 1051. The voltage divider 1071 can also be coupled to a switch 1072, which is coupled to a power source 1073, such as to the battery of the jump starter device. The active/passive voltage sensor 1078 can provide an output voltage 1034, which can by supplied as an input signal to a controller, such as a microcontroller 1011.

In FIG. 10A, the controller 1011 can be configured to generate an output signal 1032 to control the switch 1072, such as an ON/OFF control. For example, the controller 1011 can generate an ON control signal to activate the switch 1072, making the active/passive voltage sensor 1078 becoming an active voltage sensor. The controller 1011 can generate an OFF control signal to deactivate the switch 1072, making the active/passive voltage sensor 1078 becoming a passive voltage sensor.

In FIG. 10B, the switch 1072 can be controlled by an oscillator 1061, which can automatically turning on and then turning off (or vice versa) the switch to alternate the active/passive voltage sensor 1078 between an active voltage sensor and a passive voltage sensor.

The passive voltage sensor, e.g., the active/passive voltage sensor 1078 when the switch 1072 is off, can measure a voltage from the vehicle, such as measuring the vehicle battery voltage when the vehicle battery is connected, or measuring a zero voltage when the vehicle battery is not connected. The active voltage sensor, e.g., the active/passive voltage sensor 1078 when the switch 1072 is on, can measure a voltage from the vehicle, such as measuring the vehicle battery voltage when the vehicle battery is connected, or measuring another voltage related to the vehicle circuit load resistance when the vehicle battery is not connected.

The oscillation period can be larger, such as much larger, than the clock period of the controller 1011, as to provide adequate time for the controller to perform measurements. Thus, the controller can have a sequence of measurements with an active voltage measurement followed by a passive voltage measurement. The controller can process the sequence of measurements to obtain measurements from the passive and active voltage sensors.

FIGS. 11A-11C illustrate flow charts for forming a sensor assembly according to some embodiments. In FIG. 11A, operation 1100 forms a sensor assembly configured to measure voltages of a battery of a vehicle if the vehicle battery is connected with the jumper system. The sensor assembly is also configured to measure a load of the vehicle if the vehicle battery is not connected with the jumper system.

In FIG. 11B, operation 1120 forms a sensor assembly comprising a switch connecting two circuits, with the switch configured to be toggled between an OFF state and an ON state. In the OFF state, the sensor assembly is configured to measure voltages of a battery of a vehicle. In the OFF state, the sensor assembly is configured to measure a load of the vehicle.

In FIG. 11C, operation 1140 forms a sensor assembly comprising a switch coupled to a voltage divider circuit, with an end of the divider circuit configured to be coupled to a battery of a vehicle, and with another end of the switch coupled to a battery of a jumper system. The voltage divider circuit can include an output signal, with the output signal configured to provide a voltage of the vehicle battery when the switch is off and configured to provide a load of the vehicle when the switch is on. The switch can be coupled to an oscillator circuit for automatically toggle between on and off, or the switch can be coupled to a controller for the controller to turn the switch on or off.

In some embodiments, the combination of a passive sensor and an active sensor, e.g., an active/passive voltage sensor having a switch, can be used to distinguish between ambiguities of vehicle conditions caused by using only one type of voltage sensor as discussed above.

Figures 12A, 12B:
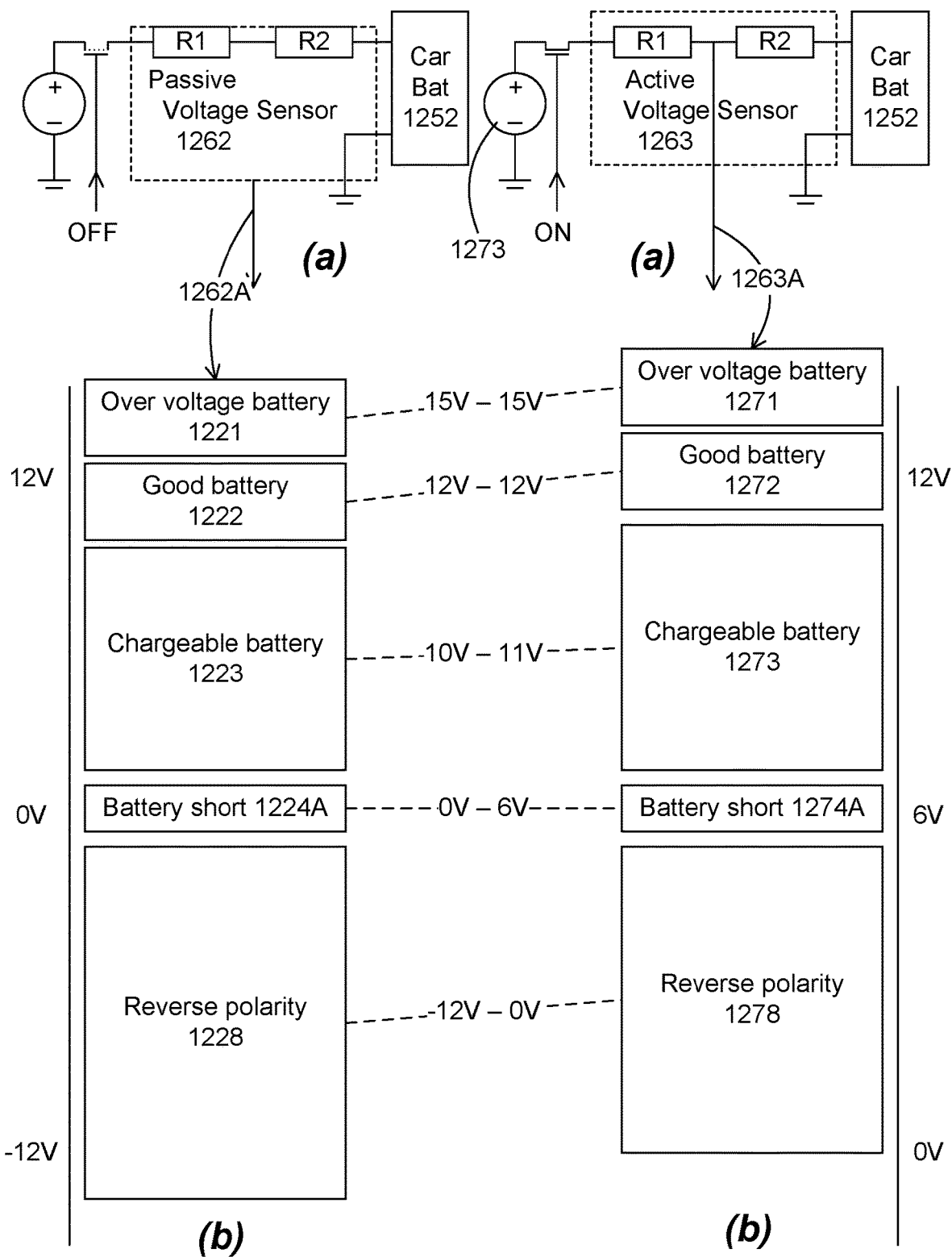
FIGS. 12A-12B illustrate operations to use an active/passive voltage sensor for vehicle having a battery connected according to some embodiments.

FIGS. 12A-12B illustrate operations to use an active/passive voltage sensor for vehicle having a battery connected according to some embodiments. In FIGS. 12A(a) and 12A(b), the switch coupling the active/passive voltage sensor to a power source 1273 is off, making the active/passive voltage sensor becoming a passive voltage sensor 1262. The power source 1273 can be the battery of the jump starter device.

FIG. 12A(a) shows a configuration of the active/passive voltage sensor having the connection to a power source deactivated, e.g., turning off. The active/passive voltage sensor thus becomes a passive voltage sensor 1262, which can be coupled to the vehicle battery 1252 to generate an output voltage 1262A.

FIG. 12A(b) shows voltage ranges of the measurements of the passive voltage sensor 1262, which can include an over voltage of 15V (1221), a good battery of 12V (1222), a chargeable battery of 0V-12V (1223), a battery short of 0V (1224A), and a reverse polarity of −12V-0V (1228).

In FIGS. 12B(a) and 12B(b), the switch coupling the active/passive voltage sensor to a power source is on, making the active/passive voltage sensor becoming an active voltage sensor 1263.

FIG. 12B(a) shows a configuration of the active/passive voltage sensor having the connection to a power source 1273 activated, e.g., turning on. The active/passive voltage sensor thus becomes an active voltage sensor 1263, which can be coupled to the vehicle battery 1252 to generate an output voltage 1263A.

FIG. 12B(b) shows voltage ranges of the measurements of the active voltage sensor 1263, which can include an over voltage of 15V (1271), a good battery of 12V (1272), a chargeable battery of 6V-12V (1273), a battery short of 6V (1274A), and a reverse polarity of 0V-6V (1278).

Using a combination of active and passive voltage sensors, e.g., using the active/passive voltage sensor with the switch turning off then on, two voltage measurements can be obtained, which can provide a status of the vehicle battery, when the jump starter device is connected to the vehicle. The measured voltages for a passive voltage sensor can be in an over voltage range (such as above 15V), high voltage range (such as about 12V), medium voltage range (such as between 0V and 12V), shorted voltage range (such as about 0V), and reverse voltage range (such as <0V, e.g., between −12V and 0V). The measured voltages for an active voltage sensor can also be in an over voltage range (such as above 12V), high voltage range (such as about 12V), medium voltage range (such as between 6V and 12V), shorted voltage range (such as about 6V), and reverse voltage range (such as <6V, e.g., between 0V and 6V).

For example, the measurements can include an over voltage of the vehicle battery (1221 and 1271) with measurements of over voltage and over voltage, e.g., 15V and 15V, a good battery of the vehicle battery (1222 and 1272) with measurements of high voltage and high voltage, e.g., 12V and 12V, a chargeable battery of the vehicle battery (1223 and (1273) with measurements of medium voltage and medium voltage, e.g., ~10V and ~11V, a battery short of the vehicle battery (1224A and 1274A) with measurements of shorted voltage and shorted voltage, e.g., 0V and 6V, and a reverse polarity of the vehicle battery (1228 and 1278) with measurements of reverse voltage and reverse voltage, e.g., 12V and 0V. As seen, the passive and active voltage sensors can sense voltages in similar ranges. Thus, in some embodiments, only measurements from one sensor can be used, with the measurements from the other sensor used for confirmation.

When the jump starter is connected to the battery of the vehicle, there can be no ambiguity, e.g., there can be no case in which a measured voltage can lead to more than one vehicle condition. Further, the battery conditions are the same, e.g., the battery conditions can be determined from using just one of the two passive and active voltage sensors.

However, the active voltage sensor can map the voltages measured by the passive voltage sensor to different ranges. For example, the voltages measured by the passive voltage sensor can range from −12V to 12V, which indicate different conditions of the vehicle battery and different connection of the jump starter device with the vehicle. The negative measurements, e.g., from −12V to 0V, can require additional or different circuits, for example, using a controller capable of receiving negative voltages, or using a converter to convert the negative voltages to positive voltages.

The active voltage sensor can map the negative and positive voltage ranges measured by the passive voltage sensor to a positive range, such as from 0V to 12V, with each subrange corresponded to a battery or connectivity condition. Thus, the circuits using an active voltage sensor can be simpler. In the case of having both passive and active voltage sensors, only the measurements from the active voltage sensor can be considered, to avoid using the negative voltage range. For example, the controller can evaluate the positive voltage range from both passive and active voltage sensors and ignore the negative voltage range measured by the passive voltage sensor. Alternatively, the controller can assess the positive voltage range from the active voltage sensors, and then using the positive voltage range measured by the passive voltage sensor as a confirmation for the data obtained from the active voltage sensor.

As shown, the active and passive voltage sensors share the voltage measurement circuit, e.g., sharing the voltage divider circuit, with a switch to toggle the shared circuit between a passive sensor and an active sensor. This share configuration can be considered as a combination of passive and active sensors, e.g., forming a circuit that can function as passive or active sensor by controlling a switch. Alternatively, separate passive sensor and active sensor can be used, e.g., there are two distinct sensor circuits with each circuit configured to measure the voltages of the vehicle. In either case, the controller can obtain 2 voltages measured from the vehicle: one from the passive sensor and one from the active sensor.

Figures 13A, 13B:
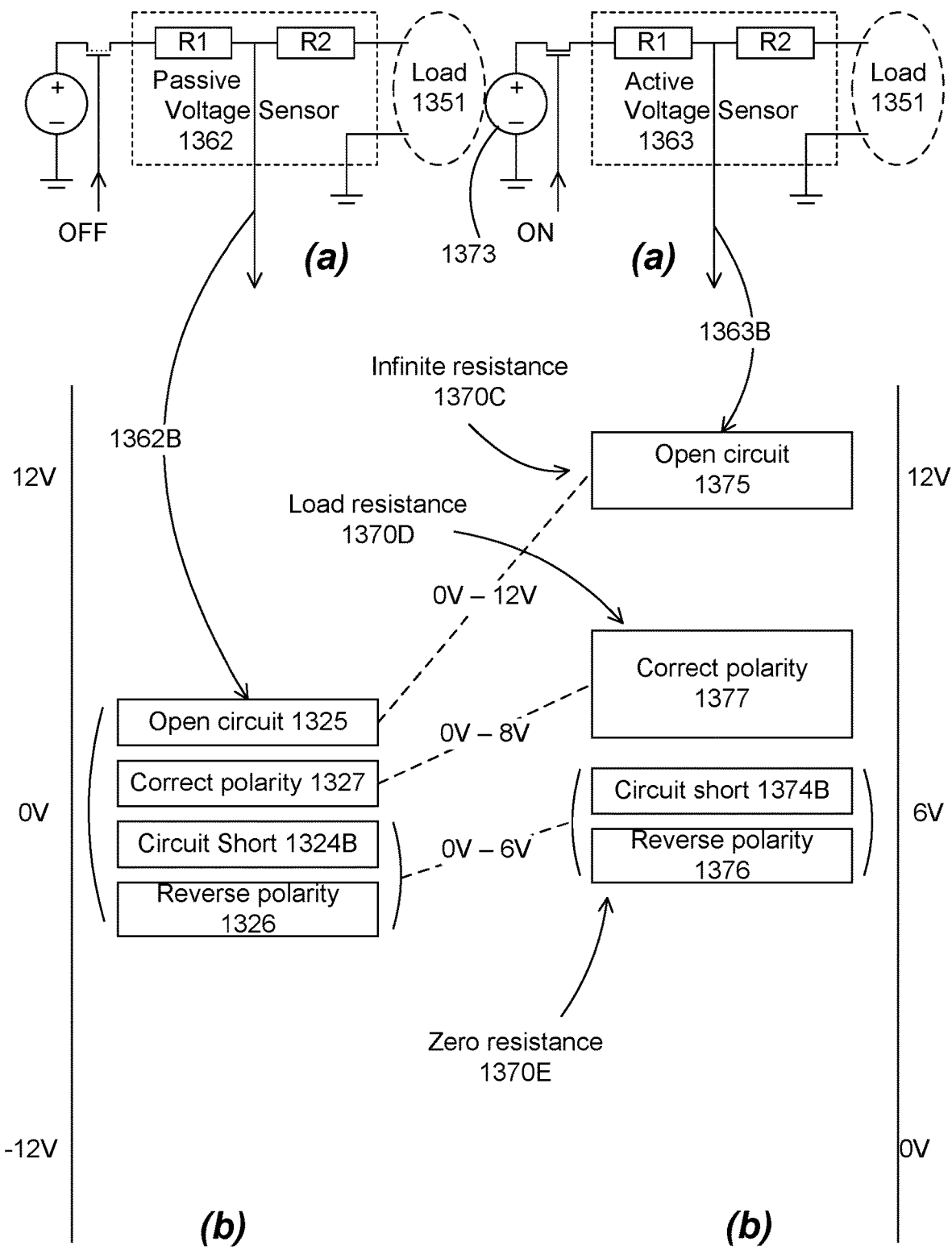
FIGS. 13A-13B illustrate operations to use an active/passive voltage sensor for vehicle having a battery not-connected according to some embodiments.

FIGS. 13A-13B illustrate operations to use an active/passive voltage sensor for vehicle having a battery not-connected according to some embodiments. In FIGS. 13A(a) and 13A(b), the switch coupling the active/passive voltage sensor to a power source 1373 is off, making the active/passive voltage sensor becoming a passive voltage sensor 1362. The power source 1373 can be the battery of the jump starter device.

FIG. 13A(a) shows a configuration of the active/passive voltage sensor having the connection to a power source deactivated, e.g., turning off. The active/passive voltage sensor thus becomes a passive voltage sensor 1362, which can be coupled to the vehicle circuit 1351 to generate an output voltage 1362B.

FIG. 13A(b) shows a same voltage range of the measurements of the passive voltage sensor 1362, which can include an open circuit of 0V (1325), a correct polarity connection of 0V (1327), a circuit short of 0V (1324B), and a reverse polarity connection of 0V (1326).

In FIGS. 13B(a) and 13B(b), the switch coupling the active/passive voltage sensor to a power source 1373 is on, making the active/passive voltage sensor becoming an active voltage sensor 1363.

FIG. 13B(a) shows a configuration of the active/passive voltage sensor having the connection to a power source activated, e.g., turning on. The active/passive voltage sensor thus becomes an active voltage sensor 1363, which can be coupled to the vehicle circuit 1351 to generate an output voltage 1363A.

FIG. 13B(b) shows different voltage ranges of the measurements of the active voltage sensor 1363, which can include an open circuit of 12V (1375) which indicates an infinite load or contact resistance 1370C, a correct polarity connection of about 8V (1377) which indicates a finite load resistance 1370D, a circuit short of 6V (1374B), and a reverse polarity connection of 6V (1376) which indicates a zero load resistance 1370E.

Using a combination of active and passive voltage sensors, e.g., using the active/passive voltage sensor with the switch turning off then on, two voltage measurements can be obtained, which can provide a status of the vehicle circuit, when the jump starter device is connected to the vehicle. The measured voltages for a passive voltage sensor can be in a shorted voltage range (such as about 0V). The measured voltages for an active voltage sensor can be in a high voltage range (such as about 12V), medium voltage range (such as between 6V and 12V), and shorted voltage range (such as about 6V). In general, the voltage ranges for the vehicle circuit without a vehicle battery can be a subset of the voltage ranges for the vehicle with a vehicle battery.

For example, the measurements can include an open circuit of the vehicle circuit (1325 and 1375) with measurements of shorted voltage and high voltage, e.g., 0V and 12V, a correct polarity connection of the vehicle circuit (1327 and 1377) with measurements of shorted voltage and medium voltage, e.g., 0V and ~8V, and a circuit short or reverse polarity of the vehicle circuit (1324B and 1374B/1326 and 1376) with measurements of shorted voltage and shorted voltage, e.g., 0V and 6V.

FIGS. 14A-14C illustrate flow charts for forming a jump starter device according to some embodiments. In FIG. 14A, a jump starter device can include a sensor assembly configured to simultaneously or sequentially measuring voltages of a vehicle using or not using the jump starter battery. Operation 1400 forms a jumper system, with the jumper system having a battery coupled to a switch controlled by a controller based on inputs from a sensor assembly configured to monitor conditions of a vehicle connected to the jumper system. The sensor assembly is configured to measure a first voltage of the vehicle without using the jumper battery and a second voltage of the vehicle using the jumper battery.

In FIG. 14B, a jump starter device can include a sensor assembly configured to simultaneously or sequentially measuring voltages of a vehicle, with or without the jump starter battery. Operation 1420 forms a jumper system comprising a sensor assembly. The sensor assembly is configured to measure a first voltage with the sensor assembly not coupled to the jumper battery and a second voltage with the sensor assembly coupled to the jumper battery.

In FIG. 14C, a jump starter device can include a sensor assembly configured to simultaneously or sequentially measuring voltages of a vehicle to obtain status of the vehicle through different measured voltages or voltage ranges. Operation 1440 forms a jumper system having a sensor assembly to measure voltages of a vehicle. The voltage values of V1>15V or V2>15V indicate an over voltage condition. Only one over voltage measurement is sufficient. If V1 is over voltage, e.g., V1>15V, the vehicle battery is over voltage, such a when a 12V jump starter device connects to a 24V vehicle. If V2 is over voltage, e.g., V2>15V, the jump starter battery is over voltage, such a when a 24V jump starter device connects to a 12V vehicle.

The voltage values of V1~12V and V2~12V indicate a jumpable condition. The voltage values of 12V>V1>0V and above 12V>V2>6V indicate a jumpable condition. The voltage values of V1~0V and V2~6V indicate a vehicle battery shortage condition. The voltage values of V1<0V and V2<6V indicate a reverse polarity condition. The voltage values of V1~0V and V2~12V indicate an open connection condition. The voltage values of V1~0V and 10 V>V2>7V indicate a correct polarity condition. The voltage values of V1~0V and V2~6V indicate a reverse polarity condition.

The specific values for V1 and V2 in the operation are obtained for a 12V jump starter battery, a 12V vehicle battery, and a voltage divider circuit as a share circuit for the passive and active voltage sensors with equal resistors (e.g., R1=R2).

In some embodiments, the over voltage condition is characterized by the measured voltages from the passive and active voltage sensors being in the over voltage range. The over voltage condition is one of non-jumpable conditions, e.g., the jump starter device, when detecting the over voltage condition, is automatically shut down to prevent possible damage to the jump starter device or to the vehicle. After being automatically shut down, the jump starter device can be manual activated, e.g., overriding the over voltage condition shut down to activate or operating the jump starter device, if an operator decides to manually override, for example, because of a possible error in the jump starter device assessment, or because of special circumstances that the automatic shut down is not appropriate.

The passive voltage sensor measures voltages from the vehicle battery, so an over voltage measurement from the passive voltage sensor indicates an over voltage condition for the vehicle battery. The active voltage sensor measures voltages from both jump starter battery and vehicle battery, so an over voltage measurement from the active voltage sensor indicates an over voltage condition for either the jump starter battery, the vehicle battery, or for both batteries.

For the passive and active voltage sensors, the over voltage range is the range of voltages above a voltage value that the jump starter battery and the vehicle battery can be. For example, a 12V lead acid battery for a vehicle can have an open voltage of less than about 14.7V. Thus, an over voltage range for a 12V battery can be any voltage above 15V.

The over voltage range for the active voltage sensor, for practical purpose, can be considered as the same as the over voltage range for the passive voltage sensor, even though there can be some differences. For example, when a 12V jump starter device is connected to a 24V vehicle, the passive voltage sensor can measure 24V, while an active voltage sensor can measure 18V, assuming a R1=R2 voltage divider circuit. While the two voltage values are different, both values can indicate that the measured voltages are in the over voltage range, which is above 15V for a 12V jump starter device.

Similarly, when a 24V jump starter device is connected to a 12V vehicle, the passive voltage sensor can measure 12V, while an active voltage sensor can measure 18V, assuming a R1=R2 voltage divider circuit. While the two voltage values are different, the data can indicate that at least one of the measured voltages is in the over voltage range, which is above 15V for a 12V vehicle.

Thus, when an over voltage is detected, either by the passive or by the active voltage sensor, the jump starter device is shut down, e.g., the jump starter battery is disconnected from the vehicle. The jump starter device can be restarted after an operator corrects the situation, such as changing the jump starter device to a setting that permits a higher battery voltage (if the vehicle battery is over voltage) or a lower battery voltage (if the jump starter battery is over voltage).

The jumpable condition is characterized by the measured voltages from the passive and active voltage sensors being in the high and medium voltage ranges. The high voltage range is the range of voltages around a nominal voltage value of the jump starter battery or the vehicle battery. For example, a fully charged or a good 12V lead acid battery for a vehicle can have a voltage of less than about 14.7V, such as between 12V and 14.7V. Thus, a high voltage range for a 12V battery can be any voltage above 12V and less than 15V.

The medium voltage range is the range of voltages for a discharged battery, e.g., a fully or partially discharged battery, which can be less than the nominal voltage value of the jump starter battery or the vehicle battery. For example, a 12V lead acid battery for a vehicle can have a voltage of less than about 12V, such as between 0V and 12V. Thus, a medium voltage range for a 12V battery can be any voltage above 0V and less than 12V.

In some embodiments, the medium voltage range can be subdivided into high medium and low medium voltage ranges. A high medium voltage range for a 12V battery can be between 10 V and 12V. This voltage range can indicate a good chargeable battery, e.g., the battery is discharged, but can be chargeable back to the nominal voltage value of 12V. A low medium voltage range for a 12V battery can be between 0V and 10 V. This voltage range can indicate a poorly chargeable battery, e.g., the battery can be discharged too much and can have difficulty in recharging back to the nominal voltage value of 12V. However, in term of jump starting a vehicle, a battery in both the high medium and low medium voltage ranges can be jump started by the jump starter device.

The passive voltage sensor measures voltages from the vehicle battery, so a high or medium voltage measurement from the passive voltage sensor indicates a high or medium voltage condition for the vehicle battery. Thus, measurements from the passive voltage sensor can be used as a primary source to determine voltages of the vehicle battery. For example, when a passive voltage sensor returns a high voltage (such as 14V), this indicates that the vehicle battery can be fully charged. In this case, if the active voltage sensor also returns a high voltage (such as 14V), this indicates that the jump starter battery is also fully charged. If the active voltage sensor returns a medium voltage (such as 11V), this indicates that the jump starter battery is partially or fully depleted. This condition rarely happens, since the jump starter device can have an indicator to indicate the condition of the jump starter battery.

When a passive voltage sensor returns a medium voltage (such as 11V), this indicates that the vehicle battery can be depleted, either partially depleted or fully depleted depending on the values of the measurements. In this case, if the active voltage sensor returns a high voltage (such as 14V), this indicates that the jump starter battery is fully charged. This is a suitable condition for the jump starter device to jump start or to charge the vehicle battery. If the active voltage sensor also returns a medium voltage (such as 11V), this indicates that the jump starter battery is also partially or fully depleted. This condition rarely happens, since the jump starter device can have an indicator to indicate the condition of the jump starter battery.

The active voltage sensor measures voltages from both jump starter battery and vehicle battery, so a high or medium voltage measurement from the active voltage sensor indicates a high or medium voltage condition for either the jump starter battery, the vehicle battery, or for both batteries. Thus, measurements from the active voltage sensor can be used as a secondary source, for example, to verify the measurements from the passive voltage sensor, or to resolve ambiguities resulted from the measurements from the passive voltage sensor.

For example, when an active voltage sensor returns a high voltage (such as 14V), this measurement indicates more than one possible situation. If the passive voltage sensor also returns a high voltage (such as 14V), this indicates that both batteries can be fully charged. If the passive voltage sensor also returns a zero voltage (e.g., 0V), this indicates that the 14V is from the jump starter battery. The connection to the vehicle can be open, e.g., there is no contribution from the vehicle battery.

When an active voltage sensor returns a medium voltage (such as 10V), this measurement also indicates more than one possible situation. If the passive voltage sensor also returns a medium voltage (such as 10V), this indicates that both batteries can be partially depleted. If the passive voltage sensor also returns a zero voltage (e.g., 0V), this indicates that the 10V is from the jump starter battery. Since the jump starter battery is likely to be fully charged, this indicates that the vehicle can contribute as a resistive load. Thus, there is no battery in the vehicle, and the jump starter device is properly connected to the vehicle circuit.

Thus, jumpable conditions include when high or medium voltages are detected in both the passive and the active voltage sensors. Jumpable conditions also include when a high or medium voltage is detected in the passive voltage sensor. Further, jumpable conditions include when a medium voltage is detected in the active voltage sensor with a zero voltage (or shorted voltage condition) detected in the passive voltage sensor.

When a high voltage is detected in the active voltage sensor, with a zero voltage (or shorted voltage condition) detected in the passive voltage sensor, this indicates an open connection problem, which is not a jumpable condition.

When a jumpable condition is detected, the jump starter device can be turned on, e.g., the controller can issue a command for the switch to be connected, so that the jump starter battery can be used to jump start or to charge the battery of the vehicle.

The shorted voltage condition is characterized by the measured voltages from the passive voltage sensor being around zero, e.g., a zero range of voltage values slightly different from zero. The voltages in the zero voltage condition can be zero voltage, or can be from −0.5V to 0.5V, which can be accounted for the fluctuation and error in the voltage measurements.

The passive voltage sensor measures voltages from the vehicle battery, so a shorted voltage measurement from the passive voltage sensor (e.g., a 0V measurement) indicates a shorted voltage condition for the vehicle battery, if the jump starter device is connected to the vehicle battery. The 0V measurement can also indicate an open connection, with the jump starter device connected or not connected to the vehicle battery. The 0V measurement can also indicate an absence of a vehicle battery. Thus, there can be multiple possible conditions when the passive voltage sensor provides a measurement falling in this shorted voltage range.

The shorted voltage condition is also characterized by the measured voltages from the active voltage sensor being around a value mapped from the zero battery voltage. For example, for a voltage divider circuit with $R1=R2$ as discussed above, the voltage measured by the active voltage sensor in the shorted voltage condition is half of the voltage of jump starter battery. In general, for a different resistor values in the voltage divider circuit, the shorted voltage measured by the active voltage sensor is proportional to the ratio of the resistor closer to the vehicle battery, e.g., proportional to $R2/(R1+R2)$. Using a 12V jump starter battery and a $R1=R2$ voltage divider, the voltages for the shorted voltage range measured by the active voltage sensor can be 6V, or can be from 5.5V to 6.5V, with the 0.5V being used to account for the fluctuation and error in the voltage measurements.

The active voltage sensor measures voltages from both jump starter battery and vehicle battery, so a shorted voltage measurement from the active voltage sensor indicates a shorted voltage condition for either the jump starter battery, the vehicle battery, or for both batteries.

For the active voltage sensor, this shorted voltage range can indicate a short condition, either a battery short or a circuit short. For example, when there is a connected battery, this shorted voltage condition from the active voltage sensor indicates a shorted battery. When there is no connected battery, this shorted voltage condition from the active voltage sensor indicates a shorted circuit in the vehicle circuit. The shorted circuit can be caused by a short in the vehicle circuit. In some embodiments, the shorted circuit can be caused by the jump starter device connecting to the vehicle circuit in a reverse polarity connection. A motor of the vehicle, such the starter motor, can have a flyback diode connected in reverse polarity with the motor induction coil, to dissipate the EMF voltage. As such, when the jump starter device connects in reverse with the vehicle circuit, the flyback diode can be seen as a short circuit.

The reverse voltage condition is characterized by the measured voltages from the passive voltage sensor being negative, e.g., less than 0V or less than around −0.5V to account for measurement errors. The voltages in the reverse voltage condition can be from 0V to −12V, from 0V to −15V, or from −0.5V to −12V, from −0.5V to −15V.

The passive voltage sensor measures voltages from the vehicle battery, so a negative voltage measurement from the passive voltage sensor indicates a negative voltage condition, e.g., the polarity is reverse.

The negative voltage condition is also characterized by the measured voltages from the active voltage sensor being less than a value mapped from the zero battery voltage. For example, for a voltage divider circuit with $R1=R2$ as discussed above, the voltage measured by the active voltage sensor in the negative voltage condition is less than half of the voltage of jump starter battery. In general, for a different resistor values in the voltage divider circuit, the negative voltage measured by the active voltage sensor is proportional to the ratio of the resistor closer to the vehicle battery, e.g., proportional to $R2/(R1+R2)$. Using a 12V jump starter battery and a $R1=R2$ voltage divider, the voltages for the negative voltage range measured by the active voltage sensor can be less than 6V, or can be from 5.5V to 0V, with the 0.5V being used to account for the fluctuation and error in the voltage measurements.

In some embodiments, the present invention discloses a jump starter device having a combination of a passive sensor and an active sensor. The passive sensor can be configured to measure a voltage from a vehicle coupled to the jump starter device. Since the passive sensor does not have its own power supply, meaning the passive sensor receives power from the vehicle, the passive sensor can measure a voltage related to the voltage of the vehicle battery. Without the vehicle battery, e.g., when the jump starter device connects to the vehicle without connecting the vehicle battery or when the vehicle battery is not present in the vehicle, the passive sensor can measure a zero voltage, since there is no power source for the passive sensor to measure.

The active sensor can be couple to a power source, such as to the battery of the jump starter device. The active sensor can also be configured to measure a voltage from a vehicle coupled to the jump starter device. Thus, the active sensor can provide a voltage related to the jump starter battery voltage and also related to the vehicle battery. The active sensor can measure a voltage related to the voltage of the vehicle battery, in addition to the relationship to the jump starter battery, when there is a vehicle battery coupled to the jump starter device. Without the vehicle battery, e.g., when the jump starter device connects to the vehicle without connecting the vehicle battery or when the vehicle battery is not present in the vehicle, the active sensor can measure a voltage related to the jump starter battery alone.

A combination of voltage measurements from the passive and active sensors can resolve ambiguity in the vehicle conditions, such as conditions in which a single sensor, e.g., an active or a passive sensor, cannot distinguish.

For example, measurements from a passive voltage sensor and an active voltage sensor can all read to be well above the voltage of the battery of the jump starter device, such as higher than a predetermined amount. For example, the voltage of the battery of the jump starter device can be 12V. The predetermined amount can be about 3V. Thus, the measurements from the passive and active voltage sensors can read 15V or higher and 15V or higher, respectively. This combination of measurements shows that the jump starter device measures a vehicle battery with abnormally high voltage, e.g., above 15V, which indicates that the vehicle has a battery with abnormally high voltage. The controller of the jump starter device can decide to shut off the connection to the vehicle, e.g., issuing an output command to turn off the switch connecting the jump starter battery to the vehicle.

Measurements from a passive voltage sensor and an active voltage sensor can all read to be about the voltage of the battery of the jump starter device, which can be between 12V and about 13.5V for a 12V battery. For example, the voltage of a fully charged 12V battery can be between 12V and 13.5 or 14V. Thus, the measurements from the passive and active voltage sensors can read about 12V (or between 12V and 13.5V) and about 12V (or between 12V and 13.5V), respectively. This combination of measurements shows that the jump starter device measures a vehicle battery with a good voltage, e.g., about 12V, which indicates that the vehicle has a good battery or a fully charged battery or a good new battery. The controller of the jump starter device can decide to make the connection to the vehicle, e.g., issuing an output command to turn on the switch connecting the jump starter battery to the vehicle.

The measurement from a passive voltage sensor can read to be positive and a little less than the voltage of the battery of the jump starter device, such as between 0.5V and about 12V for a 12V battery. For example, the measurement from the passive voltage sensor can read to be a little less than about 12V (or between 0.5V and about 12V or 11.5V).

The measurement from the active voltage sensor can read to be a little less than about 12V but higher than the measurement of the passive sensor. The measurement from the active voltage sensor can read to be a higher than a portion of the jump starter battery, e.g., a voltage divider ratio of the sum of the jump starter battery and the vehicle battery, which can vary from 0V to 12V. For a voltage divider of 0.5, the measurement from the active voltage sensor can read to be from more than half of the jump starter battery to about the voltage of the jump starter battery, e.g., between about 6V and 12V). For example, the measurements can be 0.5V-12V and 6V-12V.

This combination of measurements shows that the jump starter device measures a vehicle battery with a chargeable voltage, e.g., less than about 12V, which indicates that the vehicle has a chargeable battery. The controller of the jump starter device can decide to make the connection to the vehicle, e.g., issuing an output command to turn on the switch connecting the jump starter battery to the vehicle.

The measurement from a passive voltage sensor can read to be about zero volt, such as less than about 0.5V. For example, the measurement from the passive voltage sensor can read to be between 0V and 0.5V.

The measurement from the active voltage sensor can read to be a portion of the jump starter battery, e.g., a divider ratio of the sum of the jump starter battery and the vehicle battery. For the vehicle battery to be 0V, the measurement from the active voltage sensor can vary from 0V to 12V. For example, for a voltage divider of 0.5, the measurement from the active voltage sensor can read to be about a little more than half of the jump starter battery, e.g., about 6V or between 6V and 6.5V.

This combination of measurements shows that the jump starter device measures a shorted vehicle battery or a shorted vehicle circuit, such as a reverse polarity connection without the vehicle battery. The controller of the jump starter device can decide to shut down the connection to the vehicle, e.g., issuing an output command to turn off the switch connecting the jump starter battery to the vehicle.

For the measurement from a passive voltage sensor to be about zero volt, the measurement from the active voltage sensor can read to be about the same as the jump starter battery, e.g., about 12V.

This combination of measurements shows that the jump starter device measures an open circuit connection. The controller of the jump starter device can decide to shut down the connection to the vehicle, e.g., issuing an output command to turn off the switch connecting the jump starter battery to the vehicle.

For the measurement from a passive voltage sensor to be about zero volt, the measurement from the active voltage sensor can read to be a portion of the jump starter battery, e.g., a divider ratio of the sum of the jump starter battery and the vehicle battery. For the vehicle battery to be 0V, the measurement from the active voltage sensor can vary from 6V to 12V. For example, for a voltage divider of 0.5, the measurement from the active voltage sensor can read to be from more than half of the jump starter battery to about the jump starter battery, e.g., between 6V and 12V, or more likely between 7V and 10 V.

This combination of measurements shows that the jump starter device measures a correct polarity connection with the vehicle circuit without a vehicle battery. The controller of the jump starter device can decide to make the connection to the vehicle, e.g., issuing an output command to turn on the switch connecting the jump starter battery to the vehicle.

The measurement from a passive voltage sensor can read to be negative, such as between 0V and −12V for a 12V battery. For example, the measurement from the passive voltage sensor can read to be between −0.5V and about −12V.

The measurement from the active voltage sensor can read to be positive and lower than a portion of the jump starter battery, e.g., a voltage divider ratio of the sum of the jump starter battery and the vehicle battery, which can vary from 0V to 12V. For a voltage divider of 0.5, the measurement from the active voltage sensor can read to be from 0V to less than half of the jump starter battery to about the voltage of the jump starter battery, e.g., between about 0V and 6V. For example, the measurements can be 0V-6V or 0.5V to 5.5V.

This combination of measurements shows that the jump starter device measures a vehicle with a reverse polarity connection. The controller of the jump starter device can decide to shut down the connection to the vehicle, e.g., issuing an output command to turn off the switch connecting the jump starter battery to the vehicle.

In some embodiments, the load sensor can include a voltage sensor having two switches coupled to the vehicle and to the battery of the jump starter device. The voltage sensor can include a voltage divider having resistors R1 and R2.

Figure 15A:
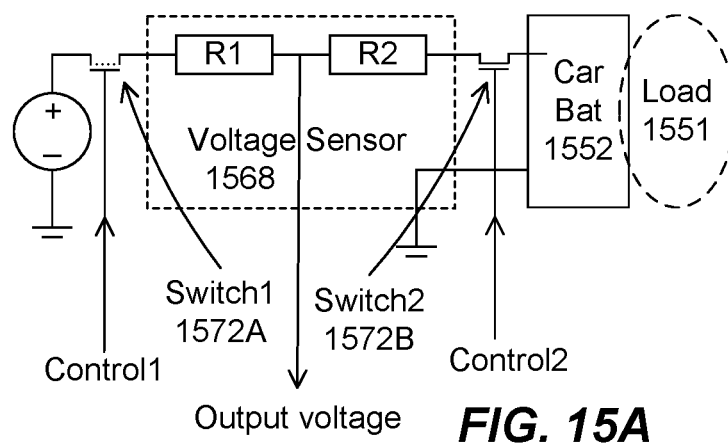
FIGS. 15A-15B illustrate a configuration of a load sensor according to some embodiments.
Figure 15B:
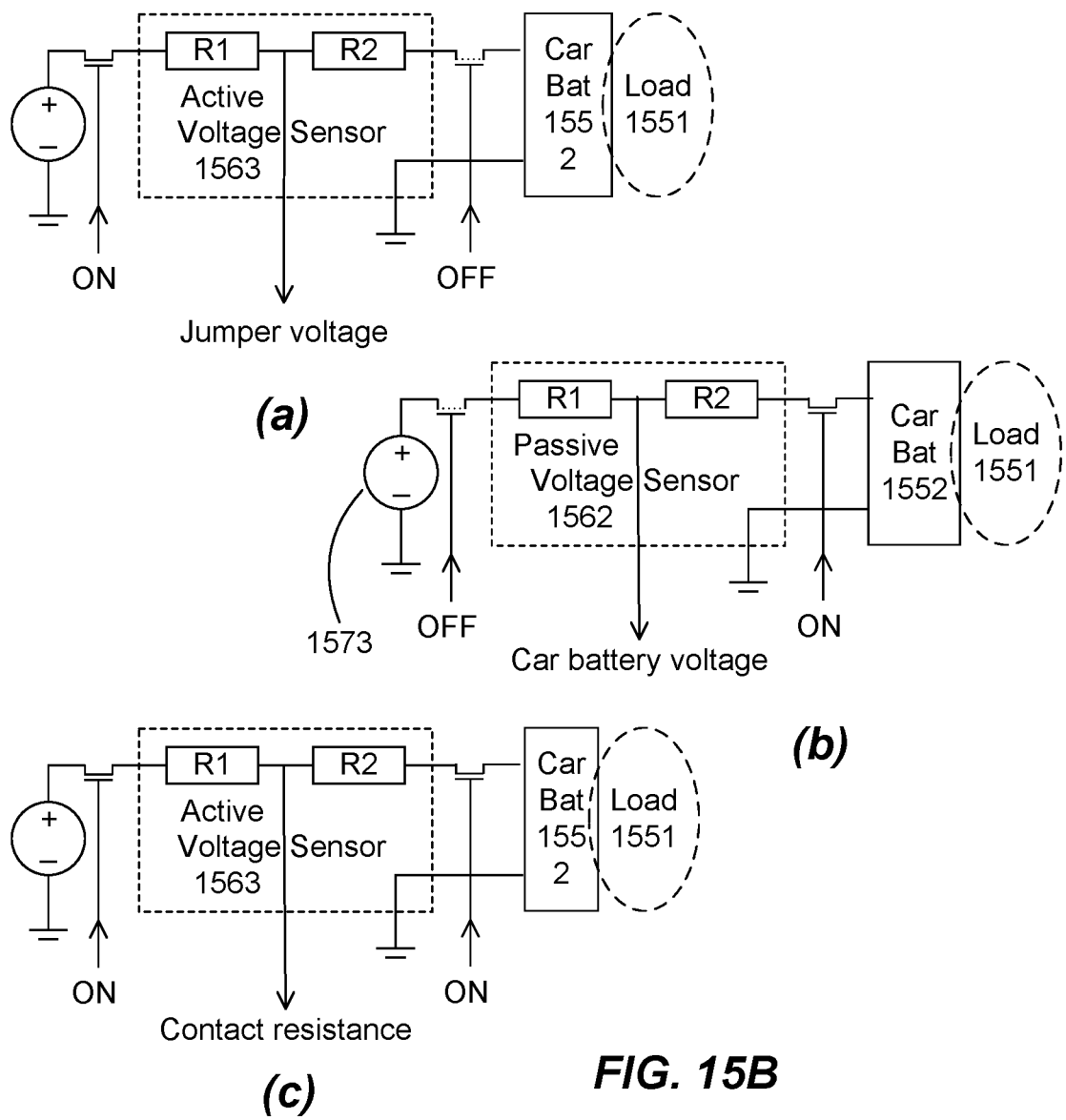

FIGS. 15A-15B illustrate a configuration of a load sensor according to some embodiments. In FIG. 15A, a load sensor can include a voltage sensor 1568, which can be coupled to the battery of the jump starter device through a first switch 1572A and which can be configured to be coupled to a vehicle, e.g., coupled to a vehicle battery 1552 or to a vehicle circuit 1551 through a second switch 1572B. The switches 1572A and 1572B can be controlled by the controller.

FIG. 15B(a)-15B(c) show operating configurations for the load sensor. In FIG. 15B(a), the load sensor can function as an active voltage sensor 1563 by having the first switch 1572A turning on, and the second switch 1572B turning off. The active voltage sensor configuration can be used to measure a voltage of the battery of the jump start device.

In FIG. 15B(b), the load sensor can function as a passive voltage sensor 1562 by having the first switch 1572A turning off, and the second switch 1572B turning on. The passive voltage sensor configuration can be used to measure a voltage of the battery of the vehicle.

In FIG. 15B(c), the load sensor can function as an active voltage sensor 1563 by having the first switch 1572A and the second switch 1572B turning on. The active voltage sensor configuration can be used to measure a voltage of the vehicle from a combination of a battery of the jump start device and a vehicle, such as the vehicle battery 1552 or the vehicle circuit 1551.

The load sensor can be used to measure a resistance of the vehicle, for example, by comparing a measured voltage with both switches on and a predetermined voltage for an ideal vehicle.

FIGS. 16A-16B illustrate flow charts for operating a jump starter device according to some embodiments. In FIG. 16A, operation 1600 forms a jumper system having a sensor assembly. The sensor assembly can include a circuit comprising a voltage divider. The circuit is coupled to a battery of the jumper system through a first switch. The circuit is coupled to a battery of a vehicle through a second switch.

In FIG. 16B, operation 1620 turns off a first switch coupled to a voltage measuring circuit. Operation 1630 measures a first voltage using the voltage measuring circuit. Operation 1640 turns off a second switch coupled to the voltage measuring circuit. Operation 1650 measures a second voltage using the voltage measuring circuit. Operation 1660 turns on the first and second switches. Operation 1670 measures a third voltage using the voltage measuring circuit. Operation 1680 determines a resistance based on the first, second, and third voltage.

In some embodiments, the load sensor can include a combination of one or more active voltage sensors and one or more passive voltage sensors, with each voltage sensor generating an output voltage. In some embodiments, the voltage sensor can include a voltage divider circuit. Other voltage sensor configurations can also be used.

Figure 17A:
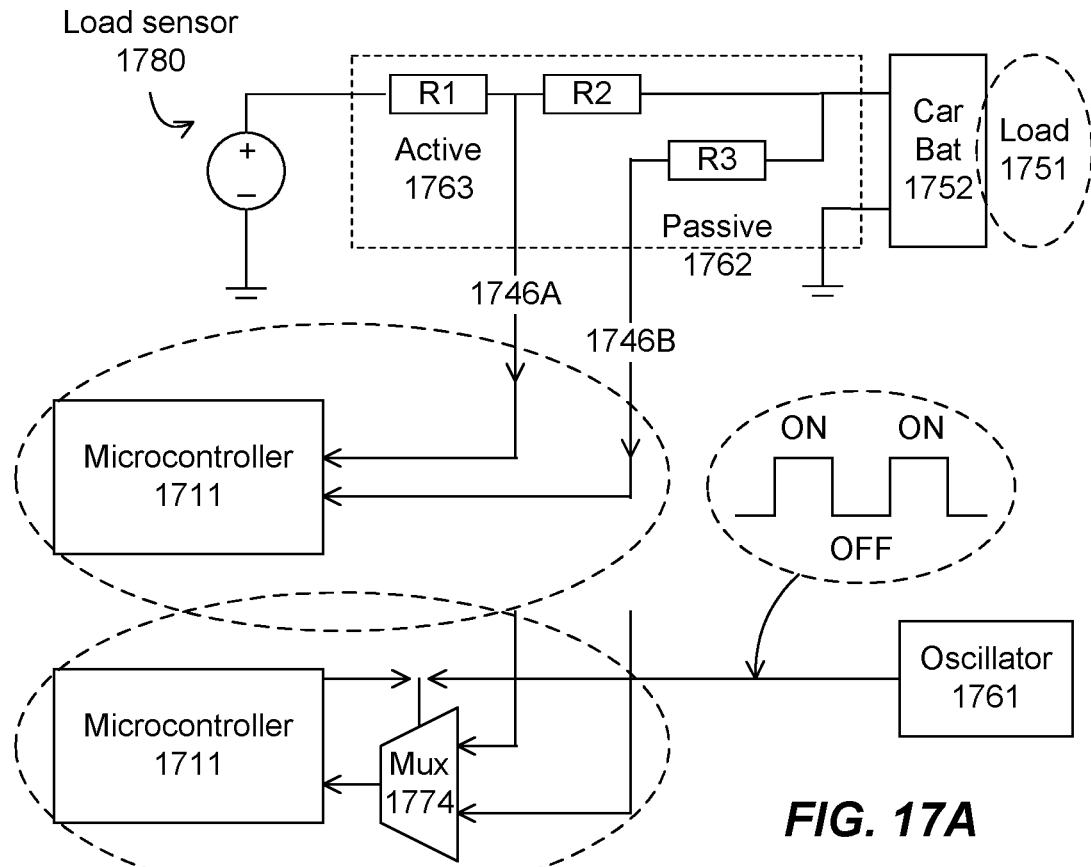
FIGS. 17A-17B illustrate configurations of combinations of passive and active sensors according to some embodiments.
Figure 17B:
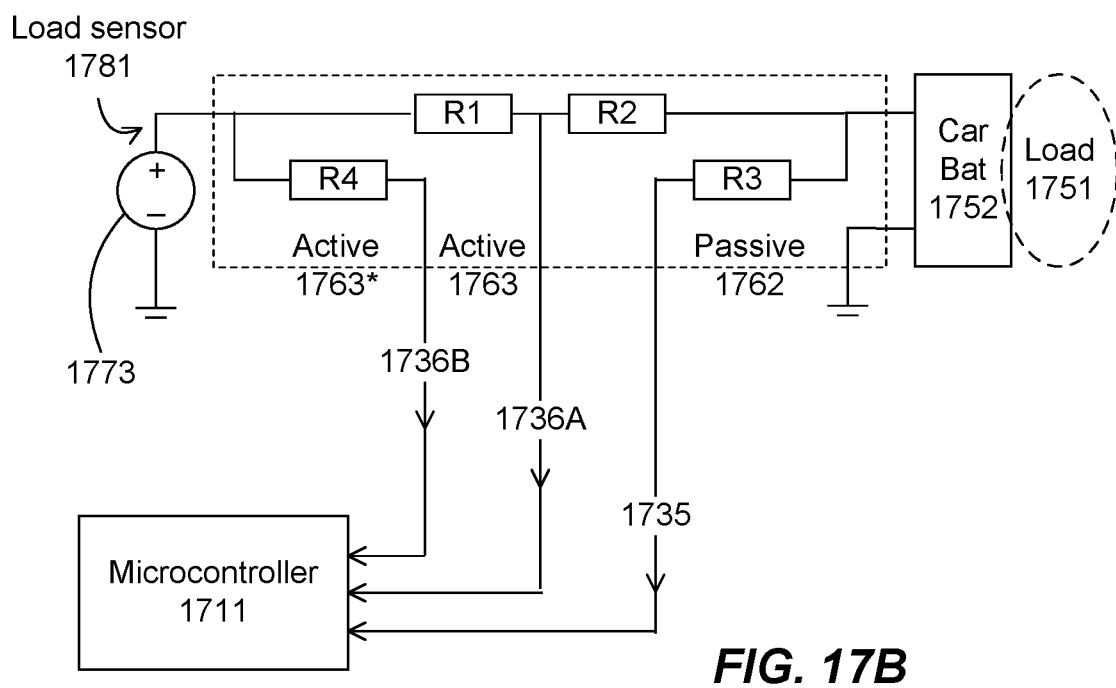

FIGS. 17A-17B illustrate configurations of combinations of passive and active sensors according to some embodiments. In FIG. 17A, the load sensor 1780 can include an active sensor circuit 1763 having a voltage divider of R1 and R2, and a passive sensor circuit 1762 having a resistor R3. The active sensor is connected to the battery of the jump starter device and also to the vehicle, e.g., to the vehicle battery 1752 or to the vehicle circuit 1751. The passive sensor is coupled to the vehicle.

The active and passive sensors can provide output signals 1746A and 1766B, respectively, which can be connected directly to the controller 1711 as two separate input lines. Alternatively, the output signals 1746A and 1766B can be connected to the controller 1711 through a multiplexer 1774, which can provide a single input line to the controller 1711. The control line for the multiplexer can be provided by the controller, e.g., the controller can determine which input line passing through the multiplexer. The control line for the multiplexer can be provided by an oscillator 1761, which can let the output signals 1746A and 1766B passing sequentially through the multiplexer.

In FIG. 17B, the load sensor 1781 can include a first active sensor circuit 1763 having a voltage divider of R1 and R2, a second active sensor circuit 1763* having a resistor R4, and a passive sensor circuit 1762 having a resistor R3. The first active sensor is connected to the battery of the jump starter device and also to the vehicle, e.g., to the vehicle battery 1752 or to the vehicle circuit 1751. The second active sensor is connected to the battery of the jump starter device. The passive sensor is coupled to the vehicle.

The active and passive sensors can provide output signals 1736A, 1736B, and 1735, respectively, which can be connected directly to the controller 1711 as three separate input lines. Alternatively, the output signals 1736A, 1736B, and 1735 can be connected to the controller through a multiplexer, which can provide a single input line to the controller. The control line for the multiplexer can be provided by the controller, e.g., the controller can determine which input line passing through the multiplexer, as shown in the previous figure. The control line for the multiplexer can be provided by an oscillator, which can let the output signals passing sequentially through the multiplexer, as shown in the previous figure.

FIGS. 18A-18B illustrate flow charts for forming a sensor assembly according to some embodiments. In FIG. 18A, operation 1800 forms a sensor assembly having a first circuit and a second circuit. The first circuit is configured to be coupled to a vehicle. The first circuit is configured to measure a voltage related to the vehicle. The second circuit is coupled to a jumper battery and configured to be coupled to a vehicle. The second circuit is configured to measure a voltage related to the jumper battery and the vehicle. The outputs from the first and second circuits are provided to a controller. Alternatively, the outputs from the first and second circuits are multiplexed to be provided to the controller. The multiplexer is controlled by an oscillator circuit for automatically to toggle between inputs. Alternatively, the multiplexer is controlled by the controller for the controller to toggle the multiplexer between inputs.

In FIG. 18B, operation 1820 forms a sensor assembly having first, second, and third circuits. The first circuit is configured to be coupled to a vehicle. The first circuit is configured to measure a voltage related to the vehicle. The second circuit is coupled to a jumper battery and configured to be coupled to a vehicle. The second circuit is configured to measure a voltage related to the jumper battery and the vehicle. The third circuit is configured to measure a voltage related to the jumper battery. The outputs from the first, second, and third circuits are provided to a controller. Alternatively, the outputs from the first and second circuits are multiplexed to be provided to the controller. The multiplexer is controlled by an oscillator circuit for automatically to toggle between inputs. Alternatively, the multiplexer is controlled by the controller for the controller to toggle the multiplexer between inputs.

In some embodiments, the load sensor can be coupled to a polarity swapping circuit, such as an h bridge or a combination of relays. The polarity swapping circuit can be coupled between the load sensor and the vehicle, which can allow the load sensor to swap polarity when sensing a reverse polarity. The polarity swapping circuit can provide confirmation that the connection with the vehicle is indeed a reverse polarity connection.

In general, a reverse polarity condition can stop the jump starter device form making further diagnosis, since the reverse polarity is not suitable for forming the connection with the vehicle. Thus, the polarity swapping can allow assessing the vehicle battery condition, such as having an over voltage condition (such as above 15V for a 12V vehicle), being a good battery condition (such as between 12V to 13.5V for a 12V vehicle), being a rechargeable battery condition (such as between 10 V to 12V for a 12V vehicle), being a poor rechargeable battery condition (such as lower than 10 V for a 12V vehicle), or being a shorted battery (such as about 0V for a 12V vehicle).

Figure 19A:
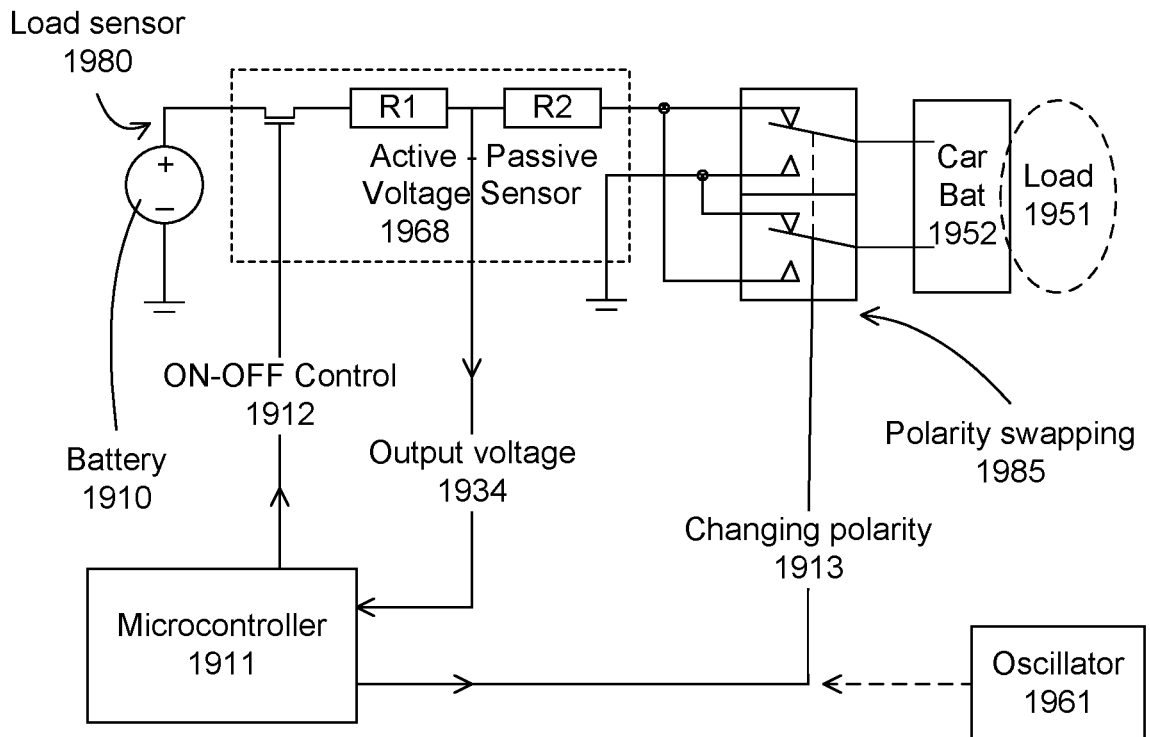
FIGS. 19A-19B illustrate configurations for polarity swapping of a load sensor in a jump starter device according to some embodiments.
Figure 19B:
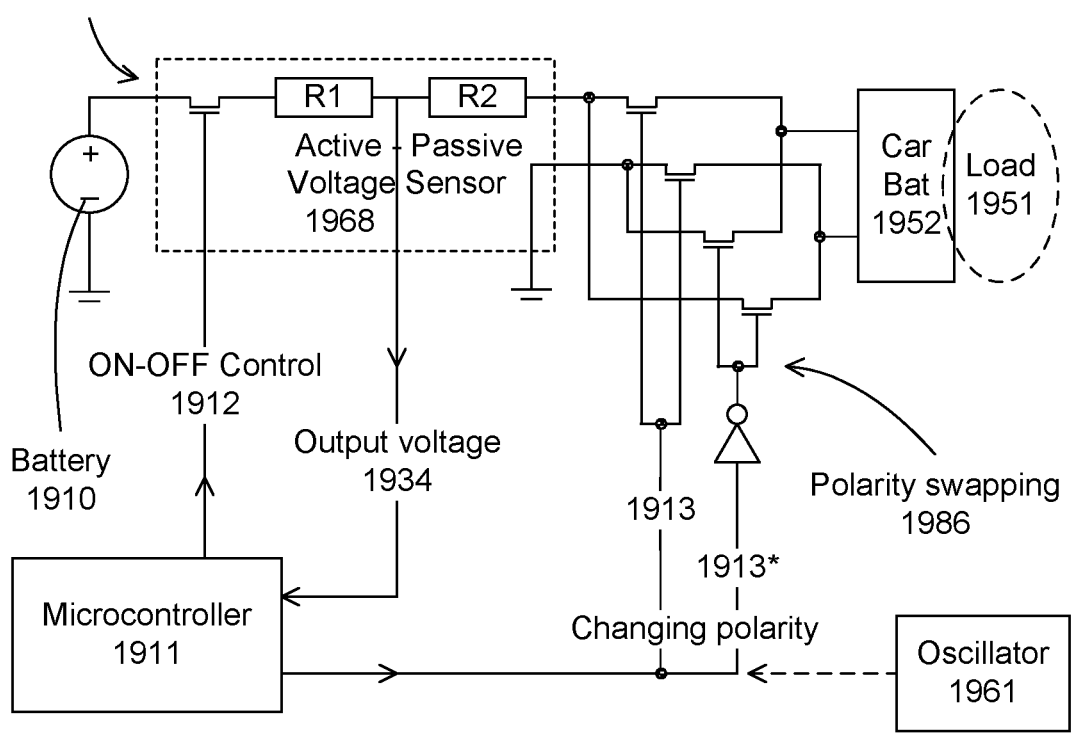

FIGS. 19A-19B illustrate configurations for polarity swapping of a load sensor in a jump starter device according to some embodiments. FIG. 19A shows a configuration of a polarity swapping circuit 1985 using two single pole double throw relays. The jump starter device can include a load sensor 1980, which include an active/passive voltage sensor circuit 1968, which can have a voltage divider circuit using a resistor configuration of R1 and R2. The active/passive voltage sensor circuit 1968 can be connected to the battery 1910 through a switch controlled by an output signal 1912 from a controller 1911. By turning on or off the switch, the active/passive voltage sensor circuit 1968 can form an active voltage sensor or a passive voltage sensor, respectively. The active voltage sensor and the passive voltage sensor can generate output voltages 1934 in sequence to be inputted into the controller 1911.

One end of the load sensor 1980 can be coupled to a polarity swapping circuit 1985. The polarity swapping circuit 1985 can include two single pole double throw (SPDT) relays connecting between the load sensor 1980 and the vehicle, e.g., to the vehicle battery 1952 or to the vehicle circuit 1951. Thus, when the SPDT relays are activated, the load sensor 1980 can be connected to the vehicle in a first polarity, such as in a reverse polarity. When the SPDT relays are deactivated, the load sensor 1980 can be connected to the vehicle in a second polarity opposite of the first polarity, such as in a correct polarity.

The SPDT relays can be controlled by a polarity changing signal 1913, which can be an output control signal from the controller 1911, or which can be automatically performing the polarity switching from an oscillator circuit 1961.

In operation, the controller 1911 can first determine that the connection with the vehicle is a reverse polarity connection. For example, a reverse polarity condition can be detected using a combination of voltage measurements with the passive and active sensors, such as a measurement of 12V and 0V, indicating the presence of a vehicle battery connected in the reverse polarity connection. The reverse polarity condition can be detected using a combination of voltage measurements of 0V and 6V, indicating the absence of a vehicle battery and with the vehicle circuit connected in the reverse polarity connection.

FIG. 19B shows another configuration of a polarity swapping circuit 1986 using four transistors, such as field effect transistors or bipolar transistors. The jump starter device can include a load sensor 1980, which include an active/passive voltage sensor circuit 1968, which can have a voltage divider circuit using a resistor configuration of R1 and R2. The active/passive voltage sensor circuit 1968 can be connected to the battery 1910 through a switch controlled by an output signal 1912 from a controller 1911. The active voltage sensor and the passive voltage sensor can generate output voltages 1934 in sequence to be inputted into the controller 1911.

One end of the load sensor 1980 can be coupled to a polarity swapping circuit 1986. The polarity swapping circuit 1986 can include four transistors forming an h bridge configuration, to connect between the load sensor 1980 and the vehicle, e.g., to the vehicle battery 1952 or to the vehicle circuit 1951. Thus, when first two of the four transistors are activated with the other remaining second two transistors deactivated, the load sensor 1980 can be connected to the vehicle in a first polarity, such as in a reverse polarity. When the first two of the four transistors are deactivated with the other remaining second two transistors activated, the load sensor 1980 can be connected to the vehicle in a second polarity opposite of the first polarity, such as in a correct polarity.

The four transistors can be partitioned into two groups of two transistors, with each group controlled by an opposite polarity changing signal 1913 or 1913\*, for example, through an inverter. The polarity changing signals 1913 and 1913\* (which can be the signal 1913 passing through an inverter) can be an output control signal from the controller 1911, or which can be automatically performing the polarity switching from an oscillator circuit 1961.

FIGS. 20A-20B illustrate flow charts for forming sensor assemblies having a polarity swapping circuit according to some embodiments. In FIG. 20A, operation 2000 forms a sensor assembly having a switch having one end coupled to a circuit, with another end of the switch coupled to a battery of a jumper system. The circuit can be configured to be coupled to polarity switching circuit for measuring a voltage of a vehicle with switchable polarity.

In FIG. 20A, operation 2000 forms a sensor assembly having a switch having one end coupled to a circuit, with another end of the switch coupled to a battery of a jumper system. The circuit can be configured to be coupled to polarity switching circuit for measuring a voltage of a vehicle with switchable polarity. The switch can be coupled to an oscillator circuit for automatically to toggle between on and off. Alternatively, the switch can be coupled to a controller for the controller to turn the switch on or off. The polarity switching circuit can be controlled by an oscillator circuit for automatically polarity switching toggling. Alternatively, the polarity switching circuit can be coupled to a controller for the controller to switch polarity.

In some embodiments, the voltage output from the load sensor can be provided to the controller as an analog signal, e.g., a voltage value between −12V to above 15V. An analog-to-digital (A/D) converter can be used to convert the analog voltage signal into a digital signal to be processed by the controller. Alternatively, the analog output voltage from the load sensor can be processed, for example, by a voltage comparator circuit, to generate multiple digital signals related to the ranges of the voltage corresponded to the control of the jump starter device.

Figure 21A:
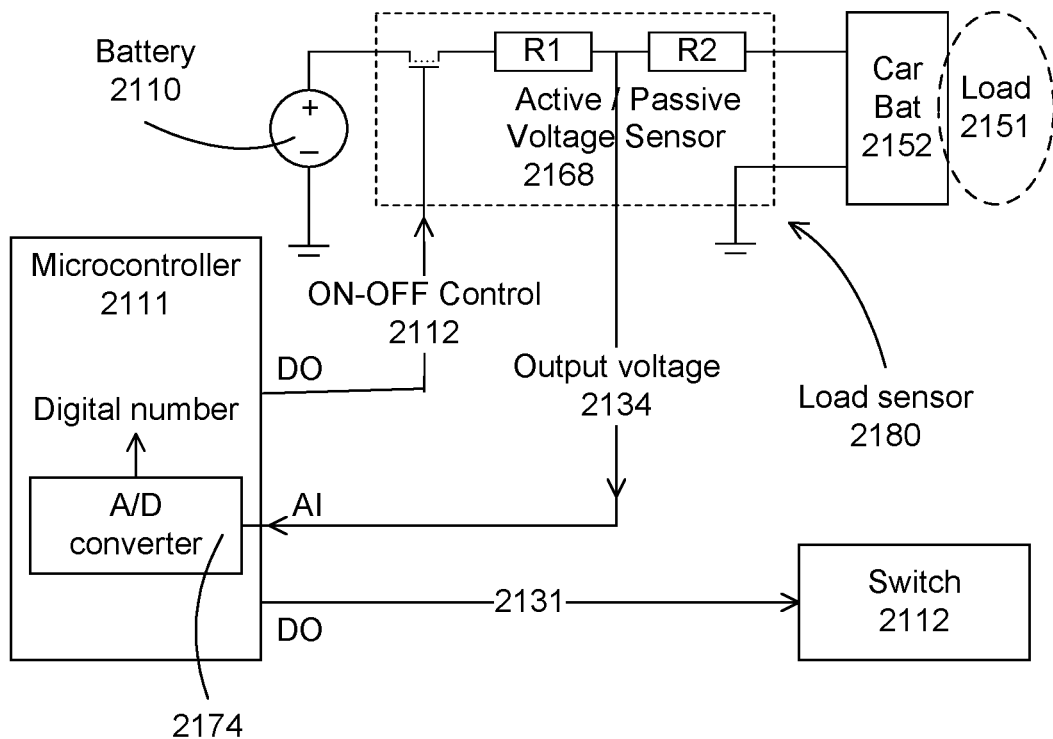
FIGS. 21A-21B illustrate configurations for circuits configured to process voltage outputs from a load sensor according to some embodiments.
Figure 21B:
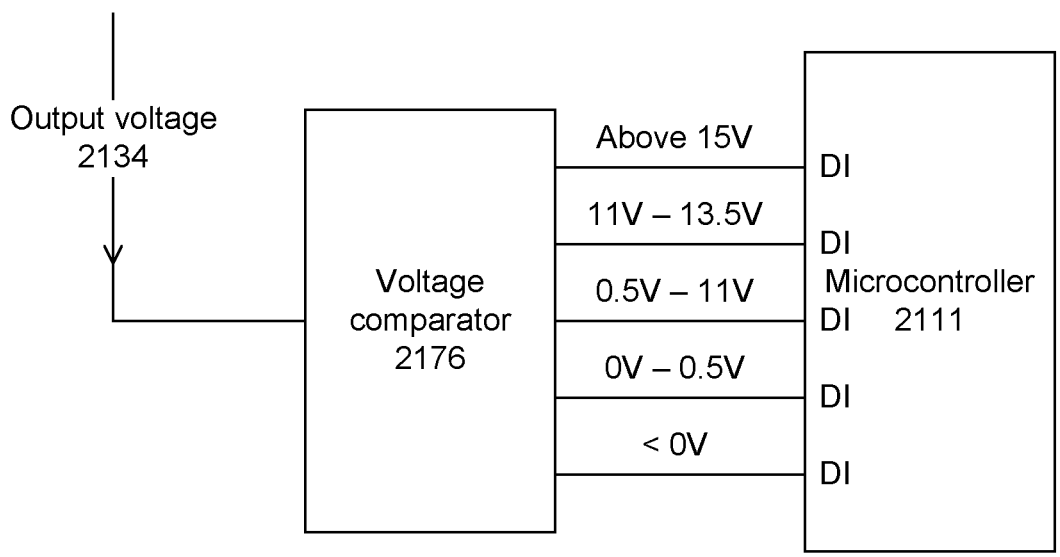

FIGS. 21A-21B illustrate configurations for circuits configured to process voltage outputs from a load sensor according to some embodiments. In FIG. 21A, a controller 2111 can include a built-in A/D converter 2174, for example, an internal circuit coupled to an analog input (AI) of the controller. A load sensor 2180 can include an active/passive voltage sensor 2168, which can be coupled to the battery 2110 of the jump starter device through a switch. The switch can be controlled by an on/off control signal 2112 generated by the controller 2111, such as from a digital output (DO) of the controller. The load sensor can be configured to be coupled to a vehicle, such as to a vehicle battery 2152 or to a vehicle circuit 2151, e.g., with the vehicle battery removed or not connected.

The load sensor can generate an output voltage 2134, which can provide indications of the status of the vehicle, such as whether or not a vehicle battery is connected to the jump starter device; the conditions of the vehicle battery such as an over voltage battery, a good battery, a chargeable battery, or a shorted battery; and the conditions of the connection of the jump starter device with the vehicle, such as not connected at all (e.g., forming an open circuit), connected in a correct polarity, or connected in a reverse polarity. The output voltage signal 2134 can be supplied to the controller 2111 as an analog input, e.g., connected to the controller at an AI pin. The controller can convert the analog input 2134 to a digital value, for example, through the built-in A/D converter 2174. Based on the value of the converted digital voltage, the controller can know about the status of the vehicle, the conditions of the vehicle battery, and the conditions of the connection between the jump starter and the vehicle. The controller then can issue appropriate output signal 2131 to the switch 2112, which can control whether the battery of the jump starter device should be connected to the terminals of the vehicle.

FIG. 21B shows another configuration for processing the output voltage 2134 from the load sensor 2180. A voltage comparator 2176 can be configured to split the analog input 2134 into different voltage ranges, for example, based on the consideration of the jump starter device. For example, the voltage comparator 2176 can be configured to compare the input voltage with different reference voltages to provide output voltages belonging to different voltage ranges. For example, the voltage comparator can compare the input voltage with a reference voltage of 15V, in order to see if the input voltage is higher than 15V, which can indicate that the vehicle battery has an over voltage condition. Similarly, the reference voltages can include an 11V or 12V, which can indicate an input voltage of between 11V and 13.5V or between 12V and 13.5V, e.g., a vehicle battery that is fully charged and can be as good as new. This input voltage can also indicate an open circuit condition, e.g., the measured voltage is the voltage of the battery of the jump starter device. Other reference voltages can include a zero voltage, or a negative voltage, which can indicate a short vehicle battery or a reverse polarity connection, respectively.

Figures 22A, 22B, 22C:
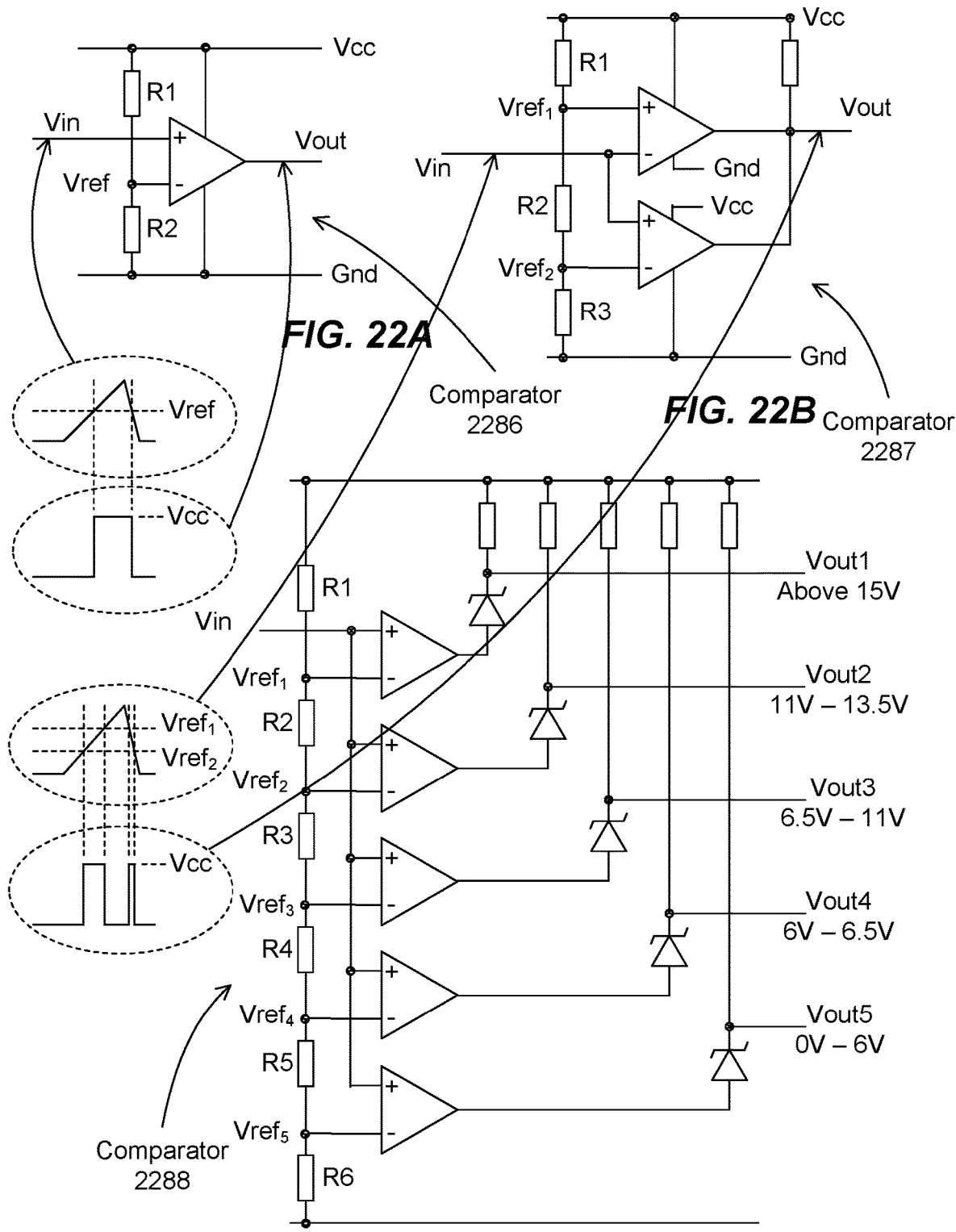
FIGS. 22A-22C illustrate configurations for voltage comparators according to some embodiments.

FIGS. 22A-22C illustrate configurations for voltage comparators according to some embodiments. FIG. 22A shows a positive voltage comparator 2286, which includes a differential operational amplifier (Op-Amp) having connected to a power supply Vcc. As shown, the op amp is a single rail op amp (or a single power supply op amp), meaning an op amp requiring a single source of power supply, such as a Vcc. Other configuration can be used, such as a dual rail op amp (or a dual power supply op amp), which is an op amp requiring two power supplies, such as a positive power supply Vcc and a negative power supply −Vcc. A reference voltage can be obtained by using a voltage divider circuit using two resistors R1 and R2. The op amp is configured into a positive comparator by connecting the input voltage Vin to the positive terminal of the op amp, and the reference voltage Vref to the negative terminal of the op amp. The voltage Vin is compared with the reference voltage Vref, and if Vin is larger than Vref, the op amp output is high, from a low voltage.

The op amp can be configured into a negative comparator by connecting the input voltage Vin to the negative terminal of the op amp, and the reference voltage Vref to the positive terminal of the op amp. The voltage Vin is compared with the reference voltage Vref, and if Vin is smaller than Vref, the op amp output is low, from a high voltage.

FIG. 22B shows a window voltage comparator 2287, which includes two differential operational amplifiers (Op-Amp) connected in parallel. As shown, the op amps are single rail op amps (or a single power supply op amp), meaning op amps requiring a single source of power supply, such as a Vcc. Other configuration can be used, such as a dual rail op amp (or a dual power supply op amp), which is an op amp requiring two power supplies, such as a positive power supply Vcc and a negative power supply −Vcc. Two reference voltages of Vref1 and Vref2 can be obtained by using a voltage divider circuit using three resistors R1, R2, and R3. The op amps are configured into a window comparator by connecting the input voltage Vin to the negative terminal of a first op amp, and also to the positive terminal of a second op amp. The first reference voltage Vref1 can be supplied to the positive terminal of the first op amp. The second reference voltage Vref2 can be supplied to the negative terminal of the second op amp. The voltage Vin is compared with the reference voltages Vref1 and Vref2, and if Vin is between Vref1 and Vref2, e.g., Vin is smaller than Vref1 and larger than Vref2, the op amp output is high, from a low voltage.

FIG. 22C shows a comparator voltage level detector 2288, which includes multiple differential operational amplifiers (Op-Amp) (5 op amps shown) connected in parallel. The op amps can be single rail or single power supply op amp, or can be dual rail or dual power supply op amp. Single rail op amps can be used for assessing DC voltages, such as either a positive voltage or a negative voltage. Thus, single rail op amp comparator circuits can be used on positive input voltages, such as voltages provided from an active voltage sensor, which can provide 0V-15V for measuring vehicle battery voltages between −12V to +15V, as discussed above.

Dual rail op amps can be used for assessing AC voltages, such as a voltage have positive and negative components. Thus, dual rail op amp comparator circuits can be used on both positive and negative input voltages, such as voltages provided from a passive voltage sensor, which can provide −12V to +15V for measuring vehicle battery voltages between −12V to +15V, as discussed above.

As shown, the comparator voltage level detector 2288 can have 5 reference voltages of Vref1, Vref2, Vref3, Vref4, and Vref5, which can be obtained by using a voltage divider circuit using 6 resistors R1, R2, R3, R4, R5, and R6. The op amps are configured into a comparator voltage level detector by connecting the input voltage Vin to the positive terminals of all op amps, with the negative terminals connecting to the different reference voltages Vref1-Vref5. The voltage Vin is compared with the reference voltages, and if Vin is higher than a reference voltage, the op amp output corresponded to the reference voltage is high, from a low voltage.

As shown, the comparator voltage level detector 2288 is not a window comparator. For example, the output Vout5 for 0V-6V is not really containing voltages in the range of 0V-6V, but actually any voltage greater than Vref5, such as greater than 0V (Vref5=0V) or greater than 0.5V (Vref5=0.5V). Only when the other output voltages (Vout4=6V-6.5V, Vout3=6.5V-11V, Vout4=11V-13.5V, and Vout1=above 15V) are zero (which indicate that the output voltage is not greater than the smallest voltage value of 6V), then the output Vout5=0V-6V is in the range of 0V-6V.

Thus, the comparator voltage level detector 2288 can generate a voltage indicating the range of above 15V for (Vout1=1, Vout2=0, Vout3=0, Vout4=0, Vout5=0), a range of 11V-13.5V for (Vout1=0, Vout2=1, Vout3=0, Vout4=0, Vout5=0), a range of 6.5V-11V for (Vout1=0, Vout2=0, Vout3=1, Vout4=0, Vout5=0), a range of 6V-6.5V for (Vout1=0, Vout2=0, Vout3=0, Vout4=1, Vout5=0), and a range of 0V-6V for (Vout1=0, Vout2=0, Vout3=0, Vout4=0, Vout5=1).

The outputs of the comparator voltage level detector 2288 can include a pull up resistor coupled to a Zener diode. The Zener diode can be set at 3.3V or 5V, for example, to generate a TTL voltage for a microprocessor. The pull up resistor is used for a class of op amps using an open collector transistor for its output, such as an LM339 op amp chip. For op amps having an open collector transistor for their output, a pull up resistor connected to the collector and the Vcc is required to make the open collector transistor work.

FIGS. 23A-23C illustrate flow charts for forming sensor assemblies according to some embodiments. In FIG. 23A, operation 2300 forms a sensor assembly comprising a circuit configured to measure a voltage of a battery of a vehicle or a load of the vehicle. An output of the circuit can be provided as an analog input to a controller. Alternatively, the output of the circuit can be partitioned into multiple ranges of voltages to be provided as multiple digital inputs to the controller.

In FIG. 23B, operation 2320 forms a sensor assembly having a circuit configured to measure a voltage of a battery of a vehicle or a load of the vehicle. An output of the circuit can be partitioned into multiple ranges of voltages to be provided as multiple digital inputs to a controller, with the voltage ranges including an over voltage range, a good battery comparable voltage range, a chargeable battery voltage range, a zero voltage range, and a reverse polarity voltage range.

In FIG. 23C, operation 2340 forms a sensor assembly having a circuit configured to measure a voltage of a battery of a vehicle or a load of the vehicle. An output of the circuit can be provided to a comparator voltage level detector to be partitioned into one of multiple ranges of voltages to be provided as digital inputs to a controller.

Figure 24A:
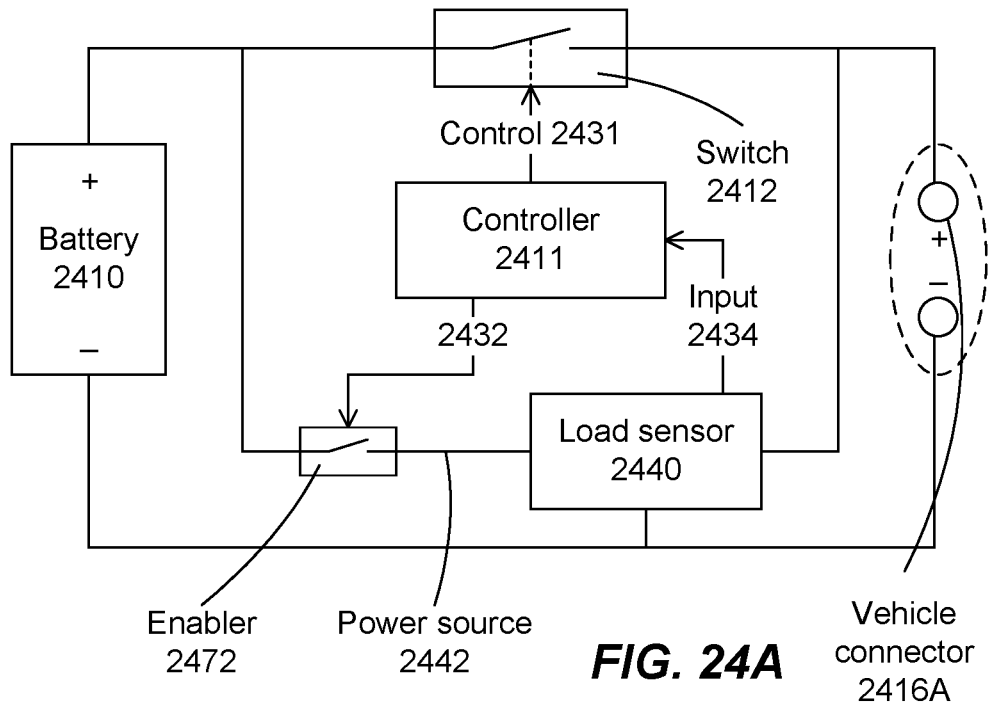
FIGS. 24A-24C illustrate a configuration of a jump starter circuit according to some embodiments.
Figure 24B:
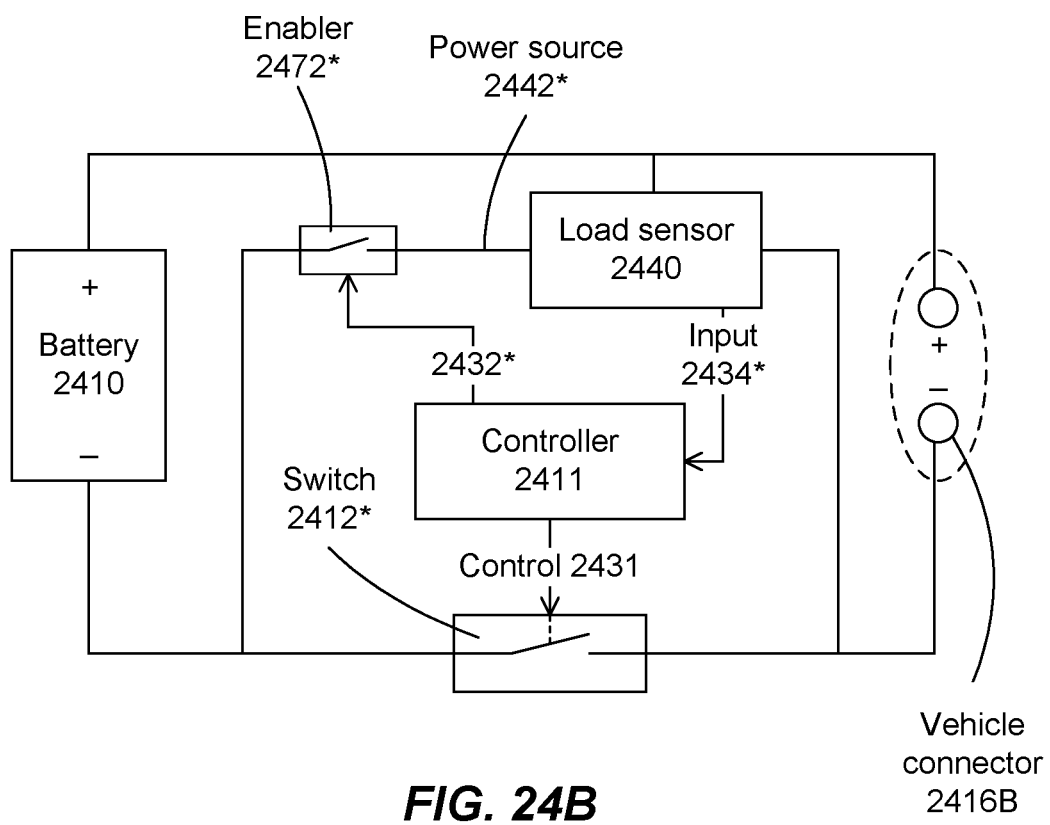
Figure 24C:
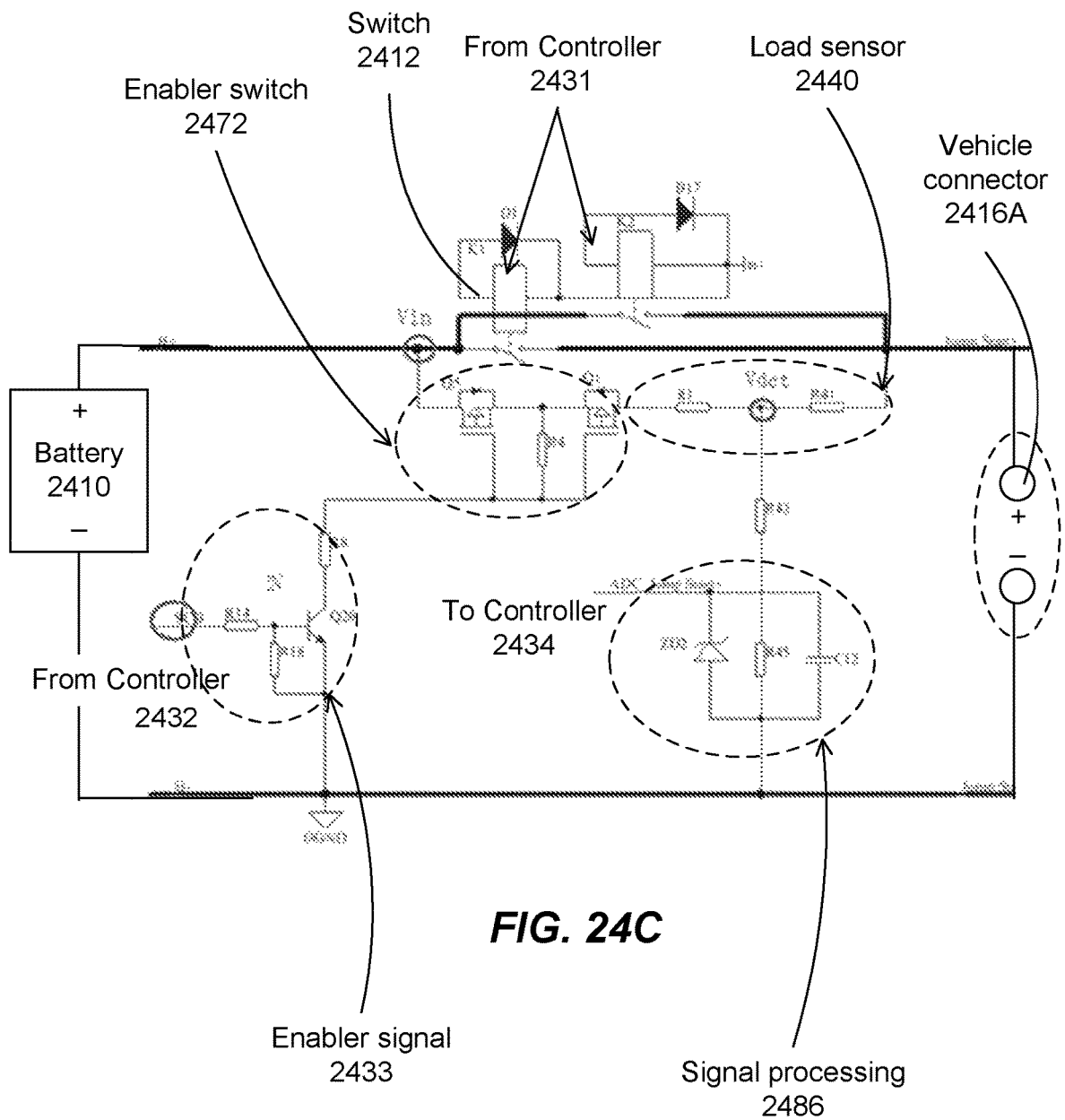

FIGS. 24A-24C illustrate a configuration of a jump starter circuit according to some embodiments. FIG. 24A shows a schematic in which the switch 2412 is configured to control the connection of the positive terminal of the battery 2410 of the jump starter device with the positive terminal 2416A of the vehicle, such as with the positive terminal of the vehicle battery. The switch 2412 can be controlled by a control output 2431 from the controller 2411. The load sensor 2440 can be configured to sample the vehicle voltage from the positive terminal of the vehicle. The load sensor 2440 can be configured to receive a power source 2442, such as from the battery 2410 of the jump starter device. An enabler switch 2472 can be used to control the application of the power source 2442 to the load sensor. The enabler switch 2472 can be activated or deactivated with a control output signal 2432 from the controller 2411. For example, when the controller 2411 activates the enabler switch 2472, e.g., turning on the switch 2472, the load sensor can receive power from the jump starter battery 2410, which can turn the load sensor into an active voltage sensor. When the controller 2411 deactivates the enabler switch 2472, e.g., turning off the switch 2472, the load sensor does not have an external power source, which can make the load sensor to behave like a passive voltage sensor.

FIG. 24B shows a schematic in which the switch 2412* is configured to control the connection of the negative terminal of the battery 2410 of the jump starter device with the negative terminal 2416B of the vehicle, such as with the negative terminal of the vehicle battery. Similar to the above configuration, the switch 2412* can be controlled by a control output 2431 from the controller 2411. The load sensor 2440 can be configured to sample the vehicle voltage from the negative terminal of the vehicle. The load sensor 2440 can be configured to receive a power source 2442, such as from the battery 2410 of the jump starter device. An enabler switch 2472* can be used to control the application of the power source 2442 to the load sensor. The enabler switch 2472* can be activated or deactivated with a control output signal 2432* from the controller 2411, making the load sensor 2440 to behave like an active or a passive sensor, respectively.

Other configurations can be used, such as two switches controlling the connection from both the positive and negative terminals of the jump starter battery to the positive and negative terminals of the vehicle connector.

FIG. 24C shows a portion of the jump starter circuit. Relays can function as a switch 2412 to couple between the positive terminal of the jump starter battery 2410 and the positive terminal 2416A of the vehicle connector. Control signal 2431 from the controller can be used to turn on or off the relays 2412 for coupling or uncoupling the jump starter device with the vehicle, respectively.

Load sensor 2440 can include a voltage divider circuit, which can be coupled to the terminal 2416A of the vehicle connector. The load sensor can be coupled to the battery 2410 of the jump starter device through an enabler switch 2472, such as a CMOS transistor. The enabler switch 2472 can be controlled, e.g., turning on or off, by a control signal 2432 from the controller. The control signal 2432 can turn on the enabler signal circuit 2433, which in turn turning on the enabler switch 2472, the load sensor 2440 is connected to the battery 2410.

In some embodiments, the present invention discloses connecting the jump starter battery 2410 to the vehicle, e.g., to the vehicle connector to be connected to the vehicle battery or the vehicle circuit, in a controlled manner to allow the determination of the condition of the vehicle. Thus, the jump starter device, while disconnecting the main connection from the battery 2410 to the vehicle by turning off the switch 2412, provides a connection between the battery 2410 to the vehicle through the load sensor, e.g., through the voltage divider circuit. Thus, the power supplied to the vehicle can be controlled, such as controlling the current supplied to the vehicle, by selecting appropriate resistance for the voltage divider. The control connection between the battery 2410 to the vehicle can allow the jump starter device to determine the vehicle conditions, especially without the vehicle battery, without causing damages to the jump starter device or to the vehicle.

The load sensor 2440 can provide output signals representative of the vehicle conditions. The output signal from the load sensor can be an analog voltage signal, and can be converted to one or more digital signals, for example, by a signal processing circuit 2486, such as a comparator level circuit as discussed above. After being processed in the processing circuit 2486, the output signals can be provided to the controller as input signals 2434, which can provide information about the conditions of the vehicle.

In some embodiments, the jump starter device can include output terminals 2416A, such as a positive output terminal and a negative output terminal. The output terminals can be configured to be connected to terminals of a vehicle, such as to terminals of a battery of a vehicle. Alternatively, the output terminals can be configured to be connected to the vehicle without connecting to the vehicle battery, e.g., there is no battery in the vehicle or the vehicle battery is disconnected from the connection of the jump starter device with the vehicle.

The output terminals can be clamp-like terminals at the end of a cable, such as a jump start cable. Alternatively, the output terminals can be a coupler at the jump starter device configured to accept a jump start cable.

The jump starter device can further include a battery 2410 having a battery voltage. For example, the battery can be a lead acid battery, a lithium ion battery, or other types of battery. In some embodiments, the battery can include other types of portable power sources, such as fuel cell devices. The battery voltage can be 12V, and can be configured to jump start, charge, or replace a 12V battery in a vehicle. Batteries with different voltages can be used, such as a 6V battery for assisting 6V vehicles, or a 24V battery for assisting 24V vehicles, Alternatively, circuits can be used to increase or decrease the battery voltages. For example, a 12V battery can be used, with an optional step down circuit to deliver 6V for 6V vehicles or a step up circuit to deliver 24V for 24V vehicles.

An over voltage value higher than a maximum voltage of the battery can be determined based on the types and voltages of the battery. For example, for a 12V battery, a fully charged battery can achieve a maximum voltage about 14.7V. Thus, an over voltage value for a 12V battery can be about 15V or higher, such as 18V or 20V. Since the next available car battery can typically be 24V, a value less than 14V and greater than 15V can be used as the over voltage for the 12V lead acid battery. In some embodiments, the over voltage value can be used to determine if the jump starter device is suitable for assisting a vehicle. For example, a 12V jump starter device cannot be used to jump start a 24V vehicle. An over voltage detection can detect the abnormally high voltage in the vehicle, and thus can turn off the connection to the jump starter battery to prevent damage to the jump starter device.

The jump starter device can further include a controllable switch 2412 disposed between the connection of the battery terminals to the output terminals, e.g., the battery terminals are connected to the output terminals through the controllable switch.

wherein terminals of the battery is connected to the output terminals through the controllable switch so that power from the battery is delivered to the output terminals when the controllable switch is on and the power from the battery is not delivered to the output terminals when the controllable switch is off;

The controllable switch can be a SPST (single pole single throw) switch connected between the positive terminals, e.g., between the positive battery terminal and the positive output terminal. Alternatively, the controllable switch can be a SPST switch connected between the negative terminals, e.g., between the negative battery terminal and the negative output terminal. Alternatively, the controllable switch can be a DPST (double pole single throw) switch connected between the positive and negative terminals, e.g., first poles between the positive battery terminal and the positive output terminal and second poles between the negative battery terminal and the negative output terminal. Other switch configurations can be used. The controllable switch can be a switch that can be controlled, e.g., turning on or off, by an electrical signal, such a signal generated by a controller.

The jump starter device can further include a load sensor 2440, which can be a circuit configured to measure a voltage, such as at a load. The load sensor can be connected to the output terminals 2416A, and can be configured to measure voltages at the output terminals. The load sensor can be connected to the battery 2410, and can be configured to receive power from the battery.

The load sensor can be configured to measure a first voltage at the output terminals without using the battery. The load sensor can be configured to measure a second voltage at the output terminals using the battery. For example, the load sensor can include a circuit that can be optionally connected to the battery, such as through a controllable switch. The circuit can be connected to the output terminals. Thus, when the controllable switch is turned off, the battery is not connected to the circuit, and the circuit can measure a voltage at the output terminals without using the battery. When the controllable switch is turned on, the battery is connected to the circuit, and the circuit can measure a voltage at the output terminals using the battery.

Other configurations can be used, such as the load sensor can include a first circuit not connected to the battery and a second circuit connected to the battery. The first circuit can measure a voltage at the output terminals without using the battery. The second circuit can measure a voltage at the output terminals using the battery.

The voltages measured by the load sensor without and with the battery are configured to provide indications of conditions of the vehicle. For example, the load sensor can include a circuit, such as two resistors connected in series. One end of the series resistors is connected to the output terminals. The other end of the series resistors is not connected to the battery, for example, by connected to the battery through a switch that is turned off. By measuring the voltage at the series resistors, a voltage can be obtain that is indicative of the voltage of a battery of the vehicle, if there is a battery, or a zero voltage, if there is no battery or there is a shorted battery.

After turning on the switch, a voltage can be measured at the series resistors. The measured voltage can be indicative of the voltage of the vehicle, with or without the vehicle battery. The purpose of the series resistors is to limit the current from the load sensor to the output terminals, so that if there is an abnormal condition at the vehicle, such as a shorted battery, the current is not excessive to prevent damages to the jump starter device.

The measured voltages without using the battery and using the battery can provide information about the vehicle battery, if the vehicle has a battery connected to the jump starter. The measured voltages can also provide information about the vehicle when there is no connected battery in the vehicle. The combination of the measured voltages can have enough information about the condition of the vehicle to allow the jump starter device to make decision on whether or not to turn on the controllable switch to jump start the vehicle, to charge the vehicle battery, or to function as a battery replacement for the vehicle.

The conditions of the vehicle can include a first condition, or a turn-on condition, in which the controllable switch can be turned on to assist in starting or running the vehicle. The conditions of the vehicle can include a second condition, or a turn-off condition, in which the controllable switch should not be turned on, to prevent potential damages to the jump starter device or to the vehicle. In some embodiments, the jump starter device can include a manual override to override the response of the controller based on the turn-off condition, to account for unexpected situations, e.g., situations not covered by the present programming of the controller.

The turn-on condition analyzed from the measured voltages can include a jumpable condition, e.g., a condition in which the jump starter device is suitable to jump start or charge the vehicle. The jumpable condition can indicate a proper polarity connection between the vehicle terminals and the output terminals, and can also indicate a voltage suitability for the battery and a battery of the vehicle. For example, the first voltage and the second voltage can be a positive value and less than or equal to the over voltage value.

In some embodiments, the turn-on condition can further include a replaceable condition in which the jump starter device is suitable to be used as a replacement battery for the vehicle. The jump starter device can be used as a replacement battery for the vehicle, in cases there is no battery in the vehicle.

For example, the vehicle battery can be missing in the vehicle. The jump starter device can be connected to the vehicle, e.g., to the terminals supposedly to be connected to the vehicle battery. The jump starter device can detect the replacement condition, and can turn on the controllable switch to allow the battery of the jump starter device to operate as the vehicle battery, to keep the vehicle running. The jump starter device can have a compact form factor, e.g., small size, to allow the jump starter device to be placed, such as be secured, to the vehicle to keep the vehicle running. The controller can be programmed to allow the jump starter device to operate as a replacement battery, in addition to let the jump starter device to jump start the vehicle or to charge the vehicle battery.

Alternatively, the vehicle battery can be severely damaged, such as shorted, so that the presence of the vehicle battery in the vehicle can impede the operation of the vehicle. The vehicle battery can be removed, and the jump starter device can be connected to the vehicle to function as a battery replacement.

The replaceable condition can indicate an absence of a battery in the vehicle and a proper polarity connection between the vehicle terminals and the output terminals. The indication can be determined by the first voltage being in a vicinity of a zero value, and the second voltage being less than the battery voltage and greater than a zero equivalent value, with the zero equivalent value being a value of the second voltage when the vehicle terminals are connected to a shorted battery. The zero equivalent value can be a value in the short battery range measured by the active voltage sensor.

In some embodiments, the replacement condition can overlap the jumpable condition, for example, when the vehicle battery is not good enough to maintain the vehicle in running condition. For example, if the vehicle battery is severely depleted, the jump starter device can assist in jump start the vehicle, but the vehicle battery might not be able to sustain the running condition when the jump starter device is removed, for example, because the vehicle battery is severely depleted so that it is difficult to recharge the vehicle battery to an operating condition. The jump starter device then can function as a battery supplement, e.g., installed in parallel with the vehicle battery to function as the vehicle battery.

The turn-off condition analyzed from the measured voltages can include an open circuit condition in which there is an open circuit between the vehicle terminals and the output terminals. The open circuit condition can indicate an open connection between the vehicle terminals and the output terminals. The open circuit condition can be determined by the first voltage being in a vicinity of a zero value, and the second voltage being comparable with a voltage of the battery of the jump starter device.

In some embodiments, the voltage of the battery of the jump starter device can be predetermined and stored in a memory to be accessed by the controller. For example, a 12V jump starter device can have a value of 12V stored as the voltage of the battery of the jump starter device.

In some embodiments, the voltage of the battery of the jump starter device can be determined, such as measured from the battery, For example, a load sensor can include a circuit configured to measure a voltage of the battery of the jump starter device. An advantage of the circuit can include a monitoring of the battery of the jump starter device, and can provide indicator to a user to recharge the jump starter device when the voltage is below a threshold.

The turn-off condition analyzed from the measured voltages can include a short condition in which a battery of the vehicle is shorted. The short condition can indicate that a shorted battery of the vehicle is connected to the output terminals, and can be determined by the first voltage being in a vicinity of a zero value, and by the second voltage being in a vicinity of the zero equivalent value.

The turn-off condition analyzed from the measured voltages can include a reverse polarity condition in which there is a reverse polarity connection between the vehicle terminals and the output terminals. The reverse polarity condition can indicate a presence of the battery of the vehicle and a reverse polarity connection between the vehicle terminals and the output terminals, and can be determined by the first voltage being a negative value, and by the second voltage being less than the zero equivalent value.

In some embodiments, the turn-off condition can further include an over voltage condition in which the vehicle comprises a battery having a voltage higher than a highest voltage exhibited by the battery after being fully charged. The over voltage condition can indicate that the jump starter device is connected to the vehicle battery, and that the vehicle battery has an over voltage value. The over voltage condition is determined by the second voltage is over the over voltage value.

In some embodiments, the turn-off condition can further include a non-replaceable condition indicating an absence of the vehicle battery in the vehicle and a reverse polarity connection between the vehicle terminals and the output terminals. The non-replaceable condition can be determined by the first voltage being in a vicinity of a zero value, and by the second voltage being in a vicinity of the zero equivalent value.

In some embodiments, the load sensor can include a circuit connected to the output terminals and to the battery through a different controllable switch, e.g., the switch can be configured to toggle connection to battery. The circuit can be configured to measure the first voltage with the controllable switch turning off. The circuit can be configured to measure the second voltage with the controllable switch turning on. The first and second voltages can provide indications of conditions of the vehicle, e.g., determining the condition of the vehicle among the possible conditions as listed above.

The controllable switch can be coupled to the controller to be controlled by the controller to toggle between the first and second voltages. Alternatively, the controllable switch can be coupled to an oscillator to generate repeated sequences of the first and second voltages. The oscillator circuit can be controlled by the controller, for example, to start or stop, or to control a period of the oscillation, such as the time the oscillator output is high enough to turn on the switch, or the time the oscillator output is low enough to turn off the switch.

In some embodiments, the circuit can include a voltage divider circuit connected to the output terminals, and to the battery through a controllable switch. The circuit can include a series of resistors, e.g., a first resistor connected to a second resistor. The second resistor can be connected to an output terminal of the output terminals. The first resistor can be connected to the battery through the controllable switch. The circuit can be configured to provide the first voltage at a point between the first and second resistors when the second controllable switch turning off. The circuit can be configured to provide the second voltage at a point between the first and second resistors when the second controllable switch turning on.

In some embodiments, the circuit can include a third controllable switch to toggle connection to vehicle battery, e.g., toggle the connection to the output terminals, in addition to the second controllable switch which can toggle connection to the battery of the jump starter device. In this configuration, the circuit can be configured to measure the first voltage with the second controllable switch turning off and the third controllable switch turning on. The circuit can be configured to measure the second voltage with the second controllable switch turning on and the third controllable switch turning on. The circuit can be configured to measure a third voltage indicating a voltage of the battery with the second controllable switch turning on and the third controllable switch turning off.

In some embodiments, the load sensor can include multiple circuits, such as 2 circuits, with each circuit configured to measure a different voltage at the output terminals. For example, the load sensor can include a first circuit connected to the output terminals, which can be configured to measure the first voltage. The load sensor can include a second circuit with the second circuit is connected to the battery and also connected to the output terminals. The second circuit can be configured to measure the second voltage.

In some embodiments, the load sensor can include more than 2 circuits, such as 3 circuits. In addition to the first and second circuits described above, the load sensor can include a third circuit connected to the battery, which can be configured to measure a third voltage indicating of a voltage of the battery.

In some embodiments, the load sensor can include a polarity swap circuit, which can be configured to toggle the polarity of the measure first and second voltages. For example, the circuit of the load sensor, as described above, can be connected to the output terminals through a controllable polarity swap. The polarity of the polarity swap can be controlled by the controller or by an oscillator, e.g., to determine the polarity of the first and second voltages.

In some embodiments, the load sensor can include a voltage comparator, which can allow the measured first and second voltages to be converted to multiple voltages based on different voltage ranges as determined by the conditions of the vehicle. For example, the output of the load sensor can be connected to the controller through a voltage comparator, with the voltage comparator configured to convert the first or second voltages into multiple voltage ranges.

The jump starter device can further include a controller. The controller can be connected to the load sensor to receive the first and second voltages. The controller can be configured to analyze the first and second voltages to determine a condition of the conditions of the vehicle, e.g., a vehicle condition among the conditions indicative of the first and second voltages.

The controller can be connected to the controllable switch to control the controllable switch, such as providing an electrical signal to turn on the controllable switch, or to turn off the controllable switch, for example, by providing an electrical signal to turn off, or by stopping the turn-on electrical signal. The controller can be configured to turn on the controllable switch under the first condition, e.g., under the vehicle condition in which the jump starter device can be turned on, e.g., turning on the controllable switch to connect the battery to the output terminals to deliver power to the vehicle.

The controller can be configured to analyze the first and second voltages to determine a condition of the conditions of the vehicle, e.g., among the different conditions of the vehicle. The controller can be configured to turn on the controllable switch when detecting the replaceable condition or the jumpable condition. The controller can be configured to turn off, or to maintain the controllable switch in an off state (e.g., do nothing if the switch is already in the off state), or not turn on the controllable switch, when detecting the over voltage condition, the open circuit condition, the shorted condition, or the reverse polarity condition.

In some embodiments, the jump starter device can be configured to turning off the switch before connecting the output terminals of the jump starter device to the terminals of the vehicle. For example, the controller can be programmed to turn off the switch during the initialization step, after the jump starter device is turned on.

In some embodiments, the jump starter device can further include indicators connected to the controller to provide indication of the conditions of the vehicle. The controller can be configured to turn on the indicators based on the conditions of the vehicle.

In some embodiments, a method to operate the jump starter device can include connecting output terminals of a jump starter device to terminals of a vehicle. The controller can be programmed to measure a first voltage at the output terminals, which are connected to the vehicle terminals, with the first voltage measured without using a battery of the jump starter device. For example, the controller can decouple the battery of the jump starter device with a measurement circuit before measuring the first voltage, for example, by turning off a switch connecting the measurement circuit to the battery of the jump starter device.

The controller can further be programmed to measure a second voltage at the output terminals, with the second voltage measured using a battery of the jump starter device. For example, the controller can couple the battery of the jump starter device with the measurement circuit before measuring the second voltage, for example, by turning on the switch connecting the measurement circuit to the battery of the jump starter device.

The controller can further be programmed to analyze the first and second voltages to determine a condition among multiple conditions of the vehicle, with the multiple conditions of the vehicle including an open circuit condition, a short condition, a reverse polarity condition, and a jumpable condition. In some embodiments, the multiple conditions of the vehicle can further include an over voltage condition, a replaceable condition, and a non-replaceable condition.

A jump starter with diagnosis function

In some embodiments, the jump starter device can be configured with a diagnostic function, to allow the jump starter to detect any potential problems with the battery, in addition to problems with the vehicle.

The jump starter with a battery or vehicle diagnosis function can be used to assess the vehicle, in addition to jump starting the vehicle. For example, when a vehicle cannot start, such as due to a failure of the battery, the jump starter can be used to start the vehicle. The jump starter can also be used to judge whether the car battery, together with other components of the vehicle, is damaged. With the jump starter having a battery diagnosis function, a user can quickly and efficiently detect the health status of the battery after starting, so as to decide whether to replace the battery.

The jump starter with a diagnostic function can be used to diagnose the car battery, such as to detect the car's internal resistance, CCA (cold cranking amps), battery life, load capacity of the battery, and other key parameters to judge whether the car battery needs to be maintained or replaced. In addition, the diagnostic function can allow the user to detect whether there are abnormal problems in the car, such as in the starter motor or in the generator. The jump starter can also be used to test conditions of the vehicle, such as texting conditions of the battery, starter, and alternator, to perform periodic vehicle maintenance. A combination of a jump starter with a diagnostic function can allow the user to purchase and maintain a single device that can perform the desired diagnostic tests that are currently being performed by the separate devices.

The jump starter device with a diagnostic function or capability can provide a multi-functional vehicle emergency service, which integrates two automotive emergency functions of emergency start-up and car diagnosis in a small size and lightweight configuration for easy to carry. The combination jump starter device can start a car and also can diagnose conditions of car components, which perfectly integrates the two functions commonly used in automotive emergency start-up products. In addition, the overall size of the combination jump starter device is small and light weight to be convenient to carry.

In some embodiments, the jump starter device with a diagnostic function can include components of a jump starter as described above with respect to a jump starter device without the diagnostic function. For example, the jump starter components can include an internal power supply module which includes a battery such as a lithium ion battery, connectors for connecting to terminals of a vehicle, a switch circuitry coupled between the internal power supply and the connectors, a load sensor for detecting status of the vehicle based on measured voltages, and a controller for controlling the switch circuitry based on the detected status of the vehicle. The jump starter components can include an input and output interface, such as a display for entering and showing setpoints and status of the jump starter device.

The jump starter device with a diagnostic function can be programmed to provide conditions of the vehicle through the measured voltages performed by the load sensor. For example, the load sensor can be configured to sample the voltages of the battery for a short time, such as for a few minutes. The values and changes of the battery voltages can enable a diagnosis of the battery, the starter, and the alternator of the vehicle.

The jump starter device with a diagnostic function can include a diagnostic circuit configured to measure various data of the vehicle, such an internal resistance of the battery. The internal resistance can be an indicator of the battery health, such as a capacity and remaining life of the battery.

The diagnostic circuit can include a current measurement circuit configured to measure currents in the vehicle, such as currents delivered by the battery during a vehicle start up or running. The measured current, together with the measured voltages, can be process to provide a diagnosis of the vehicle, including the battery, the starter motor, and the alternator motor.

The jump starter device with a diagnostic function can be configured to perform a diagnosis of a vehicle, including battery related components such as the battery, the starter, and the alternator. For example, the jump starter device can perform battery related tests including testing to determine the battery states of charge and health (SOC & SOH), the battery voltage drop during cranking, the battery Cold Cranking Amps (CCA), the alternator current output (to diagnose under or overcharging), the alternator voltage and ripple (to diagnose blown diodes), the starter motor coil resistance (to diagnose motor winding faults), and the battery-to-starter motor cable volt drop and resistance.

In addition, the jump starter device with a diagnostic function can be configured to perform a diagnosis of other components of the vehicle, such as the engine health and performance system tests, injector tests, compression, pressure and system leak tests, and hydraulic tests. For example, the jump starter device can include accessories, such as pressure transducer to measure engine air intake, exhaust and fuel system pressures.

The jump starter device with a diagnostic function can include a housing for containing the jump starter components and the diagnostic components. External elements can be included, such as cables for connecting to the vehicle for measuring battery voltages, and optionally cables for connecting to battery wires to measure currents.

In operation, to jump start a vehicle, the controller can assess the status of the vehicle, for example, through a load sensor circuit. Upon determining a suitable status, as discussed above with respect to the jump starter operation, the controller can turn on the jump starter switch that electrically connects the internal power supply to the output connectors to jump start the vehicle.

Before or after jump starting the vehicle, the jump starter can assess the conditions of the vehicle, including the conditions of the battery, the starter motor, and the alternator motor. The assessment can allow a determination of repairing or replacing the affected components.

For example, before jump starting the vehicle, the jump starter can measure the battery voltage. The battery voltage can provide an indication of the battery status, e.g., whether or not the battery is good, bad, chargeable, repairable, or needed to be replaced. Further, from the measured battery voltage, the jump starter can determined a status of charge of the battery, for example, through a look up table relating the battery voltage to the battery status of charge. Battery information can be provided to the starter to allow an accurate assessment of the status of charge, since there are differences between different batteries and battery manufacturers For example, for a 12V lead acid battery, which is typical for a passenger vehicle, a battery voltage above 12.6V can indicate a good battery. The indication of a good battery can show that the vehicle problem can be with the starter motor instead of with the battery. A battery voltage between 8 or 10 V to 12.6V can indicate a chargeable battery, e.g., a jumpable condition. A low battery voltage, such as lower than 8 or 10 V, can indicate a severe depleted battery, which might need to be replaced.

After jump starting the vehicle, the measured battery voltages can provide a charging rate of the battery, indicated by an increase in the battery voltage. For example, the vehicle can run until the battery voltage is higher than 12.6V, such as about 13.6V, which indicates an alternator charging battery voltage. After the vehicle stops, the battery voltage can drop to between 13.6 and 12.6V, which indicates a good battery.

Other data can be obtained from the vehicle using the jump starter diagnostic circuit, such as the internal resistance of the battery, and the currents to the starter and alternator during the starting and running of the vehicle.

The jump starter can include a display module to display the status of the jump starter and the vehicle in either jump starter mode or diagnostic mode. For example, the display can be configured to show the measured voltages as a function of time, or the status of the vehicle based on the measured voltages, such as the conditions of the battery, the starter, and the alternator.

The jump starter device can include auxiliary functions, such as a power module, which can include a charging circuit for charging the internal power supply, such as charging from the house AC power, charging from the 12 VDC cigarette lighter socket, or charging from USB type connectors such as USB type C charging. The power module can be configured to provide power outputs, such as 12 VDC or 5 VDC power output, using cigarette lighter or USB port outputs. The auxiliary functions can include a light source, such as a LED module with selectors for steady light, flight light, or SOS light mode. The additional features can include input and status output, such as a power button, a power LED, error LEDs, battery level LEDs, light mode switch and LED, charger LED, power out LED, and manual override buttons and LEDs.

The jump starter device can include additional features, such as an input module, for example, programming buttons or other inputs to allow a user to establish the preset data, such as the battery information. The preset battery information can be pre-programmed for popular batteries. Battery temperature can be inputted to the jump starter, or the jump starter can include a temperature sensor for measuring the battery temperature.

The additional features can include multiple manual switches to override the automatic operation of the jump starter, such as manually turning on the jump starter switch to override the controller. For example, based on the load sensor data, the controller can determine that it is not suitable to turn on the jump starter switch. The manual switch can be used to override the controller decision, e.g., to turn on the jump starter switch if the operator decides it is appropriate to do so.

The additional features can include DC or AC charging circuit for charging the internal power supply. For example, the charging circuit can be configured to charge the internal power supply during the air pumping process.

The additional features can include a cooling module, such as a fan for cooling the jump starter, such as for cooling the internal power supply, the controller, or the jump starter switch. The cooling module can be automatic, e.g., based on a preset temperature using an internal temperature sensor. The cooling module can be set for cooling the jump starter components before, during or after use.

A battery diagnosis can include a measurement of the state of charge (SOC) and an estimate of the state of health (SOH) of the battery. The state of health (SOH) of a battery represents a measure of the battery's ability to store and deliver electrical energy, compared with a new battery.

The state of charge (SoC) is defined as the available capacity (in Ah), e.g., the amount of electrical charges stored in the battery, and expressed as a percentage of its rated capacity. Thus, the value of the SOC varies between 0% and 100%. If the SOC is 100%, then the battery is said to be fully charged, whereas a SOC of 0% indicates that the battery is completely discharged. In practical applications, the SOC is not allowed to go beyond 50% and therefore the battery is recharged when the SOC reaches 50%. Similarly, as a battery starts aging, the maximum SOC starts decreasing. This means that for an aged battery, a 100% SOC would be equivalent to a 75%-80% SOC of a new battery.

Usually, SoC cannot be measured directly but it can be estimated from direct measurement variables, such as from a reading of the battery voltage. For example, the battery voltage value is related to SoC through a known discharge curve (voltage vs. SoC) of the battery. The discharged curve is affected by the battery current (due to the battery's electrochemical kinetics) and temperature. This method can be made more accurate by compensating the voltage reading by a correction term proportional to the battery current, and by using a look-up table of battery's open circuit voltage vs. temperature.

The battery diagnosis can include a measurement of the capacity of the battery, which is the coulometric capacity, e.g., the total Amp-hours available when the battery is discharged at a certain discharge current from 100 percent state-of-charge to the cut-off voltage. Capacity is calculated by multiplying the discharge current (in Amps) by the discharge time (in hours) and decreases with increasing C-rate.

The battery diagnosis can include a measurement of the Cold Cranking Amps (CCA), which is the number of amps a fully charged battery can produce at 0 degrees Fahrenheit over 30 seconds while maintaining at least 7.2 volts.

The battery diagnosis can include a measurement of internal resistance of the battery, which is dependent on the battery state of charge and can provide an indication of the battery efficiency. For example, as internal resistance increases, the battery efficiency decreases and thermal stability is reduced as more of the charging energy is converted into heat.

Figure 25:
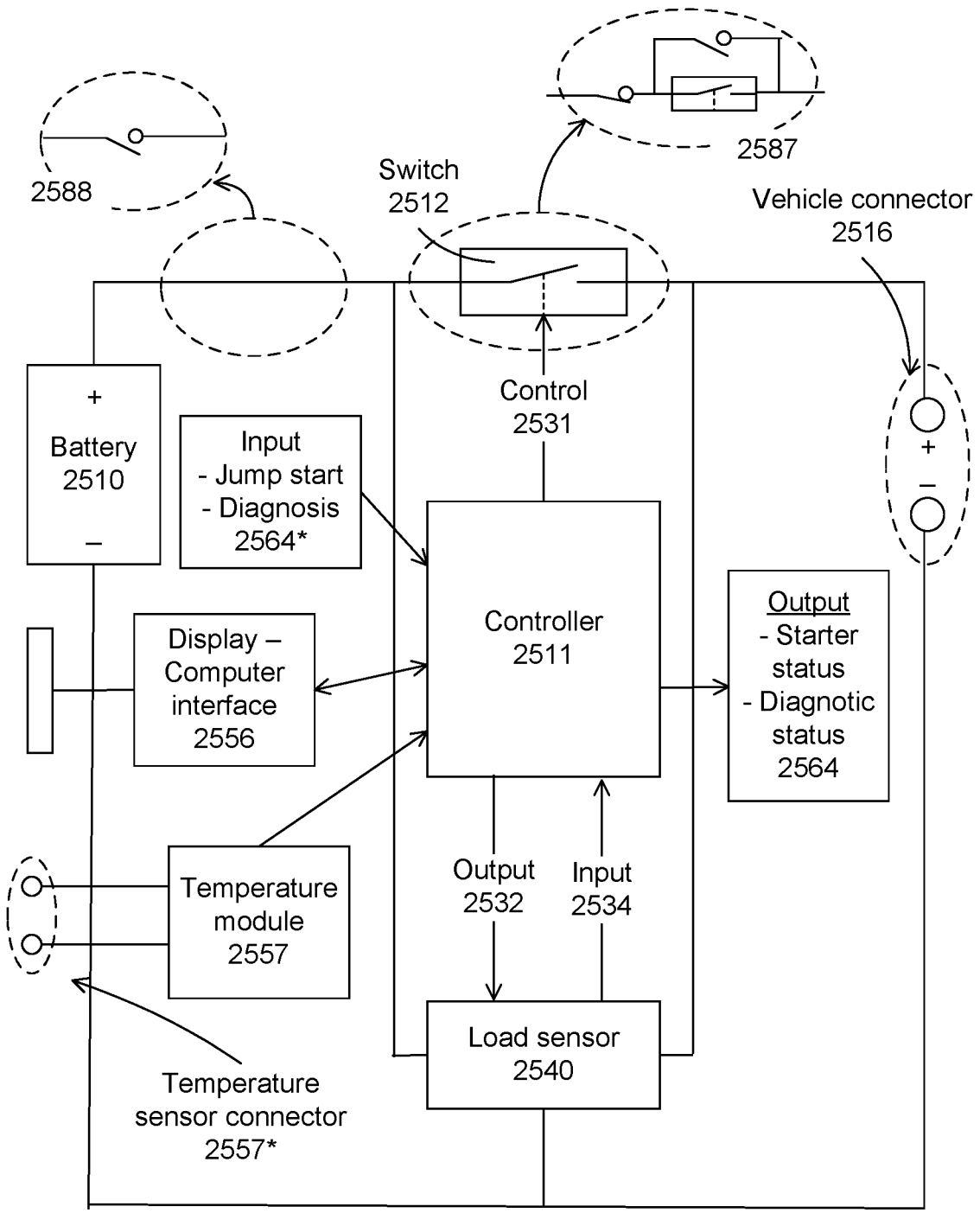
FIG. 25 illustrates a configuration for a jump starter device with a diagnostic function according to some embodiments.

FIG. 25 illustrates a configuration for a jump starter device with a diagnostic function according to some embodiments. The jump starter is configured to use a load sensor for measure voltages of the battery for a specified period of time. The measured voltages are configured to determine a status of the battery with respect to a jump starter operation, and also configured to determine conditions of the battery, such as a status of charge and a capacity of the battery.

The jump starter device with a diagnostic function can include a jump starter section, including a battery 2510 which can be configured to supply power to the jump starter section. The jump starter section also includes a controller 2511 which can be configured to receive input data and supply output instructions to the jump starter section. The jump starter section also includes a display 2564 which can be configured to display input and output data for the jump starter section and the diagnostic data.

The jump starter section can include a switch 2512, e.g., a jump starter switch, configured to control the connection of terminals of the battery 2510 with connectors 2516 of the jump starter device, which is configured to connect to terminals of the vehicle, such as with terminals of the vehicle battery. The switch can be a single switch, coupled to a terminal of the battery, such as a positive terminal as shown. Alternatively, the switch can be coupled to a negative terminal of the battery. The switch can be a double switch, coupled to two terminals of the battery.

A load sensor 2540 can be configured to sample the vehicle voltage from the positive terminal of the vehicle. The load sensor 2540 can be configured to receive a power source, such as from the battery 2510 of the jump starter device. The load sensor can include circuits to measure the voltages at the vehicle connector 2516 with or without using the power source of the battery. For example, an enabler circuit can be used to control the application of the power source to the load sensor, and can be activated or deactivated with a control output signal 2532 from the controller 2511. When the controller 2511 activates the enabler circuit, the load sensor can receive power from the jump starter battery 2510, which can turn the load sensor into an active voltage sensor. When the controller 2511 deactivates the enabler circuit, the load sensor does not have an external power source, which can make the load sensor to behave like a passive voltage sensor. Alternatively, the load sensor can include two circuits, one connected to the battery and one not connected to the battery.

The switch 2512 can be controlled by a control output 2531 from the controller 2511, based on the input data 2534 from the load sensor. For example, after receiving the input data 2534, which can include voltage values measured at the connectors 2516 with and without the battery power, the controller can determine the status of the vehicle in order to decide whether or not to turn on the switch 2512.

The controller 2511 can be configured to sample the voltages at the vehicle connector, e.g., at the battery of the vehicle coupled to the connector, for a period of time, such as for a few minutes such as 1, 2, 3, or 5 minutes. For example, the load sensor circuit can be controlled by the controller, which can issue control signals to the load sensor to periodically sample the battery voltages. The controller can perform voltage sampling at a frequency of less than a few hundreds cycles per second, such as less than 200 Hz, less than 100 Hz, or less than or equal to 50 Hz. The controller is also configured to process the sampled voltages to determine a condition of the battery and other components of the vehicle.

The jump starter device can include an input module 2564*, which is configured to select a jump starter function or a diagnostic function. In addition, the input module can be configured to accept user inputs, including inputs for the jump starter section and inputs for the diagnostic function. For example, the diagnostic inputs can include data for the battery, such as rating of the battery, make and year of the battery. Temperature of the battery, such as temperatures at the outer case of the battery, can be inputted to the controller through the input module, to enable an accurate determination of the battery conditions.

Alternatively, a temperature module 2557 can included to allow a measurement of the battery temperature. An external temperature can be coupled to the outer case of the battery, with the leads of the temperature sensor connected to the temperature module through the temperature sensor connector 2557*.

The jump starter device can include an output module 2564, which can include several lights such as LEDs or a display, and which can be configured to show the status and results of the jump starter operation and the diagnostic function. For example, the output module can be configured to show a table showing conditions of the battery, and a voltage curve showing the battery voltages as a function of time.

The jump starter device can include an interface module 2556 for coupling to an external display or a computer. The external display can be configured to show more data using a large screen, as compared to a smaller display in the jump starter device. A program can be run on the computer, complementing the controller functionality.

An override button can be used to override the output control signals from the controller, such as manually override buttons can be included to override the settings imposed by the controller. For example, there can be some exceptional situations that are outside the normal operation of the jump starter device, such as for testing purpose. Even though the jump starter device is not connected to a vehicle, leading to the switch 2512 open, an operator can use the override buttons to make a connection across the switch.

The override buttons can include a manual hardwire switch, which can be disposed in parallel with the switch 2512. By close the parallel manual switch, there is a connection across the switch 2512, providing an effective close configuration for the switch 2512. Alternatively or additionally, the override buttons can include a manual switch disposed in series with the switch 2512. The serial manually switch can be in normally-close configuration to not affect the operation of the jump starter device. By open the serial manual switch, there is an open circuit along the switch 2512, providing an effective open configuration for the switch 2512.

The override button can include a manual software switch, which is a manual switch coupled to the controller. The controller is programmed change the normal operation, e.g., overriding the current settings, based on the status of the override manual software switch. For example, the control signal 2531 also depends on the status of the override buttons, in addition to the voltage input 2534 received from the load sensor 2540.

The override buttons can be normal switches or momentary switches. For normal switches, the override operation is effective until the operator changes the switch configuration. For momentary switches, the override operation is only effective when the operator pushes the switch. When the operator releases the switch, the override operation is terminated.

The override buttons can include one or more manual hardwire switches, disposed in parallel and in series with the switch 2512. As shown, a switch configuration includes a parallel and a serial switches 2587 for the switch 2512. Other configurations can be used.

The override buttons can include one or more manual hardwire switches, disposed at or near the battery 2510 to cut off or to allow the switch 2512 to be connected to the battery 2510.

FIGS. 26A-26D illustrate a diagnostic function of the jump starter according to some embodiments. The jump starter can be configured to sample voltage data at the vehicle battery before and after starting the vehicle. An advantage of the jump starter with a diagnostic function is the ability to diagnose a vehicle battery when the vehicle does not start. Without the jump starter function, a diagnostic system can show a dead battery. With the jump starter function, a diagnostic system can jump start the vehicle to evaluate whether the battery can be charged, whether there is a problem at the starter or the alternator.

Figure 26A:
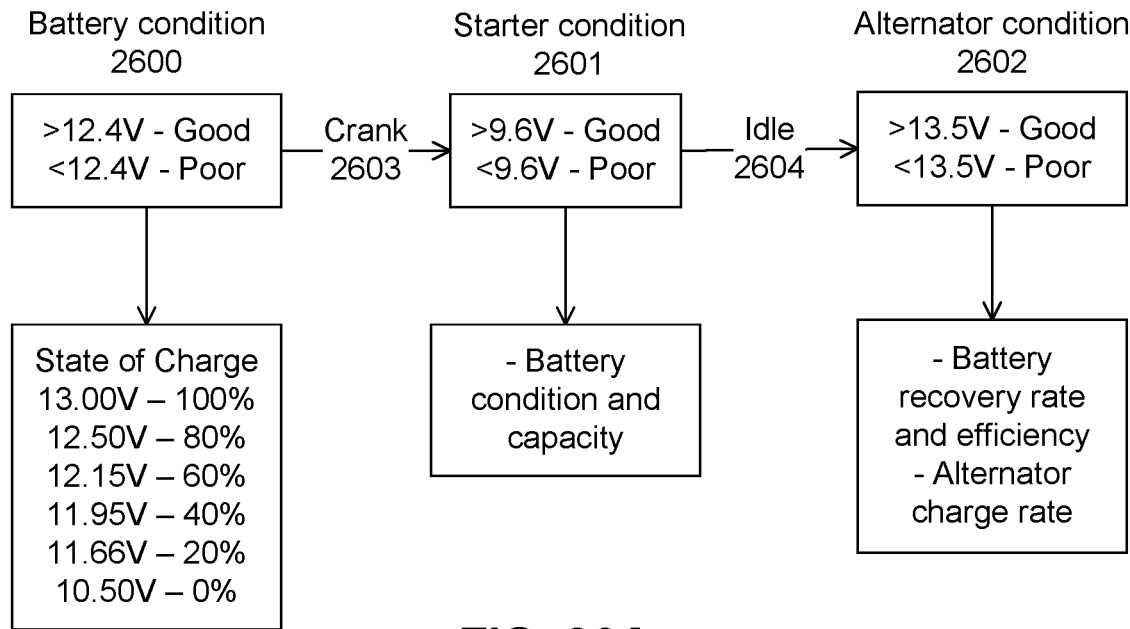
FIGS. 26A-26D illustrate a diagnostic function of the jump starter according to some embodiments.

FIG. 26A shows a diagnosis of a jump starter with a diagnostic function based on a sampling of the battery voltage. The jump starter is connected to a battery of a vehicle, and a battery voltage can be obtained. The battery voltage can provide an indication of the condition 2600 of the battery, such as a good 12V lead acid battery should have a voltage higher than a threshold, such as 12.4V. A voltage lower than 12.4V can indicate a poor battery. Knowing the battery type and manufacturer, a look up table can be used to obtain a state of charge of the battery, such as a battery voltage of 13V can indicate a 100% state of charge, and a battery voltage of 10.5V can indicate a 0% state of charge, or a completely depleted battery.

The vehicle can be started, either by its own battery or by the jump starter. The cranking action 2603 can provide information 2601 on the starter and further information on the battery, such as the battery capacity. During the cranking, the battery voltage drops due to a high current running through the starter. A small voltage drop indicates a high battery capacity, meaning a small battery portion is used in the cranking action. A large voltage drop indicates a low battery capacity, meaning a large battery portion is used in the cranking action. For example, higher than about 3V drop, e.g., the battery voltage drops to be lower than 9.6V can indicate a poor battery, e.g., a battery with low capacity.

The 3V or 9.6V value is a typical value, which also depends on the sampling rate of the voltage, such as 50 Hz. For higher sampling rate, the voltage drop can be 5V or a battery voltage of about 8V.

The vehicle can be idling 2604, e.g., continues running. The battery voltages obtained during the idling action 2604 can provide information 2602 on the alternator, such as the alternator charging rate, and on the battery, such as the battery recovery rate and battery efficiency. For example, the battery voltage can gradually increase to about 13 or 13.5V, which indicates a fully charged battery. The rate of voltage increase can show the charging ability of the battery.

Figure 26B:
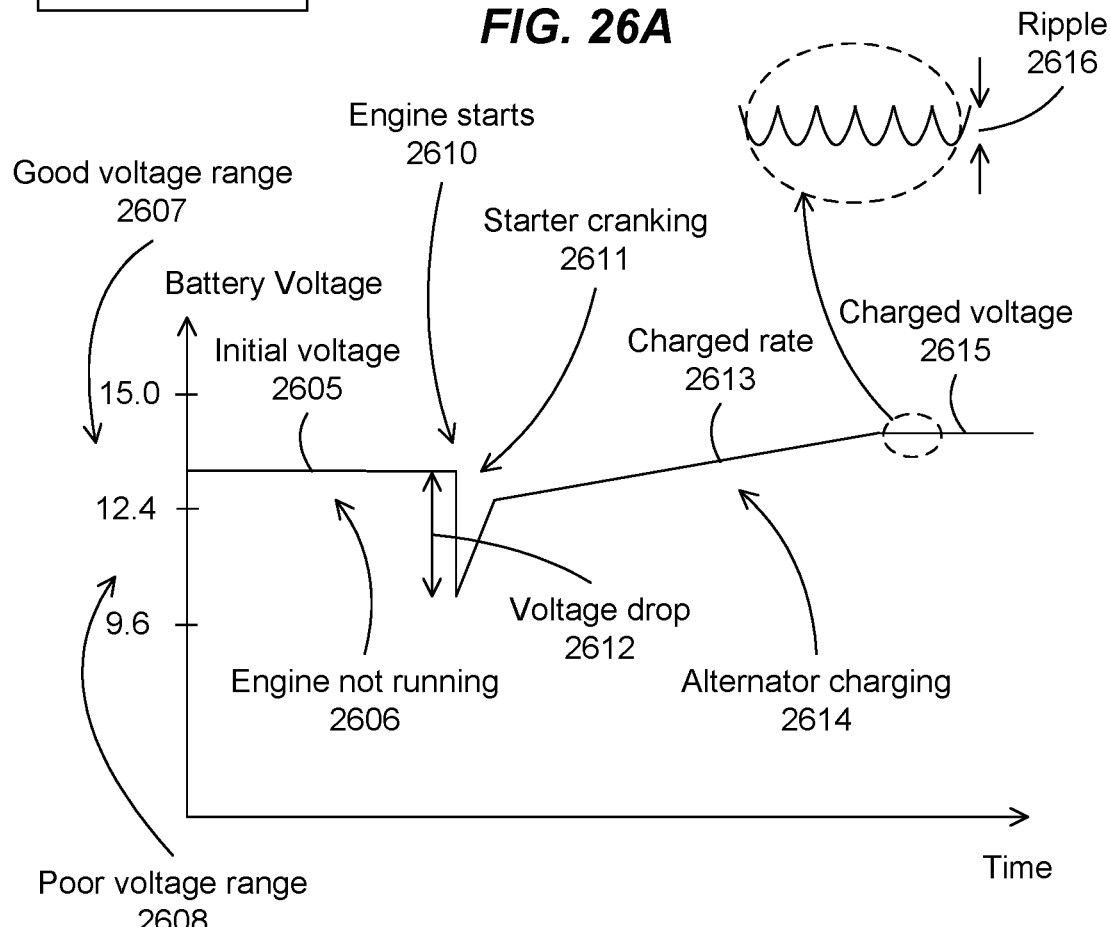

FIG. 26B shows a voltage sampling curve for a good vehicle, e.g., a vehicle without a need of a jump starter device. The jump starter is connected to the battery of the vehicle, with the jump starter function inactivated, e.g., the switch coupled between the power supply or battery of the jump starter with the vehicle battery is decoupled or not connected. The turning off of the jump starter function can be activated by a manual switch, disabling the jump starter function. The diagnostic function can be turned on or can be automatically turned on, e.g., turned on as a default condition.

When the vehicle is not running 2606, the jump starter can measure the vehicle battery voltage 2605. The measured voltage can provide an indication of the battery, such as a good battery voltage range 2607 of 12.4 0 15V, and a poor voltage range 2508 of lower than 12.4V. The voltage values are showing as an example, with the actual values depending on the batteries, such as battery types. The battery voltage can be used to provide a state of charge of the battery, for example, by using a look up table.

The starter motor can start 2610, for example, by the user turning on the ignition system. Other consideration can be added, such as providing that the engine cranks 2611 without starting, to obtain data for the cranking process. Alternatively, the starter motor can start with the ignition enabled.

When the vehicle is cranking, the battery voltage can drop, with a battery drop value 2612, due to a large current running through the starter motor. The voltage drop is proportional to the amount of charges provided by the battery, thus a large drop, such as larger than a threshold such as 3V, can indicate a battery with low capacity, e.g., a poor battery that needs to be recharged, repaired or replaced.

The vehicle can continue running, either idling or with the engine running at a high rpm, such as 2000 or 2500 rpm. The voltage values show an increase, indicating a charging rate 2613 due to the alternator charging 2614. The voltage increase can provide an indication of the recovery rate and the efficiency of the battery based on the charging. The voltage increase can also provide an indication of the status or condition of the alternator, e.g., how well the alternator is charging the battery. After a period of time, the battery can be fully charged, e.g., recovering the amount of charges used by the starting and cranking process. The charged voltage 2615 can provide an indication of the battery, showing how well the battery is charged.

Seeing in detail, the voltage curve can show ripples 2616, which can provide information about the alternator such as the diodes in the alternator.

The voltage curve can be shown on the display. The condition of the battery, starter motor, or alternator motor can be processed from the voltage curve, and can also show to provide a diagnosis of the vehicle.

Figure 26C:
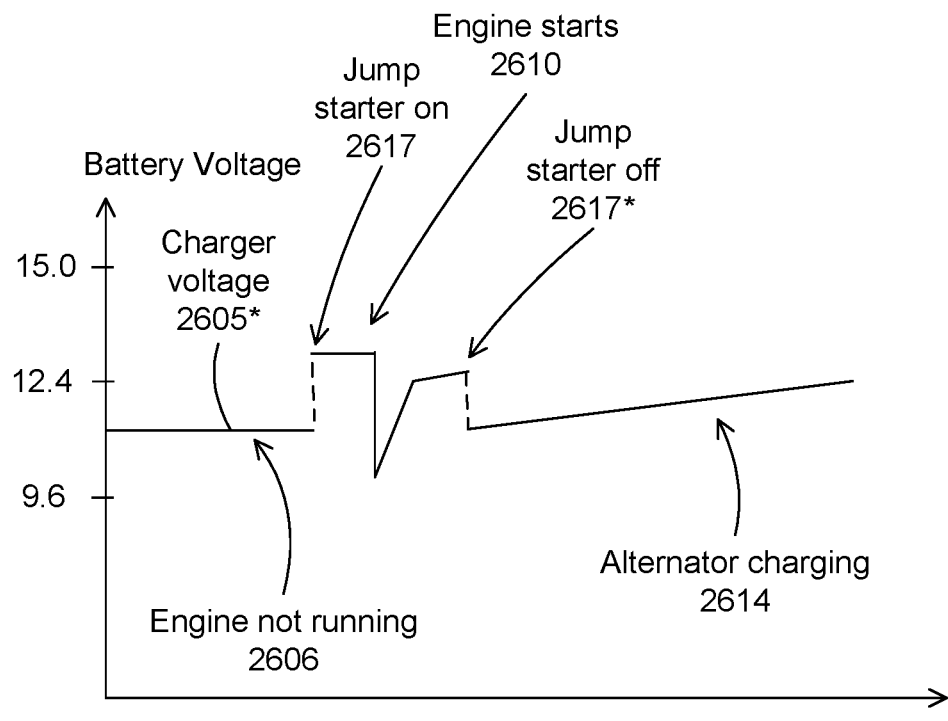

FIG. 26C shows a voltage sampling curve for a bad vehicle, e.g., a vehicle with a need of a jump starter device. The jump starter is connected to the battery of the vehicle, with the jump starter function inactivated.

When the vehicle is not running 2606, the jump starter can measure the vehicle battery voltage 2605. The measured voltage can provide an indication of the battery, including a state of charge of the battery. If the measured battery voltage 2605* is a good voltage, e.g., a voltage between 12.4-15V which is indicative of a good battery, it is like that the problem with the vehicle is at the starter motor, which causes the engine not started.

If the measured battery voltage 2605* is a poor voltage, e.g., a voltage lower than 12.4 V which is indicative of a poor battery, the jump starter can assist in jump starting the vehicle. The jump starter is then turned on 2617, e.g., the switch connecting the jump starter battery to the vehicle connector is connected. The voltage value can increase to a good value of between 12.4 and 15V, which is the voltage of the jump starter battery.

The engine can starts 2610, using the jump starter to provide power for the starter motor. There can be a drop in the voltage, which is indicative of the capability of the jump starter battery.

The jump starter can be turned off 2617*, e.g., turning off the switch connecting the jump starter battery to the vehicle connector.

The vehicle can continue running. The voltage values can show an increase, which can provide an indication of the recovery rate and the efficiency of the battery based on the charging. The voltage increase can also provide an indication of the status or condition of the alternator. After a period of time, the battery can be fully charged.

The vehicle can stops, and then start again to obtain a voltage drop of the vehicle battery, which can provide an indication of the vehicle battery capacity, as discussed above. The voltage curve can be shown on the display.

Figure 26D:
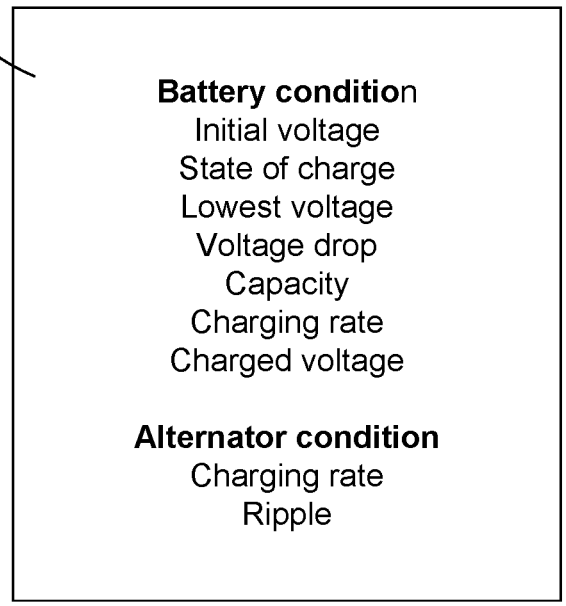

FIG. 26D shows diagnostic results, processed from the measured voltages values, to provide conditions of the battery and of the alternator motor. The diagnostic results 2618 can be shown in a display, which can include raw data and processed data, such as the initial voltage of the battery before jump starting, the state of charge of the battery, the lowest voltage during the vehicle cranking period, the capacity of the battery, the charging rate and the final charged voltage of the battery. The conditions of the alternator can include the charging rate provided by the alternator, and the ripple value indicative of the diodes performing the rectifying action.

FIGS. 27A-27B illustrate flow charts for operating a jump starter with a diagnostic function according to some embodiments. In FIG. 27A, operation 2700 connects a jump starter with battery diagnostic to a battery of a vehicle. The jump starter portion is turned off, with the load sensor portion turning on to measure voltages at the vehicle connector, e.g., voltages of the vehicle battery.

Operation 2701 obtains a voltage of the battery of the vehicle. Operation 2702 determines a state of charge of the battery based on the battery voltage, for example, by a look up table or a function relating the state of charge to the battery voltage.

Operation 2703 starts the vehicle. Alternatively, the vehicle is cranked without starting. Operation 2704 obtains a drop of voltage at the battery when the vehicle starts. Operation 2705 determines a capacity of the battery based on the voltage drop. Operation 2706 determines a condition of a starter motor based on the voltage drop.

Operation 2707 obtains a rate of increase of the battery voltage after the vehicle starts. Operation 2708 determines a charging rate of the battery based on the voltage increase rate. Operation 2710 determines a condition of an alternator based on the voltage increase rate. Operation 2711 obtains a peak-to-peak voltage of a ripple of the battery voltage. Operation 2712 determines a condition of an alternator based on the ripple voltage.

In FIG. 27B, operation 2720 connects a jump starter with battery diagnostic to a battery of a vehicle. The jump starter portion is turned off, with the load sensor portion turning on to measure voltages at the vehicle connector, e.g., voltages of the vehicle battery.

Operation 2721 determines a state of charge of the battery based on a measured voltage at the vehicle battery.

Operation 2722 jump starts the vehicle after turning on the jump starter portion. The jump starter portion is then turned off after the vehicle is started.

Operation 2723 determines at least one of conditions of the battery, conditions of a starter motor, or conditions of an alternator of the vehicle based on measured voltages of the vehicle battery during a vehicle running time.

FIGS. 28A-28B illustrate flow charts for forming a jump starter with a diagnostic function according to some embodiments. In FIG. 28A, operation 2800 forms a jump starter. The jump starter comprises a power supply. The jump starter comprises a jump starter circuit coupled to the power supply with the jump starter circuit configured to jump start a vehicle. The jump starter is configured to determine a condition of the battery or of the vehicle based on one or more voltage values sampled from the battery.

In FIG. 28A, operation 2810 forms a jump starter. The jump starter comprises a load sensor configured to sample one or more voltages of a battery of a vehicle. The jump starter comprises a power supply configured to jump start a vehicle based on a status of the battery determined by the one or more voltages. The jump starter is configured to process the one or more voltages to determine a condition of the battery.

In operation 2811, the jump starter comprises a controller configured to control the load sensor to sample the one or more voltages. The controller is configured to process the one or more voltages.

In operation 2812, the condition of the battery comprises a state of charge of the battery determined based on the one or more voltages.

In operation 2813, the condition of the battery comprises a capacity of the battery determined based on a drop in the one or more voltages during a period in which the vehicle starts.

In operation 2814, the jump starter is configured to determine a condition of a starter motor based on a drop of the one or more voltages during a period in which the vehicle starts.

In operation 2815, the condition of the battery comprises a charging rate of the battery determined based on a voltage increase in the one or more voltages during a period after starting the vehicle.

In operation 2816, the jump starter is configured to determine a condition of an alternator based on a voltage increase in the one or more voltages during a period after starting the vehicle.

In operation 2817, the jump starter is configured to determine a condition of an alternator based on a peak-to-peak voltage of a ripple in the one or more voltages during a period after starting the vehicle.

A jump starter with a diagnosis circuit including an internal resistance measuring circuit.

The jump starter device can be configured with a diagnostic circuit to perform the diagnostic function, which can allow the jump starter to detect any potential problems with the vehicle. The diagnostic circuit can include a circuit configured to measure a conductance or an internal resistance, which is an inverse of conductance, of the battery.

Internal resistance of a battery is a measurement of the battery's ability to produce current. Internal resistance is related to the plate surface available in the battery, which determines how much power the battery can supply. As a battery ages, the plate surface can sulfate or shed active material, which results in higher measured internal resistances, and which adversely affects its ability to perform.

Internal resistance provides useful information in detecting problems and indicating when a battery should be replaced. For example, internal resistance can be used to detect battery defects, shorts, and open circuits, which will reduce the ability of the battery to deliver current. The measured internal resistance can determine the state of health of the battery. For example, a regular inspection of internal resistance can show how the condition of the battery deteriorates over time, which gives a confidence that the battery is at the end of its useful life and must be replaced. As an example, a 25% increase in resistance over a baseline indicates a performance drop from 100% to about 80%.

Internal resistance of a battery can be determined from a small AC signal analysis, or by a DC method employing a DC current instead of an AC current. In the AC signal analysis, a low AC current (e.g., on the order of about an amp) is generated in a circuit loop including the battery. The AC voltage, measured across the terminals of the battery, is related to the internal resistance of the battery, e.g., the voltage is a product of the internal resistance with the current.

The calculated internal resistance can be affected by temperature and state of charge of the battery. For example, cold temperatures can increase the internal resistance due to the electrolyte chemistry. Thus, a measured internal resistance can be adjusted for actual battery temperature by either a user input of an external measurement of the battery temperature, or an integrated temperature sensor configured to measure the battery temperature.

Further, the internal resistance can increase if the battery is not fully charged, due to the electrolyte lacking conductive ions. Thus, an accurate internal resistance measurement can be performed after charging the battery, such as after jump starting the vehicle and letting the alternator charging the battery.

In the AC small signal analysis, the AC current can be generated from coupling a switched load to the battery. The switched load can periodically draws a small current across the battery terminals. The periodically switched load can include a resistor connected to an oscillator, which can be a switch controlled by the controller. When the controller turns on the switch, a current is generated from the battery passing through the resistor. When the controller turns off the switch, there is no current through the resistor. Thus, a square wave AC current is generated across the battery. The frequency of the AC current is controlled by the controller, which can be less than 100 Hz, such as 50 Hz. The load is selected to generate a small AC current, so that the AC current is determined by the load and independent of the internal resistance of the battery, e.g., does not change with the internal resistance.

An AC voltage is produced at the battery terminals resulting from the AC current and the internal battery resistance. The AC voltage is amplified, rectified and filtered to produce a signal proportional to the internal resistance of the battery. A coupling capacitor is coupled to the AC voltage measurement circuit to eliminate the DC battery voltage.

The internal resistance can be used to determine a condition of the battery, such as to detect the CCA (cold cranking amps) and the remaining life of the battery.

The jump starter device with a diagnostic circuit can further include a controller configured to sample the voltage of the vehicle battery for a time period. The measured voltage curve can allow a determination of conditions of the battery, in addition to the internal resistance. Further, the measured voltage curve can allow a determination of conditions of other components of the vehicle, such as the starter motor and the alternator motor.

Figure 29:
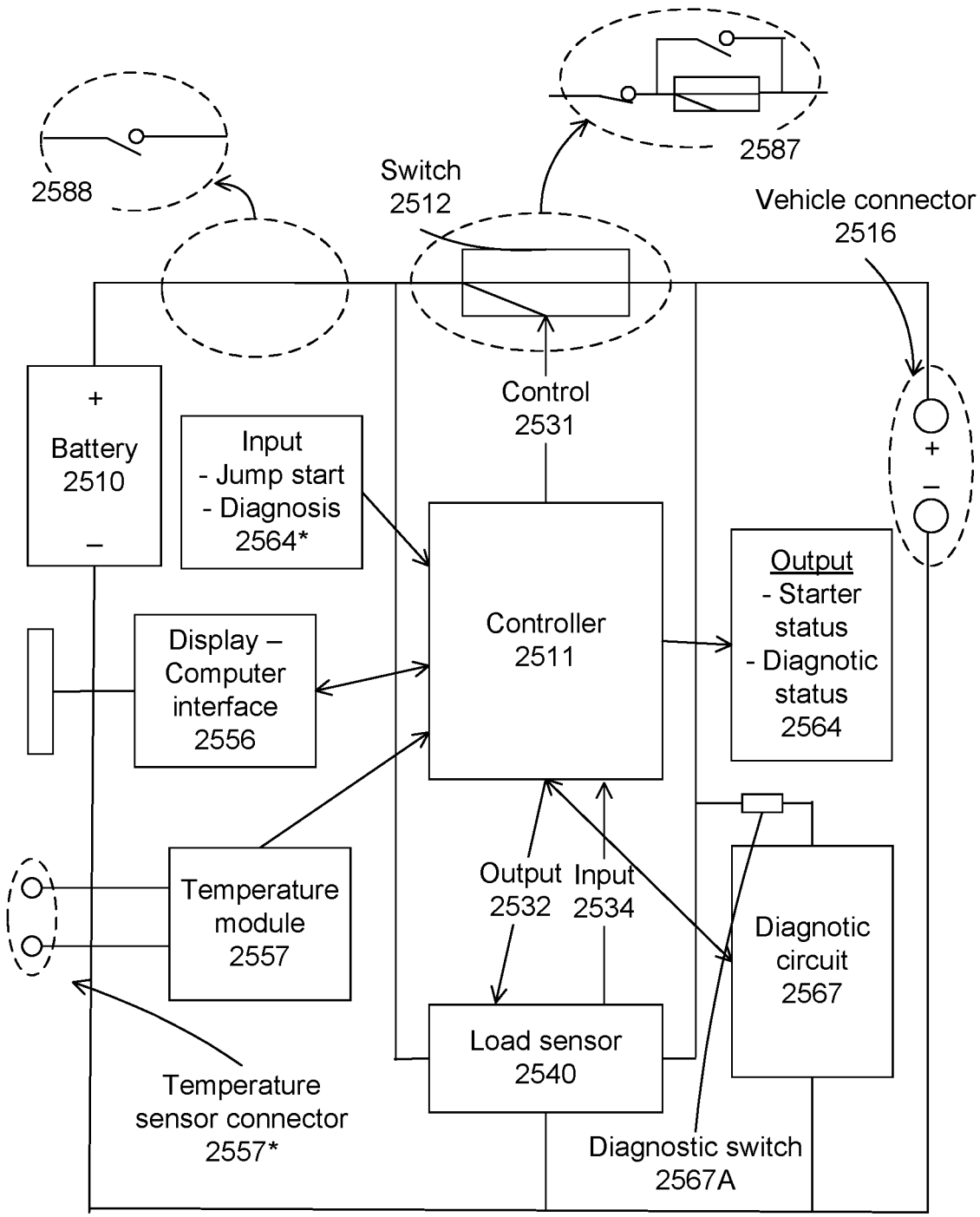
FIG. 29 illustrates a configuration of a jump starter device with a diagnostic circuit according to some embodiments.

FIG. 29 illustrates a configuration of a jump starter device with a diagnostic circuit according to some embodiments. The jump starter device with a diagnostic circuit can include a jump starter section and a diagnostic section.

The jump starter device with a diagnostic circuit can include a jump starter section, including a battery 2510, a controller 2511, a switch 2512, and a load sensor 2540. The jump starter device can include an input module 2564\*, a temperature module 2557, an output module 2564, and an interface module 2556. The jump starter device can include override buttons or manual buttons 2587 or 2588, as discussed above.

The jump starter device with a diagnostic circuit can include a diagnostic circuit 2567, which can be coupled to the vehicle connector 2516. The diagnostic circuit 2567 can include a circuit configured to measure an internal resistance of the battery, using an ac small signal analysis. Other circuits can be included, and other methods for measuring the internal resistance can be used.

The diagnostic circuit 2567 is controlled by the controller, and the result will be fed back to the controller after the detection is completed. The controller can calculate the external battery voltage, internal resistance, CCA, battery life and other parameters through sampling and calculation, and displays them to the user through the display module.

In addition, the controller 2511 can be configured to sample the voltages at the vehicle connector for a period of time to determine a condition of the battery and other components of the vehicle using the voltage-time curve.

FIGS. 30A-30C illustrate a diagnostic circuit for measuring an internal resistance of a battery according to some embodiments. FIG. 30A(a) shows a schematic configuration for an AC small signal model to measure an internal resistance of a battery 2510. A AC current, such as a constant AC current Iac, is provided to the battery, such as to form a current Iac in a circuit loop having the battery. An AC voltage Vac is measured across the battery. The internal resistance of the battery is the ratio of the voltage over the current, e.g., Vac/Iac.

FIG. 30A(b) shows a circuit schematic for an AC small signal model. The circuit includes a battery 2510, represented by a voltage source V connected in series with an internal resistor r. An external resistor R connected in series with a switch SW is coupled to the terminals of the battery. When the switch SW is turned on or close, the battery discharges through the resistor R, e.g., a current passes through the resistor R. When the switch SW is turned off or open, the battery stops discharging, e.g., there is no current. The switch SW is coupled to a controller to control the switch SW. The controller can turn on and off the switch, at a certain frequency, such as 50 Hz. With the control signal from the controller to the switch SW, an AC current Iac, in a form of a square wave, can run in the loop including the battery, the resistor R, and the switch SW.

The voltage across the battery is measured. A coupling capacitor C is connected in series with the input to the amplifier circuit A, in order to measure only the AC component and generate an AC voltage Vac. The amplifier circuit A can be an operational amplifier, which can amplify the small AC voltage across the battery. The internal resistance is the ratio of the AC voltage Vac with the AC current Iac.

FIG. 30B shows a portion of a jump starter, including a diagnostic circuit 2567 and a controller 2511, together with a vehicle connector 2516. The diagnostic circuit can include an internal resistance measuring circuit 2567A as shown in the previous figure. The internal resistance measuring circuit is coupled to the vehicle connector 2516 to be connected to the vehicle battery. The internal resistance measuring circuit is coupled to the controller to receive a control input, in the form of a square wave, e.g., a stream of on-off signals, in order to control a switch to generate an AC current. The internal resistance measuring circuit is also coupled to the controller to provide a voltage proportional to the internal resistance.

FIG. 30C shows an example of a circuit configured to measure an internal resistance. CB− and CB+ are respectively connected to the negative and positive terminals of the car battery. EN is controlled by the controller, which is used to open and close the switch in the internal resistance circuit. The circuit includes a section including a voltage follower U5, configured to generate a reference voltage Vref, to be used in amplifier circuits U1 and U3, to provide output signals Vout1 and Vout2 having primary and secondary amplifications for measuring different values of internal resistance. The circuit includes a load branch with resistor R21 and switch M1, controlled by a signal EN from the controller. The circuit includes multiple amplifier stages U2, U1, and U3 to amplify an AC voltage from the battery.

In operation, the controller can provide a sequence of on-off to the switch to periodically discharge and stop discharging the battery through a resistor, for example, a 50 Hz signal. When the battery discharges, e.g., when the controller turns on the switch, the controller can obtain a voltage at the amplification stages Vout1. When the battery stops discharging, e.g., when the controller turns on the switch, the controller can obtain a voltage at the amplification stages Vout2. The difference between Vout1 and Vout2 is the amplitude of the AC voltage induced by the battery current. The internal resistance of the battery can be determined from the difference in Vout1 and Vout2, dividing by a current through the resistor R, e.g., a ratio of the battery voltage Vbat and the resistor R.

$$r = \frac{V_{out2} - V_{out1}}{V_{bat}/R}$$

with r being the internal resistance of the battery, Vbat being the vehicle battery voltage sampled by the load sensor, R being the resistance value of resistor R21, Vout1 and Vout2 being the voltages at the amplification stages corresponded to having current and no current, respectively, through the resistor R21.

FIGS. 31A-31E illustrate a diagnostic function of the jump starter according to some embodiments. A user can enter the diagnosis mode through the interface setting of the jump starter device. For example, the controller can first control the diagnosis circuit and turns on a diagnostic detection circuit switch 2567A. The controller can obtain voltage measurements from the internal resistance circuit in the diagnostic circuit 2567, and then calculates parameters such as external battery voltage, internal resistance, CCA, and battery life through sampling and calculation, and presents them to the user through the display module. After the diagnosis is completed, the controller can turn off the detection function of the diagnosis circuit. With the user's operation, the product can also judge the load capacity of the battery and detect whether there are abnormal problems in the car generator.

The jump starter can be configured to measure an internal resistance of the battery, in addition to sample voltage data at the vehicle battery before and after starting the vehicle.

Figure 31A:
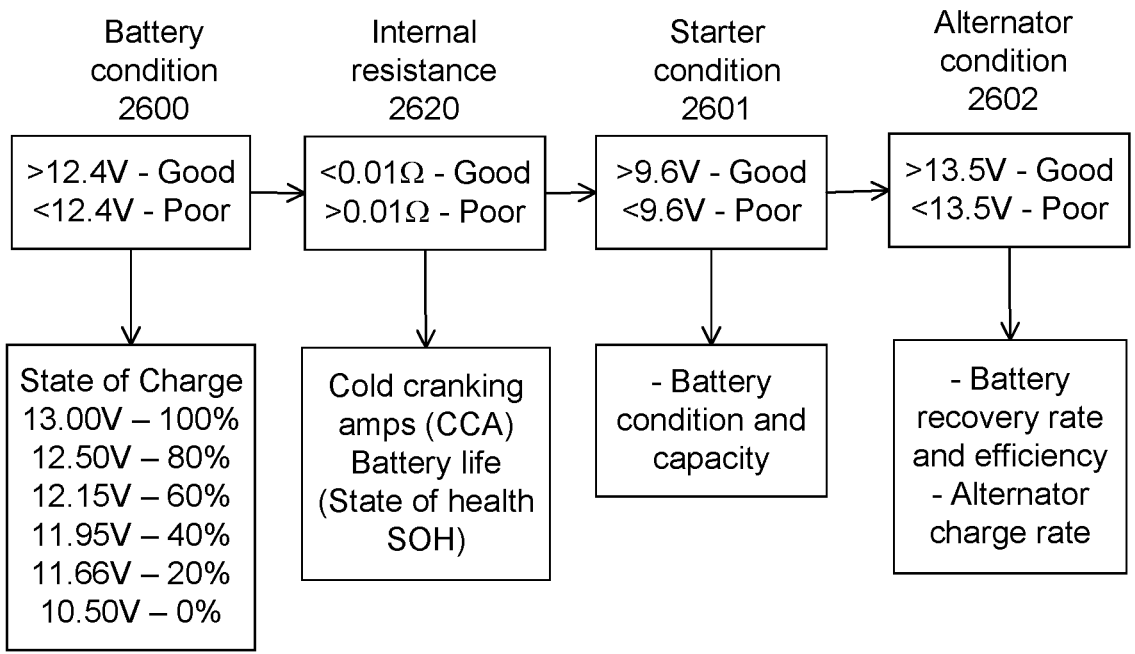

FIG. 31A shows a diagnosis of a jump starter with a diagnostic function based on a sampling of the battery voltage. The jump starter is connected to a battery of a vehicle, and a battery voltage can be obtained, which can provide an indication of the condition 2600 of the battery. A look up table can be used to obtain a state of charge of the battery from the measured voltage. For example, the controller can sample the vehicle battery voltage from the load sensor circuit, and then calculates the state of charge (SOC) according to the corresponding relationship between the battery voltage and SOC.

An internal resistance 2620 of the battery can be measured, which can provide an indication of the health of the battery, including the CCA value and the battery remaining life. For example, a low resistance value of less than 0.01 Ohm can indicate a good battery.

In operation, the controller can provide a sequence of on-off to the switch to periodically discharge and stop discharging the battery through a resistor. The amplification stages can provide a voltage corresponding to the current through the resistor. The internal resistance of the battery can be determined by the ratio of the voltage and the current.

In general, the health of a lead acid battery is related to the internal resistance of the battery. For example, large capacity batteries have low resistance and small capacity batteries have higher resistance. Thus the internal resistance of a battery can be measured and then compared to a rated value to determine the condition of the battery.

From the internal resistance, the CCA of the battery can be determined, since CCA represents the conductivity of the battery and thus is closely related with the internal resistance. Specific data of the vehicle battery, such as the year, the type, and the make of the battery can be inputted to the jump starter to obtain a curve or a table relating the internal resistance to the CCA value.

Alternatively, an estimate of the CCA value can be obtained through an average CCA curve. For example, the relationship between the internal resistance and CCA of common batteries on the market can be determined, for example, through preliminary tests, to obtain an average CCA curve as shown in FIG. 31E. The average CCA curve can be used to obtain the CCA value of the battery based on the measured internal resistance. A look up table can be used, or a curve fitting can be used on a function relating the CCA to the internal resistance CCA=f(r).

The health of a lead acid battery is related to the internal resistance of the battery. Large capacity batteries have low resistance. Small capacity batteries have higher resistance. Thus the internal resistance of a battery can be measured and compare that to a rated value to determine the condition of the battery.

The battery life can be calculated from the CCA value, $$\text{State of Health} = \frac{CCA \times 100}{CCA_0}$$

where CCA is the measured CCA value of the battery, and $CCA_0$ is the nominal CCA value of the battery, which is input by the user to the jump starter.

The jump starter device can be used to measure the internal resistance periodically at an early stage of the battery, such as from when the battery is new. By comparing the values obtained on these subsequent measurements with the initial value, a substantial increase of the internal resistance can be determined, which indicates that the battery is near the end of its life.

A major cause for the increase of the internal resistance is the degradation of the battery's positive plates. For example, the lead supports of the grid and the paste of the positive plates erode and disintegrate, resulting in a size reduction of the plate, leading to an increase in resistance. The internal resistance can also relate to the state of charge and the remaining battery capacity.

The vehicle then can be started, either by its own battery or by the jump starter. The cranking action can provide information 2601 on the starter and further information on the battery, such as the battery capacity. During the cranking, the battery voltage drops due to a high current running through the starter, which can provide an indication of the battery capacity. The voltage drop can show a battery load capacity.

The battery load capacity can be obtained separately by first setting the jump starter to the battery load capacity detection mode. The jump starter is connected to the vehicle battery through the vehicle connector. After the diagnostic circuit is turned on, the initial voltage Vout of the vehicle battery is detected. Then the engine can start. The battery voltage is monitored, and the lowest battery voltage in the process is recorded as Vmin. If the difference between Vout and Vmin greater than a voltage value Vthreshold, e.g., the voltage drop due to the engine cranking and starting is high. This shows that the carrying capacity of the battery is insufficient. Vthreshold value is a defined standard judgment value, which can be 3V. Higher Vthreshold can be used, for higher sampling rate of the voltage.

The vehicle can be idling. The battery voltages obtained during the idling action can provide information 2602 on the alternator, such as the alternator charging rate, and on the battery, such as the battery recovery rate and battery efficiency. The increase of the battery voltage can show a status of a generator of the vehicle.

The generator status can be obtained separately by first setting the jump starter to the generator detection mode. The jump starter is connected to the vehicle battery through the vehicle connector. After the diagnostic circuit is turned on, the engine can start and keep it running at 2500-3000 rpm. The battery voltage Vout is monitored at this time. If the battery voltage value Vout is between 12.5 and 15V, e.g., there is an increase in the battery voltage due to the generator charging rate, which shows that the generator is normal. If the battery voltage value Vout is less than 12.5V, the generating power of the generator can be insufficient. If the battery voltage value Vout is greater than 15V, there can be an overvoltage fault in the generator.

Figure 31B:
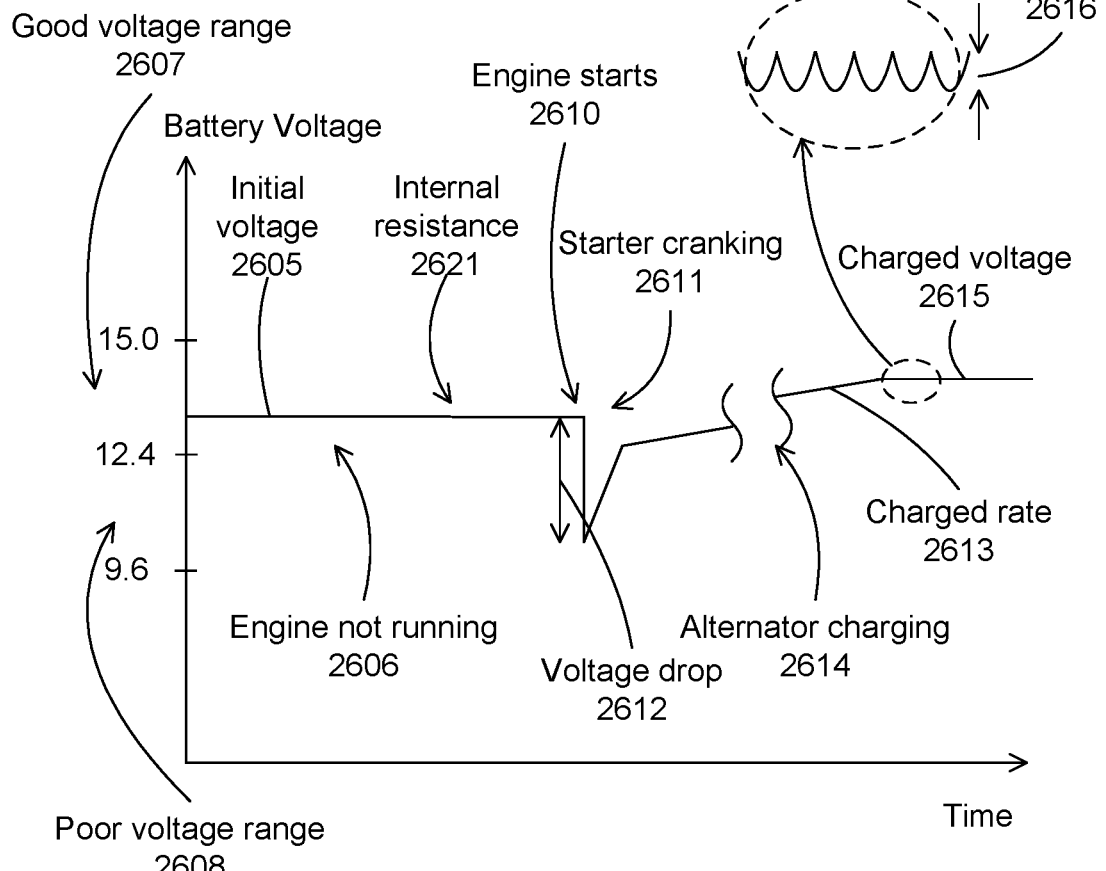

FIG. 31B shows a voltage sampling curve for a good vehicle, e.g., a vehicle without a need of a jump starter device. The jump starter is connected to the battery of the vehicle. When the vehicle is not running 2606, the jump starter can measure the vehicle battery voltage 2605, which can provide an indication of the battery. The battery voltage can be used to provide a state of charge of the battery.

The diagnostic circuit can be turned on, or the diagnostic circuit is always on. The internal resistance 2621 is then determined from the measured voltage using the internal resistance circuit. CCA and battery life or state of health can be determined from the internal resistance value.

The starter motor can start 2610. When the vehicle is cranking, the battery voltage can drop, with a battery drop value 2612. The voltage drop is proportional to the amount of charges provided by the battery, thus a large drop, such as larger than a threshold such as 3V, can indicate a battery with low capacity, e.g., a poor battery that needs to be recharged, repaired or replaced.

The vehicle can continue running, either idling or with the engine running at a high rpm, such as 2000 or 2500 rpm. The voltage values show an increase, indicating a charging rate 2613 due to the alternator charging 2614. The voltage increase can provide an indication of the recovery rate and the efficiency of the battery based on the charging. The voltage increase can also provide an indication of the status or condition of the alternator, e.g., how well the alternator is charging the battery. After a period of time, the battery can be fully charged, e.g., recovering the amount of charges used by the starting and cranking process. The charged voltage 2615 can provide an indication of the battery, showing how well the battery is charged.

Seeing in detail, the voltage curve can show ripples 2616, which can provide information about the alternator such as the diodes in the alternator.

FIG. 31C shows a voltage sampling curve for a bad vehicle, e.g., a vehicle with a need of a jump starter device. The jump starter is connected to the battery of the vehicle, with the jump starter function inactivated.

When the vehicle is not running 2606, the jump starter can measure the vehicle battery voltage 2605, which can provide an indication of the battery, including a state of charge of the battery.

An internal resistance can be measured, for example, by the diagnostic circuit. If the measured battery voltage 2605* is a good voltage, e.g., a voltage between 12.4-15V which is indicative of a good battery, the internal resistance value can confirm that the battery is good, with CCA and state of health determined from the internal resistance.

If the measured battery voltage 2605* is a poor voltage, e.g., a voltage lower than 12.4 V which is indicative of a poor battery, the measured internal resistance can be high, which shows that the battery is not good enough to start the vehicle.

The jump starter can assist in jump starting the vehicle. The jump starter is then turned on 2617, e.g., the switch connecting the jump starter battery to the vehicle connector is connected. The voltage value can increase to a good value of between 12.4 and 15V, which is the voltage of the jump starter battery.

The engine can starts 2610, using the jump starter to provide power for the starter motor. There can be a drop in the voltage, which is indicative of the capability of the jump starter battery.

The jump starter can be turned off 2617*, e.g., turning off the switch connecting the jump starter battery to the vehicle connector. The battery of the jump starter is disconnected, and the measured voltage value can drop, indicative of the vehicle battery voltage.

The vehicle can continue running. The voltage values can show an increase, which can provide an indication of the recovery rate and the efficiency of the battery based on the charging. The voltage increase can also provide an indication of the status or condition of the alternator. After a period of time, the battery can be fully charged.

An internal resistance can be measured again, for example, by the diagnostic circuit. The measured internal resistance value can be a true indication of the battery, since it is fully charged. CCA and state of health of the battery can then be determined from the internal resistance.

The vehicle can stops, and then start again to obtain a voltage drop of the vehicle battery, which can provide an indication of the vehicle battery capacity, as discussed above. The voltage curve can be shown on the display.

FIG. 31D shows diagnostic results, processed from the measured voltages values, to provide conditions of the battery and of the alternator motor. The diagnostic results can be shown in a display, which can include raw data and processed data, such as the initial voltage of the battery before jump starting, the state of charge of the battery, the lowest voltage during the vehicle cranking period, the voltage drop, the internal resistance, the CCA value, the capacity of the battery, the charging rate and the final charged voltage of the battery. The conditions of the alternator can include the charging rate provided by the alternator, and the ripple value indicative of the diodes performing the rectifying action.

FIGS. 32A-32B illustrate flow charts for operating a jump starter with a diagnostic function according to some embodiments. In FIG. 32A, operation 3200 connects a jump starter with battery diagnostic to a battery of a vehicle. The vehicle can be a vehicle in good condition, e.g., can start by itself without the need of a jump starter service. The jump starter section of the jump starter device is turned off, and the diagnostic section is turned on.

Operation 3201 obtains a voltage of the battery, for example, from a load sensor circuit configured to determine a status of the vehicle, including a voltage of the vehicle battery.

Operation 3202 determines a state of charge of the battery based on the battery voltage, for example, by a look up table. In general, higher battery voltage has better state of charge. The battery voltage and the state of charge can provide indications of a condition of the battery.

Operation 3203 obtains an internal resistance of the battery, for example, by turning on the internal resistance measuring circuit in the diagnostic circuit. The internal resistance of the battery can also provide an indication of a condition of the battery. For example, if the battery is still good, the internal resistance is low, such as less than 0.01, less than 0.005, or about a few milliOhm. Higher internal resistance can indicate a poor battery.

Internal resistance is higher when the battery is depleted. Thus, for a non-starting vehicle, the battery might not have a full charge, and thus the value of internal resistance can be high, indicative of a depleted battery. Later measurements of the internal resistance can be performed, especially after the battery is charged, to provide a more accurate description of the battery conditions.

Operation 3204 determines a cold cranking amps (CCA) value of the battery based on the internal resistance. Operation 3205 determines a battery life for the battery based on the CCA value. The CCA and battery life can be determined again for a fully charged battery.

Operation 3206 starts the vehicle. Operation 3207 determines a capacity of the battery or a condition of a starter motor based on a voltage drop of the battery when the vehicle starts.

Operation 3208 determines a charging rate of the battery or a condition of an alternator based on a voltage increase rate when the vehicle is running. Operation 3210 determines a condition of an alternator based on a peak-to-peak voltage of a ripple of the battery voltage when the vehicle is running.

In FIG. 32B, operation 3220 connects a jump starter with battery diagnostic to a battery of a vehicle. The vehicle can be a vehicle in need of a jump starter service. The jump starter section of the jump starter device is turned off, and the diagnostic section is turned on.

Operation 3221 optionally determines a battery voltage and a state of charge of the battery. The determined data can be used to assess whether the battery is good or bad. If the battery is good, the non-starting problem of the vehicle is not likely due to the battery, but in the starter motor.

Operation 3222 optionally determines an internal resistance, a CCA value and a battery life of the battery. This determination is to reinforce the voltage and SOC evaluation that the non-starting problem might or might not due to the battery.

Operation 3223 jump starts the vehicle. For example, the jump starter section is enabled. The diagnostic section is continued to be on, for example, to monitor voltages of the battery. The jump starter section is then turned off, after the vehicle starts.

Operation 3224 determines at least one of conditions of the battery or conditions of an alternator of the vehicle, for example, based on the measured voltages during the starting and running of the vehicle after being jump started. For example, a voltage increase during the running of the battery after turning off the jump starter section can provide indication that the battery is charged, that the alternator is capable of generating current to charge the battery.

Operation 3225 optionally determines an internal resistance, a CCA value and a battery life of the battery after the battery is charged. After a period of time, the battery can be fully charged. The charging time can be reduced by pressing the gas pedal to increase the rpm of the engine, to generate a higher charge rate. The internal resistance, the CCA value and the battery life of the battery can be determined again to obtain a condition of the battery.

FIGS. 33A-33B illustrate flow charts for forming a jump starter with a diagnostic function according to some embodiments. In FIG. 33A, operation 3300 forms a jump starter. The jump starter comprises a power supply, such as a battery configured to provide an electric current to a starter motor of a vehicle for jump starting the vehicle. The jump starter comprises a jump starter circuit coupled to the power supply with the jump starter circuit configured to jump start the vehicle based on a status of the vehicle, such as based on a measured voltage value of the vehicle.

The jump starter comprises a diagnostic circuit configured to determine a condition of the battery or of the vehicle. For example, the diagnostic circuit comprises an internal resistance measuring circuit configured to measure an internal resistance of the battery.

The jump starter comprises a controller configured to control the jump starter section and the diagnostic circuit. The controller can also be configured to process voltage values measured at the vehicle battery to determine a condition of the vehicle, including a battery condition, a starter motor condition, or an alternator condition.

In FIG. 33B, operation 3310 forms a jump starter. The jump starter comprises a load sensor configured to sample one or more voltages of a battery of a vehicle. The jump starter comprises a power supply configured to jump start a vehicle based on a status of the battery determined by the one or more voltages. The jump starter comprises a diagnostic circuit configured to measure an internal resistance of the battery to determine a condition of the battery. The jump starter comprises a controller configured to control the jump starter section and the diagnostic circuit. The controller can also be configured to process voltage values measured at the vehicle battery to determine a condition of the vehicle, including a battery condition, a starter motor condition, or an alternator condition.

In operation 3311, the controller is configured to control the diagnostic circuit to obtain the internal resistance to determine a cold cranking amps value and a battery life data for the battery.

In operation 3312, the diagnostic circuit comprises an ac conductance measuring circuit for measure the internal resistance.

In operation 3313, the diagnostic circuit comprises a load circuit coupled to the battery with the load circuit comprising a switch coupled to the controller. The controller is configured to provide a series of pulses to the switch to generate a current. The diagnostic circuit comprises a measuring circuit coupled to the battery for measuring a voltage across the battery related to the current. The controller is configured to process the measured voltage to generate the internal resistance. The controller is configured to provide a CCA value of a battery life based on the internal resistance.

In operation 3314, the condition of the battery comprises a state of charge, a capacity, or a charging rate of the battery.

In operation 3315, the jump starter is configured to determine a condition of a starter motor, or a condition of an alternator.

A jump starter with a diagnosis circuit including a current measuring circuit.

The diagnostic circuit of a jump starter device can include a circuit configured to measure a current of the vehicle, such as a current drawn by the starter motor, by the alternator, by a combination of starter and alternator motors, or by a cable.

The vehicle current can provide useful information in detecting problems with the vehicle. The measured current is complementary to the battery voltage, and can provide confirmation or additional information regarding the vehicle. For example, an increase in the battery voltage after the vehicle starts is a good indication of a battery charging by the generator. A current measurement can confirm the charging process, such as showing a negative value of current, e.g., a current coming to the battery, during the voltage increase time. The negative current, together with the voltage increase, can provide an indication that the battery is charging, and that the alternator is capable of generating the needed current for charging the battery.

Further, the high current drawn by the starter during the starting of the starter can be used to calculate an internal resistance of the battery using the drop in the voltage at the time of the high current drawn. For example, at the time when the starter starts, a high positive current, e.g., a current supplied by the battery, in order of hundred of amperes such as 500 A, is observed, together with a drop of the battery voltage, for example, to about 10 V. The internal resistance can be calculated to be 10/500=0.02 Ohm. The internal resistance can be used to determine a condition of the battery, such as to detect the CCA (cold cranking amps) and the remaining life of the battery.

The jump starter device with a diagnostic circuit can further include a controller configured to sample the voltage of the vehicle battery for a time period. The measured voltage curve can allow a determination of conditions of the battery, in addition to the internal resistance. Further, the measured voltage curve can allow a determination of conditions of other components of the vehicle, such as the starter motor and the alternator motor.

Figure 34:
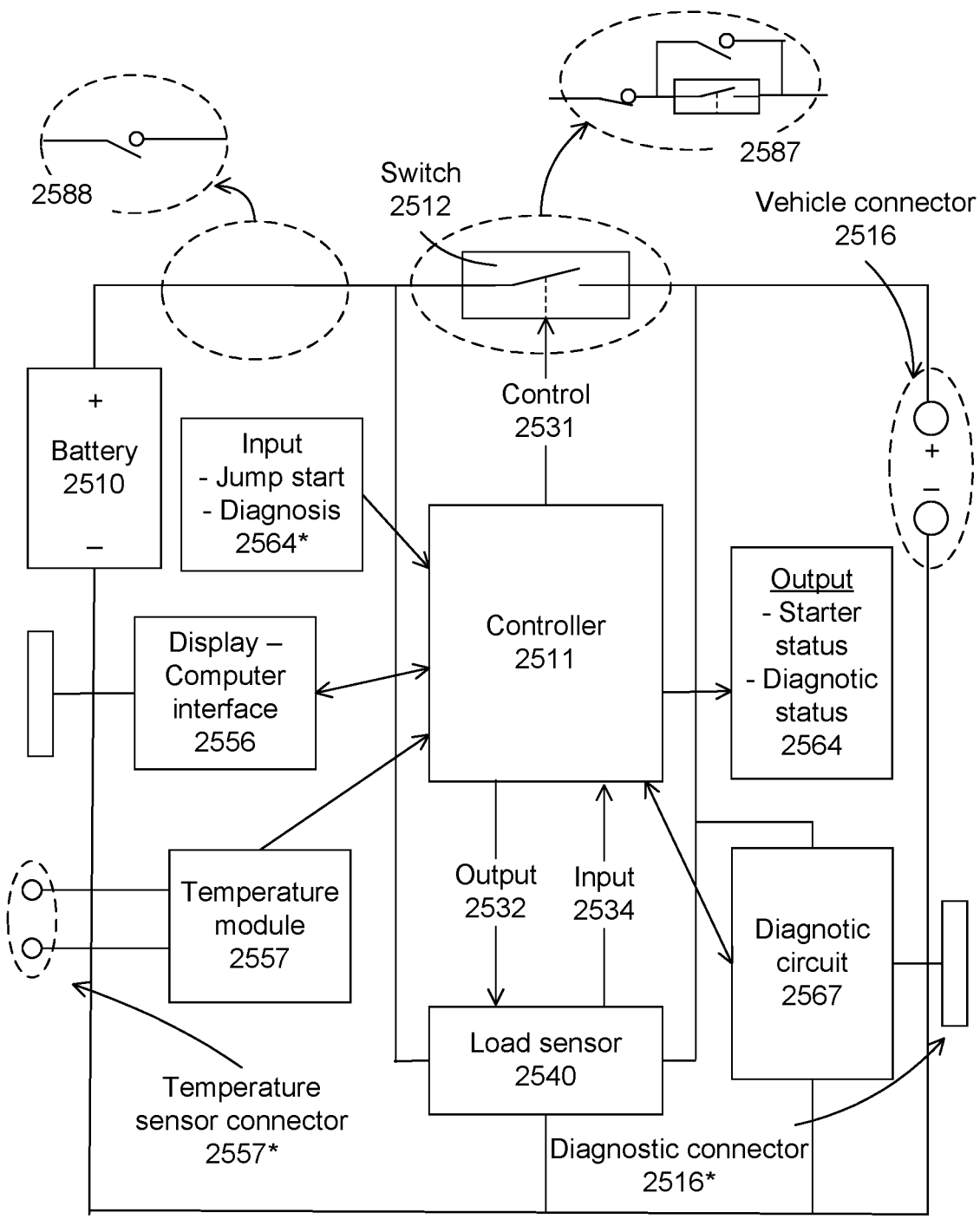
FIG. 34 illustrates a configuration of a jump starter device with a diagnostic function according to some embodiments.

FIG. 34 illustrates a configuration of a jump starter device with a diagnostic function according to some embodiments. The jump starter device with a diagnostic circuit can include a jump starter section and a diagnostic section.

The jump starter device with a diagnostic circuit can include a jump starter section, including a battery 2510, a controller 2511, a switch 2512, and a load sensor 2540. The jump starter device can include an input module 2564*, a temperature module 2557, an output module 2564, and an interface module 2556. The jump starter device can include override buttons or manual buttons 2587 or 2588, as discussed above.

The jump starter device with a diagnostic circuit can include a diagnostic circuit 2567, which can be coupled to a diagnostic connector 2516*. The diagnostic connector can be configured to be coupled to an amp probe configured to measure a current in the vehicle. The diagnostic circuit 2567 can include a circuit configured to measure a current of the vehicle. For example, the current probe can be disposed at a cable leaving the positive terminal of the battery. The current detected by the current probe can be provided to the current measuring circuit in the diagnostic circuit 2567, to be provided to the controller 2511. The current probe can be disposed at different cables, such as a cable coupled to a terminal of the starter motor, a cable coupled to a terminal of the alternator motor, or any cable in the vehicle. Other circuits can be included, such as an internal resistance measuring circuit, multiple current measuring circuits with multiple current probes, or multiple additional voltage measuring circuits with multiple voltage probes.

The diagnostic circuit 2567 is controlled by the controller, and the result will be fed back to the controller after the detection is completed. The controller can calculate the external battery voltage, the vehicle current, internal resistance, CCA, battery life and other parameters through sampling and calculation, and displays them to the user through the display module.

In addition, the controller 2511 can be configured to sample the voltages at the vehicle connector for a period of time to determine a condition of the battery and other components of the vehicle using the voltage-time curve.

Figure 35E:
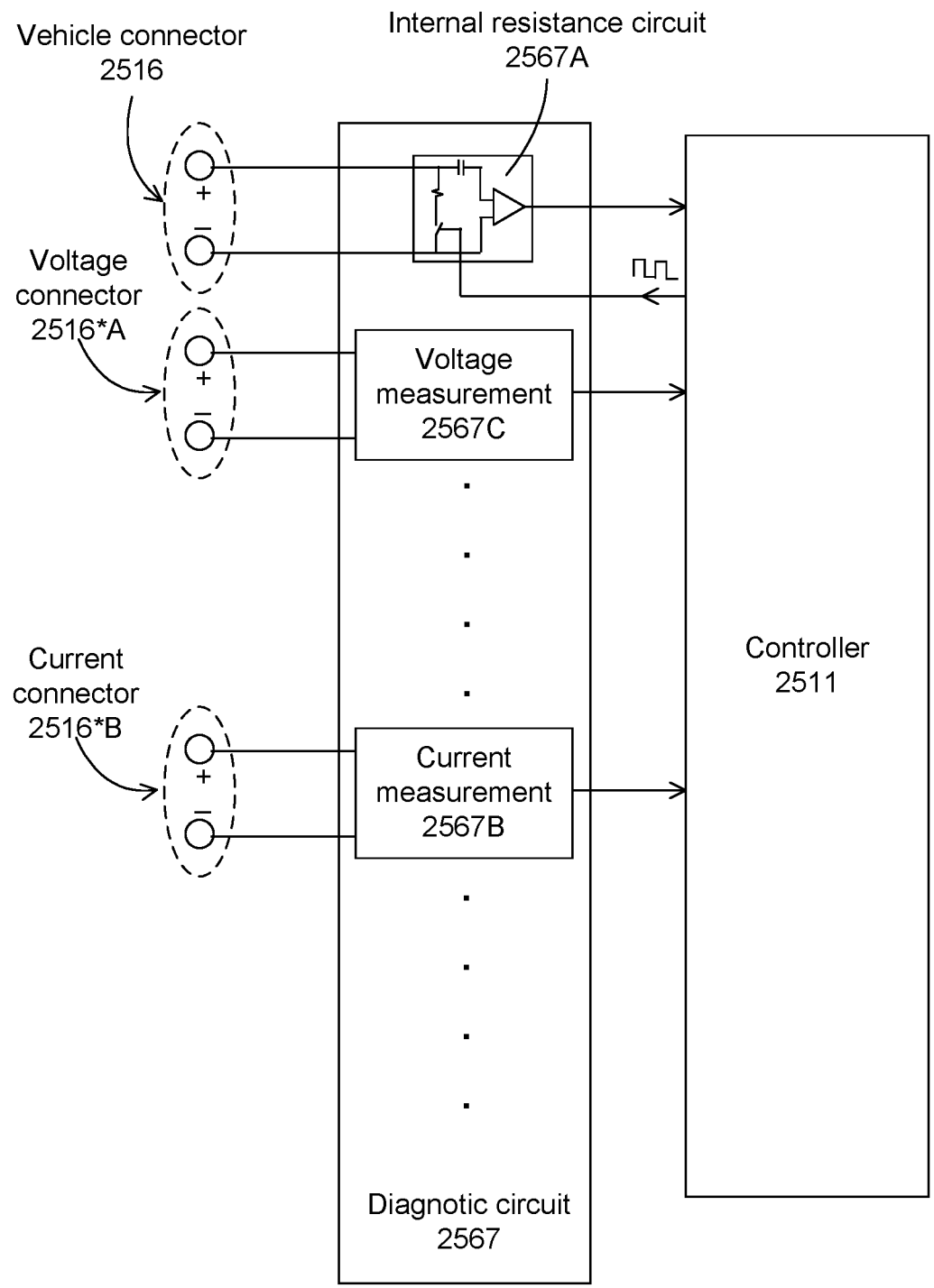

FIGS. 35A-35E illustrate a diagnostic circuit for measuring a current of a vehicle according to some embodiments. FIG. 35A shows a schematic configuration to measure a current provided by a battery 2510. One or more current probes 2633 can be disposed at a cable coming from the battery, such as a cable to the alternator 2632, a cable to the starter 2631, a both cables to the alternator and starter. Outputs of the current probes are provided to a current measurement circuit 2567B, which can generate one or more voltages related to the measured currents to the controller.

FIGS. 35B(a) and 35B(b) show an example of a current probe 2633 in a close configuration and in an open configuration, respectively. The current probe can include an openable claw, configured to wrap around a cable. The probe can be configured to output the measured current. Alternatively, the probe can include a circuit to process the current, such as to convert the measured current to a voltage signal suitable to be inputted to the controller.

FIG. 35C shows an example of a circuit configured to measure a vehicle current. The circuit can include a diagnostic circuit 2567, which can include a current measurement circuit 2567B. The current measurement circuit is coupled to a diagnostic connector 2516*, which is configured to be coupled to a current probe. Alternatively, the current probe can include a current measurement circuit, and the output of the current probe can be provided directly to the controller, without a need for a current measurement circuit 2667B at the diagnostic circuit.

FIG. 35D shows another example of a circuit configured to measure a vehicle current. The circuit can include a diagnostic circuit 2567, which can include a current measurement circuit 2567B, together with a circuit 2567A configured to measure an internal resistance. The current measurement circuit 2567B is coupled to a diagnostic connector 2516*, which is configured to be coupled to a current probe. The internal resistance measuring circuit 2567A is coupled to a vehicle connector 2516, which is configured to be coupled to a battery of the vehicle. Input to the diagnostic circuit is provided by the controller. Output of the diagnostic circuit is provided to the controller 2511.

FIG. 35E shows another example of a circuit configured to measure multiple vehicle currents and voltages. The circuit can include a diagnostic circuit 2567, which can include a circuit 2567A configured to measure an internal resistance, one or more current measurement circuits 2567B, and one or more voltage measurement circuit 2567C. The internal resistance measuring circuit 2567A is coupled to a vehicle connector 2516, which is configured to be coupled to a battery of the vehicle. The current measurement circuits 2567B are coupled to diagnostic connectors 2516*, which are configured to be coupled to current probes. The voltage measurement circuits 2567C are coupled to voltage connectors **2516*A, which are configured to be coupled to voltage probes. Input to the diagnostic circuit is provided by the controller. Output of the diagnostic circuit is provided to the controller 2511**.

Figure 36A:
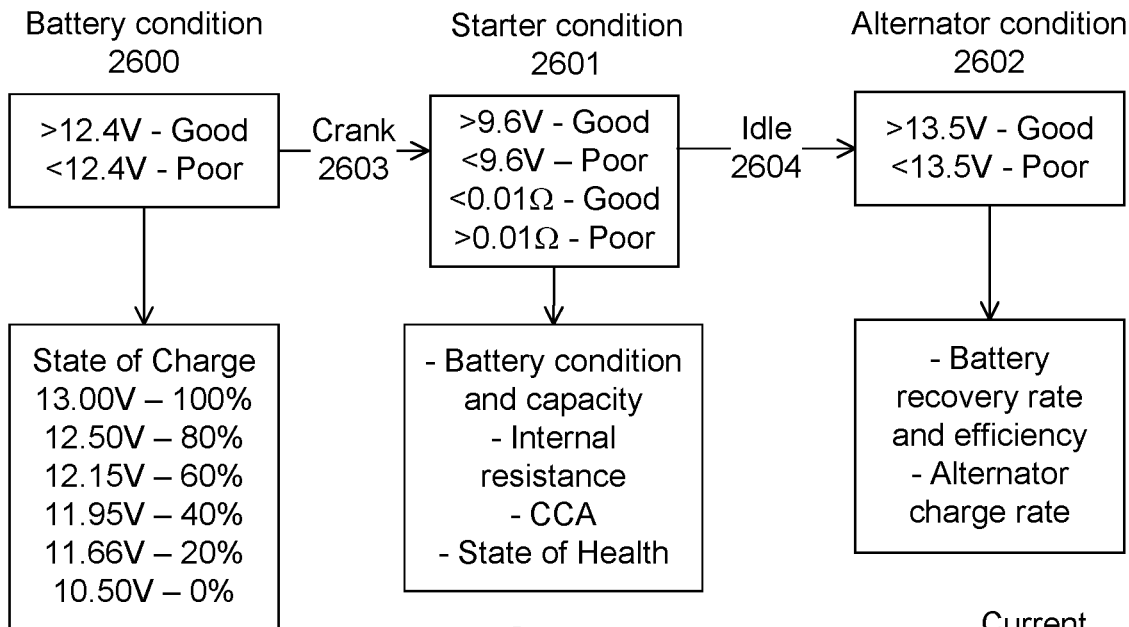
FIGS. 36A-36D illustrate a diagnostic function of the jump starter according to some embodiments.

FIGS. 36A-36D illustrate a diagnostic function of the jump starter according to some embodiments. The jump starter can be configured to sample voltage and current data of the vehicle before and after starting the vehicle. FIG. 36A shows a diagnosis of a jump starter with a diagnostic function based on a sampling of the vehicle voltage and current, such as the battery voltage and the current supplied by the battery to the vehicle. The vehicle connector of the jump starter is connected to a battery of a vehicle. The diagnostic connector of the jump starter, such as a current connector, is connected to a current probe to be coupled to a cable of the vehicle, such as a cable leaving the battery to the starter and alternator. Battery voltages and vehicle currents can be obtained.

The battery voltage and the vehicle current can provide an indication of the condition 2600 of the battery, including a state of charge of the battery. A small positive current can be measured, indicative of battery power used to supply to the peripherals of the vehicle, such as to the vehicle computer.

The vehicle can be started, either by its own battery or by the jump starter. The cranking action 2603 can provide information 2601 on the starter and further information on the battery, such as the battery capacity and internal resistance. During the cranking, the battery voltage drops due to a high current running through the starter. A small voltage drop indicates a high battery capacity. The measured current increases significantly to start the engine. The ratio of the voltage over the current can be used to determine the internal resistance of the battery, which can be used to determine CCA and state of health of the battery.

The vehicle can be idling 2604, e.g., continues running. The battery voltages and the vehicle currents obtained during the idling action 2604 can provide information 2602 on the alternator, such as the alternator charging rate, and on the battery, such as the battery recovery rate and battery efficiency. For example, the battery voltage can gradually increase with a negative current indicative of a charging of the battery.

Figure 36B:
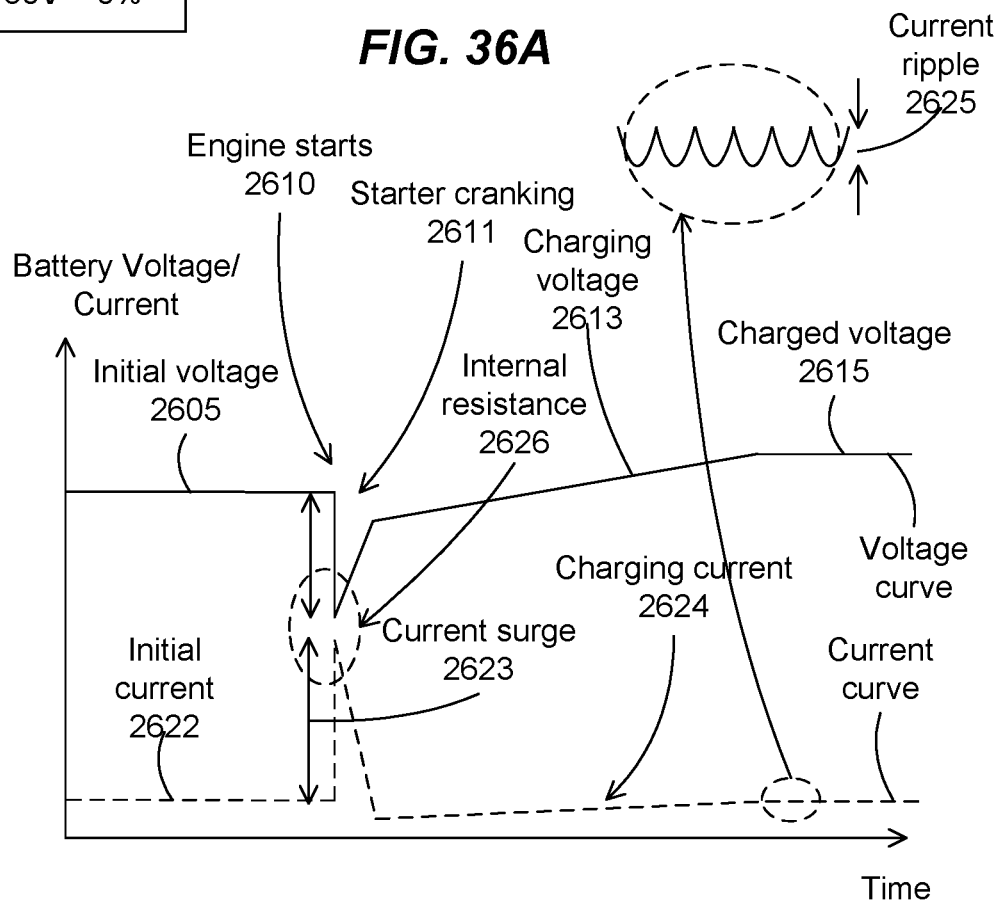

FIG. 36B shows a voltage sampling curve for a good vehicle, e.g., a vehicle without a need of a jump starter device. The jump starter is connected to the battery of the vehicle, with the jump starter function inactivated, e.g., the switch coupled between the power supply or battery of the jump starter with the vehicle battery is decoupled or not connected. The diagnostic function is on, either by automatically turned on or by manually turning on.

When the vehicle is not running 2606, the jump starter can measure the vehicle battery voltage 2605 and current 2622. The measured voltage and current can provide an indication of the battery condition, such as a state of charge of the battery.

The starter motor can start 2610, for example, by the user turning on the ignition system. The battery voltage can drop, with a large current running through the starter motor. The voltage drop is related to the capacity of the battery. The ratio of the voltage drop and the large current is the internal resistance of the battery. This can be used to determine CCA and battery life.

The vehicle can continue running. The voltage values show an increase, indicating a charging rate 2613 due to the alternator charging 2614. Correspondingly, the current shows negative values, indicative of a current provided to the battery. After a period of time, the battery can be fully charged, e.g., recovering the amount of charges used by the starting and cranking process. The voltage and current curves can show ripples 2625, which can provide information about the alternator such as the diodes in the alternator.

The voltage curve can be shown on the display. The condition of the battery, starter motor, or alternator motor can be processed from the voltage curve, and can also show to provide a diagnosis of the vehicle.

Figures 36C, 36D:
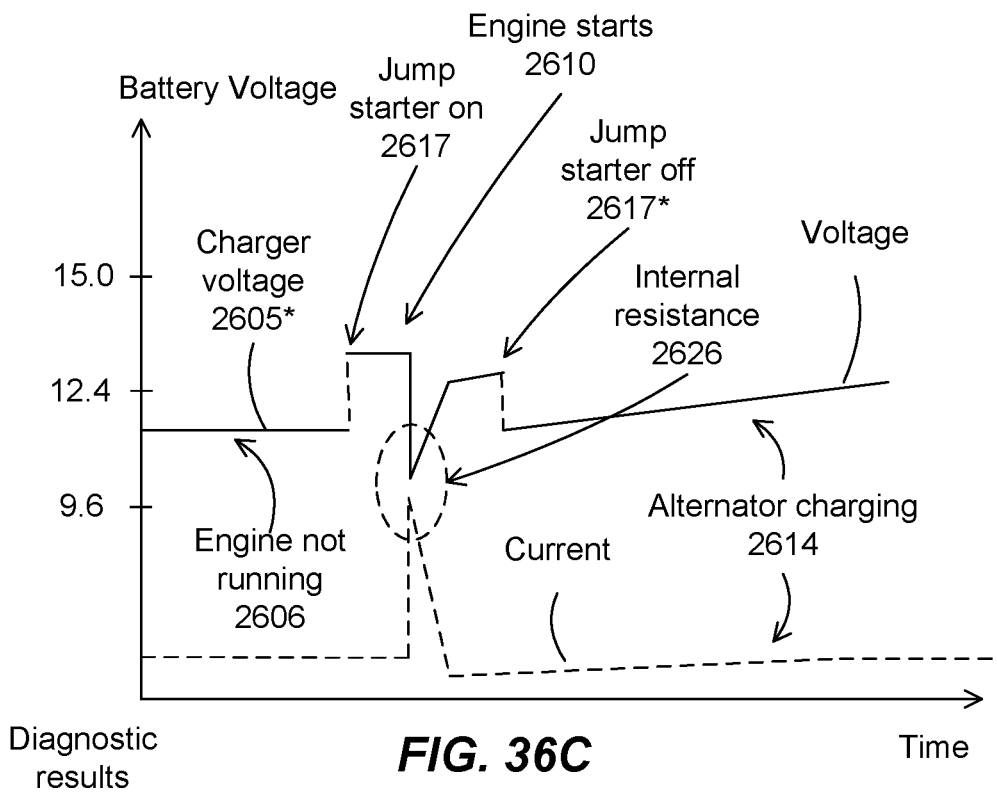

FIG. 36C shows a voltage sampling curve for a bad vehicle, e.g., a vehicle with a need of a jump starter device. The jump starter is connected to the battery of the vehicle, with the jump starter function inactivated.

When the vehicle is not running 2606, the jump starter can measure the vehicle battery voltage 2605* and current. The jump starter is turned on 2617 to connect the battery of the jump starter with the vehicle. The engine can starts 2610, using the jump starter battery to provide power for the starter motor. There can be a drop in the voltage, which is indicative of the capability of the jump starter battery.

The jump starter can be turned off 2617*, e.g., turning off the switch connecting the jump starter battery to the vehicle connector.

The vehicle can continue running. The voltage values can show an increase, and the current values show a negative current, which can provide an indication of the recovery rate and the efficiency of the battery based on the charging. The voltage increase can also provide an indication of the status or condition of the alternator. After a period of time, the battery can be fully charged.

The vehicle can stops, and then start again to obtain a voltage drop of the vehicle battery, which can provide an indication of the vehicle battery capacity, as discussed above. The voltage curve can be shown on the display.

FIG. 36D shows diagnostic results, processed from the measured voltages values, to provide conditions of the battery and of the alternator motor. The diagnostic results 2618 can be shown in a display, which can include raw data and processed data, such as the initial voltage of the battery before jump starting, the state of charge of the battery, the lowest voltage during the vehicle cranking period, the voltage drop, the maximum current, the internal resistance, the CCA, the capacity of the battery, the charging rate and the final charged voltage of the battery. The conditions of the alternator can include the charging rate provided by the alternator, and the ripple value indicative of the diodes performing the rectifying action.

FIGS. 37A-37B illustrate flow charts for operating a jump starter with a diagnostic function according to some embodiments. In FIG. 37A, operation 3700 connects a jump starter with battery diagnostic to a battery of a vehicle. Operation 3701 samples voltages of the battery and currents out of the battery. Operation 3702 determines a state of charge of the battery based on the battery voltage.

Operation 3703 starts the vehicle. Operation 3704 determines a capacity of the battery or a condition of a starter motor based on a voltage drop at the battery when the vehicle starts. Operation 3706 determines an internal resistance of the battery based on voltage and current values at a current surge time when the vehicle starts. Operation 3707 determines a cold cranking amps (CCA) value of the battery based on the internal resistance. Operation 3708 determines a battery life for the battery based on the CCA value.

Operation 3710 obtains an increase of the battery voltage and current. Operation 3711 determines a charging rate of the battery or a condition of an alternator based on the voltage and current increase.

Operation 3712 determines a condition of an alternator based on the voltage and current increase and on a peak-to-peak voltage and current ripple.

In FIG. 37B, operation 3720 connects a jump starter with battery diagnostic to a battery of a vehicle. Operation 3721 optionally determines a state of charge of the battery.

Operation 3722 jump starts the vehicle. Operation 3723 determines at least one of conditions of the battery, conditions of a starter motor, or conditions of an alternator of the vehicle. Operation 3724 optionally determines a CCA value and a battery life of the battery based on an internal resistance of the battery.

FIGS. 38A-38B illustrate flow charts for forming a jump starter with a diagnostic function according to some embodiments. In FIG. 38A, operation 3800 forms a jump starter. The jump starter comprises a power supply. The jump starter comprises a jump starter circuit coupled to the power supply with the jump starter circuit configured to jump start a vehicle. The jump starter comprises a diagnostic circuit configured to determine a condition of the battery or of the vehicle. The diagnostic circuit is configured to measure an internal resistance of the battery.

In FIG. 38B, operation 3810 forms a jump starter. The jump starter comprises a load sensor configured to sample one or more voltages of a battery of a vehicle. The jump starter comprises a power supply configured to jump start a vehicle based on a status of the battery determined by the one or more voltages. The jump starter comprises a diagnostic circuit configured to measure an internal resistance of the battery to determine a condition of the battery.

In operation 3811, the controller is configured to control the diagnostic circuit to obtain the internal resistance to determine a cold cranking amps value and a battery life data for the battery.

In operation 3811, the diagnostic circuit comprises an ac conductance measuring circuit for measure the internal resistance.

In operation 3811, the diagnostic circuit comprises a load circuit coupled to the battery with the load circuit comprising a switch coupled to the controller. The controller is configured to provide a series of pulses to the switch to generate a current. The diagnostic circuit comprises a measuring circuit coupled to the battery for measuring a voltage across the battery related to the current. The controller is configured to process the measured voltage to generate the internal resistance. The controller is configured to provide a CCA value of a battery life based on the internal resistance.

In operation 3812, the condition of the battery comprises a state of charge, a capacity, or a charging rate of the battery.

In operation 3814, the jump starter is configured to determine a condition of a starter motor, or a condition of an alternator In some embodiments, the reference numbers are classified with the last 2 digits referring to a same component or element, and the first one or 2 digits referring to the number of the figures. For example, 111, 511, 1011, 1711, 1911, 2111, 2411, 2511, and 2611 all refer to a controller, e.g., the last 2 digits of 11 refer to a controller, while the first one or two digits of 1, 5, 10, 11, 17, 19, 21, 24, 25, and 26 refer to the figure numbers. There can be exception, for example, in the flow chart number for the steps.

What is claimed is:

1. A jump starter device with a diagnostic function comprising
    a power supply;
    a jump starter section coupled to the power supply,
    wherein the jump starter section is configured to jump start a vehicle,
    wherein the jump starter section is also configured to provide a diagnosis of at least a component of the vehicle,
    wherein the jump starter section comprises a circuit configured to determine one or more voltage values of a battery of the vehicle,
    wherein the jump starter section is configured to couple the power supply to a battery of the vehicle to jump start the vehicle based on the determined one or more voltage values,
    wherein the jump starter section is configured to provide a diagnosis of at least one of the battery, a starter motor, or an alternator of the vehicle based on a processing of the one or more voltage values.

2. A jump starter device with a diagnostic function comprising
    a power supply;
    a jump starter section coupled to the power supply,
    wherein the jump starter section is configured to jump start a vehicle,
    wherein the jump starter section is also configured to provide a diagnosis of at least a component of the vehicle,
    wherein the jump starter section comprises a circuit configured to determine an internal resistance of a battery of the vehicle,
    wherein the jump starter section is configured to provide a diagnosis of at least one of the battery, a starter motor, or an alternator of the vehicle based on the determined internal resistance.

3. A jump starter device with a diagnostic function comprising
    a power supply;
    a jump starter section coupled to the power supply,
    wherein the jump starter section is configured to jump start a vehicle,
    wherein the jump starter section is also configured to provide a diagnosis of at least a component of the vehicle,
    wherein the jump starter section comprises a circuit configured to determine one or more current values of a current passing through a cable coupled to a battery of the vehicle,
    wherein the jump starter section is configured to provide a diagnosis of at least one of the battery, a starter motor, or an alternator of the vehicle based on the determined one or more current values.

4. A jump starter device with a diagnostic function configured to be coupled to a vehicle, the jump starter device with a diagnostic function comprising:
    a power supply;
    a load sensor configured to measure one or more voltage values of a battery of the vehicle;
    a controller,
    wherein the controller is configured to couple the power supply to the battery to jump start the vehicle based on a status of the vehicle determined from the one or more voltage values,
    wherein the controller is configured to process the one or more voltages to determine a condition of the vehicle.

5. A jump starter device with a diagnostic function as in claim 4, wherein the jump starter device with a diagnostic function is configured to jump start the vehicle before diagnosing the condition of the vehicle.

6. A jump starter device with a diagnostic function as in claim 4, further comprising
    a controllable switching circuit disposed between the power supply and an outlet connector, with the outlet connector configured to be coupled to the battery,
    wherein the controller is configured to turn on the controllable switch to couple the power supply to the battery to jump start the vehicle.

7. A jump starter device with a diagnostic function as in claim 4,
    wherein the load sensor is coupled to the power supply,
    wherein the one or more voltage values are obtained with and without a contribution from the power supply.

8. A jump starter device with a diagnostic function as in claim 4,
    wherein the load sensor is configured to provide a first voltage value with the battery not connected to the load sensor,
    wherein the load sensor is configured to provide a second voltage value with the battery connected to the load sensor;
    wherein the status of the vehicle is determined from the first and second voltage values.

9. A jump starter device with a diagnostic function as in claim 4, wherein a condition of the vehicle comprises a condition of the battery, a condition of a starter system, or a condition of an alternator system.

10. A jump starter device with a diagnostic function as in claim 4,
    wherein a condition of the vehicle comprises a condition of the battery,
    wherein the condition of the battery comprises
    a state of charge of the battery determined from the one or more voltage values during a period of the vehicle not running,
    a capacity of the battery determined from the one or more voltage values during a period of the vehicle starting,
    a charging rate of the battery determined from the one or more voltage values during a period of the vehicle running, or a state of charge of the battery determined from the one or more voltage values during a period of the vehicle running.

11. A jump starter device with a diagnostic function as in claim 4,
wherein a condition of the vehicle comprises a condition of the alternator system,
wherein the condition of the alternator system comprises a capability of the alternator to generate a charge current determined from the one or more voltage values during a period of the vehicle running, or
an assessment of a rectifying diode in the alternator determined from the one or more voltage values during a period of the vehicle running.

12. A jump starter device with a diagnostic function configured to be coupled to a vehicle, the jump starter device with a diagnostic function comprising:
a power supply;
a load sensor configured to measure one or more voltage values of a battery of the vehicle;
a diagnostic circuit;
a controller,
wherein the controller is configured to couple the power supply to the battery to jump start the vehicle based on a status of the vehicle determined from the one or more voltage values,
wherein the controller is configured to process at least output data from the diagnostic circuit to determine a condition of the vehicle.

13. A jump starter device with a diagnostic function as in claim 12,
wherein the condition of the vehicle comprises at least one of
an internal resistance of the battery determined from the diagnostic circuit,
a cold cranking amps value of the battery determined from the internal resistance, or
a battery life determined from the cold cranking amps value.

14. A jump starter device with a diagnostic function as in claim 12,
wherein the diagnostic circuit comprises a circuit configured to provide a voltage relating to an internal resistance of the battery,
wherein the controller is configured to process the voltage to obtain the internal resistance,
wherein the controller is configured to generate cold cranking amps value and a battery life of the battery based on the internal resistance.

15. A jump starter device with a diagnostic function as in claim 12,
wherein the controller is configured to process output data from the diagnostic circuit and the one or more voltages to determine the condition of the vehicle,
wherein the condition of the vehicle comprises at least one of
a state of charge of the battery determined from the one or more voltage values during a period of the vehicle not running,
an internal resistance of the battery determined from the diagnostic circuit,
a cold cranking amps value of the battery determined from the internal resistance,
a battery life determined from the cold cranking amps value,
a capacity of the battery determined from the one or more voltage values during a period of the vehicle starting,
a charging rate of the battery determined from the one or more voltage values during a period of the vehicle running,
a state of charge of the battery determined from the one or more voltage values during a period of the vehicle running,
a capability of the alternator to generate a charge current determined from the one or more voltage values during a period of the vehicle running, or
an assessment of a rectifying diode in the alternator determined from the one or more voltage values during a period of the vehicle running.

16. A jump starter device with a diagnostic function as in claim 12,
wherein the diagnostic circuit comprises a circuit configured to provide one or more measurements of a current,
wherein the controller is configured to process the one or more voltages and the one or more measurements of the current to or from the battery during a period of the vehicle starting to determine the condition of the vehicle comprising an internal resistance of the battery.

17. A jump starter device with a diagnostic function as in claim 12,
wherein the diagnostic circuit comprises a circuit configured to provide one or more measurements of a current,
wherein the controller is configured to process the one or more voltages and the one or more measurements of the current to or from the battery to determine the condition of the vehicle,
wherein the condition of the vehicle comprises at least one of
a state of charge of the battery determined from the one or more voltage values during a period of the vehicle not running,
an internal resistance of the battery determined from the diagnostic circuit,
a cold cranking amps value of the battery determined from the internal resistance,
a battery life determined from the cold cranking amps value,
a capacity of the battery determined from the one or more voltage values during a period of the vehicle starting,
a charging rate of the battery determined from the one or more voltage values during a period of the vehicle running,
a state of charge of the battery determined from the one or more voltage values during a period of the vehicle running,
a capability of the alternator to generate a charge current determined from the one or more voltage values during a period of the vehicle running, or
an assessment of a rectifying diode in the alternator determined from the one or more voltage values during a period of the vehicle running.

18. A jump starter device with a diagnostic function as in claim 12,
wherein a condition of the vehicle comprises a condition of the battery, a condition of a starter system, or a condition of an alternator system.

* * * * *